US010818357B2

(12) United States Patent
Goda et al.

(10) Patent No.: US 10,818,357 B2
(45) Date of Patent: Oct. 27, 2020

(54) MEMORY DEVICE INCLUDING MULTIPLE SELECT GATES AND DIFFERENT BIAS CONDITIONS

(71) Applicant: Micron Technology, Inc., Boise, ID (US)

(72) Inventors: Akira Goda, Boise, ID (US); Haitao Liu, Boise, ID (US); Changhyun Lee, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/518,687

(22) Filed: Jul. 22, 2019

(65) Prior Publication Data

US 2020/0051638 A1 Feb. 13, 2020

Related U.S. Application Data

(63) Continuation of application No. 16/036,549, filed on Jul. 16, 2018, now Pat. No. 10,360,979, which is a
(Continued)

(51) Int. Cl.
*G11C 16/26* (2006.01)
*G11C 16/10* (2006.01)
(Continued)

(52) U.S. Cl.
CPC ...... *G11C 16/0483* (2013.01); *G11C 11/5628* (2013.01); *G11C 16/08* (2013.01);
(Continued)

(58) Field of Classification Search
CPC ................................ G11C 16/10; G11C 16/26
(Continued)

(56) References Cited

U.S. PATENT DOCUMENTS 6,229,169 B1   5/2001 Hofmann et al.
7,352,625 B2   4/2008 Futatsuyama et al.
(Continued)

FOREIGN PATENT DOCUMENTS

CN        109690772 A      4/2019
TW        201805940 A      2/2018
WO     WO-2018009326 A1    1/2018

OTHER PUBLICATIONS

"European Application Serial No. 17824690.6, Response filed Sep. 3, 2019 to Communication pursuant to Rules161(2) and 162 EPC dated Feb. 21, 2019", 18 pgs.
(Continued)

*Primary Examiner* — Michael T Tran
(74) *Attorney, Agent, or Firm* — Schwegman Lundberg & Woessner, P.A.

(57) ABSTRACT

Some embodiments include apparatuses and methods using first and second select gates coupled in series between a conductive line and a first memory cell string of a memory device, and third and fourth select gates coupled in series between the conductive line and a second memory cell string of the memory device. The memory device can include first, second, third, and fourth select lines to provide first, second, third, and fourth voltages, respectively, to the first, second, third, and fourth select gates, respectively, during an operation of the memory device. The first and second voltages can have a same value. The third and fourth voltages can have different values.

20 Claims, 43 Drawing Sheets

Related U.S. Application Data continuation of application No. 15/669,311, filed on Aug. 4, 2017, now Pat. No. 10,026,480, which is a continuation of application No. 15/205,574, filed on Jul. 8, 2016, now Pat. No. 9,728,266.

(51) Int. Cl.

| | | |
|---|---|---|
| *G11C 16/04* | (2006.01) | |
| *G11C 16/16* | (2006.01) | |
| *H01L 27/115* | (2017.01) | |
| *H01L 49/02* | (2006.01) | |
| *G11C 11/56* | (2006.01) | |
| *G11C 16/08* | (2006.01) | |
| *G11C 16/34* | (2006.01) | |
| *H01L 27/105* | (2006.01) | |

(52) U.S. Cl.
CPC ............ *G11C 16/10* (2013.01); *G11C 16/16* (2013.01); *G11C 16/26* (2013.01); *G11C 16/3459* (2013.01); *H01L 27/1052* (2013.01); *H01L 27/115* (2013.01); *H01L 28/00* (2013.01)

(58) Field of Classification Search
USPC ........................................ 365/185.11, 185.24
See application file for complete search history.

(56) References Cited

U.S. PATENT DOCUMENTS

| | | | |
|---|---|---|---|
| 8,879,331 B2 | 11/2014 | Sel et al. | |
| 8,901,745 B2* | 12/2014 | Hwang | H01L 23/5226 |
| | | | 257/775 |
| 8,975,148 B2 | 3/2015 | Pellizzer | |
| 9,111,620 B2* | 8/2015 | Tanzawa | H04N 19/80 |
| 9,324,730 B2 | 4/2016 | Nam et al. | |
| 9,412,463 B1 | 8/2016 | Chen et al. | |
| 9,728,266 B1 | 8/2017 | Goda et al. | |
| 9,831,266 B2* | 11/2017 | Kai | H01L 27/11582 |
| 9,865,311 B1* | 1/2018 | Sakui | G11C 16/0483 |
| 9,905,572 B2* | 2/2018 | Lee | H01L 27/11582 |
| 9,917,100 B2* | 3/2018 | Zhang | H01L 27/11575 |
| 10,026,480 B2 | 7/2018 | Goda et al. | |
| 10,090,024 B2* | 10/2018 | Sakui | G11C 16/0483 |
| 10,181,341 B1 | 1/2019 | Sakui | |
| 10,360,979 B2 | 7/2019 | Goda et al. | |
| 2004/0152262 A1* | 8/2004 | Ichige | G11C 16/0483 |
| | | | 438/257 |
| 2007/0075359 A1 | 4/2007 | Yoon et al. | |
| 2007/0252201 A1 | 11/2007 | Kito et al. | |
| 2008/0186771 A1 | 8/2008 | Katsumata et al. | |
| 2008/0198660 A1 | 8/2008 | Mokhlesi | |
| 2009/0161439 A1 | 6/2009 | Aiika et al. | |
| 2010/0078701 A1 | 4/2010 | Shim et al. | |
| 2010/0195395 A1 | 8/2010 | Jeong et al. | |
| 2010/0213527 A1 | 8/2010 | Shim et al. | |
| 2010/0219483 A1 | 9/2010 | Masuoka et al. | |
| 2010/0270611 A1 | 10/2010 | Masuoka et al. | |
| 2011/0170358 A1 | 7/2011 | Chen et al. | |
| 2011/0205802 A1 | 8/2011 | Choe et al. | |
| 2012/0051143 A1 | 3/2012 | Yoon et al. | |
| 2012/0091521 A1 | 4/2012 | Goda | |
| 2012/0098049 A1 | 4/2012 | Moon et al. | |
| 2012/0223382 A1 | 9/2012 | Joo et al. | |
| 2012/0241844 A1 | 9/2012 | Iguchi et al. | |
| 2012/0314514 A1 | 12/2012 | Kwon et al. | |
| 2013/0020647 A1 | 1/2013 | Hwang et al. | |
| 2013/0044531 A1 | 2/2013 | Baek et al. | |
| 2013/0051150 A1 | 2/2013 | Roizin et al. | |
| 2013/0105876 A1 | 5/2013 | Hwang | |
| 2013/0148427 A1 | 6/2013 | Lee | |
| 2013/0308387 A1 | 11/2013 | Tanzawa | |
| 2013/0328005 A1 | 12/2013 | Shin | |
| 2014/0063890 A1 | 3/2014 | Lee et al. | |
| 2014/0239372 A1 | 8/2014 | Kang et al. | |
| 2014/0248763 A1 | 9/2014 | Konevecki et al. | |
| 2014/0291747 A1 | 10/2014 | Simsek-ege et al. | |
| 2015/0001460 A1 | 1/2015 | Kim | |
| 2015/0054058 A1* | 2/2015 | Seol | H01L 29/42332 |
| | | | 257/324 |
| 2015/0179662 A1 | 6/2015 | Makala et al. | |
| 2015/0206898 A1 | 7/2015 | Chen | |
| 2015/0214235 A1 | 7/2015 | Lee et al. | |
| 2015/0243748 A1 | 8/2015 | Pulugurtha et al. | |
| 2015/0303209 A1* | 10/2015 | Park | H01L 27/11565 |
| | | | 257/316 |
| 2015/0309737 A1 | 10/2015 | Kim | |
| 2015/0318301 A1 | 11/2015 | Lee et al. | |
| 2015/0348637 A1* | 12/2015 | Han | G11C 16/08 |
| | | | 365/185.2 |
| 2016/0012893 A1* | 1/2016 | Ahn | G11C 16/0483 |
| | | | 365/185.2 |
| 2016/0042791 A1 | 2/2016 | Sakui et al. | |
| 2016/0054953 A1 | 2/2016 | Lee | |
| 2016/0055913 A1 | 2/2016 | Lee et al. | |
| 2016/0071870 A1 | 3/2016 | Minami et al. | |
| 2016/0093669 A1 | 3/2016 | Lee et al. | |
| 2016/0118391 A1* | 4/2016 | Zhao | H01L 29/16 |
| | | | 257/66 |
| 2016/0133638 A1* | 5/2016 | Simsek-Ege | H01L 27/11556 |
| | | | 257/314 |
| 2016/0141045 A1* | 5/2016 | Shim | G11C 16/0483 |
| | | | 365/185.11 |
| 2016/0141337 A1 | 5/2016 | Shimabukuro et al. | |
| 2016/0141419 A1* | 5/2016 | Baenninger | H01L 27/11551 |
| | | | 257/314 |
| 2016/0190155 A1* | 6/2016 | Lee | H01L 27/11565 |
| | | | 438/268 |
| 2016/0197041 A1* | 7/2016 | Lai | H01L 27/11565 |
| | | | 257/314 |
| 2016/0225866 A1 | 8/2016 | Peri et al. | |
| 2016/0247570 A1* | 8/2016 | Chang | G11C 16/0483 |
| 2016/0260735 A1 | 9/2016 | Lee et al. | |
| 2016/0276359 A1* | 9/2016 | Oginoe | H01L 27/11556 |
| 2016/0351709 A1 | 12/2016 | Nishikawa et al. | |
| 2017/0025474 A1 | 1/2017 | Sills et al. | |
| 2017/0170190 A1* | 6/2017 | Zhu | H01L 21/76877 |
| 2017/0236836 A1 | 8/2017 | Huo et al. | |
| 2018/0012634 A1 | 1/2018 | Sakui | |
| 2018/0012660 A1 | 1/2018 | Goda et al. | |
| 2018/0108385 A1 | 4/2018 | Sakui | |
| 2018/0342298 A1 | 11/2018 | Goda et al. | |
| 2019/0019540 A1 | 1/2019 | Sakui | |

OTHER PUBLICATIONS

"International Application Serial No. PCT/US2017/037716, International Search Report dated Sep. 26, 2017", 3 pgs.
"International Application Serial No. PCT/US2017/037716, Written Opinion dated Sep. 26, 2017", 10 pgs.
"Taiwanese Application Serial No. 106121939, Office Action dated Jan. 22, 2018", w/English Translation, 31 pgs.
"Taiwanese Application U.S. Appl. No. 106121939, Response filed Jul. 24, 2018 to Office Action dated Jan. 22, 2018", w/ English Claims, 74 pgs.
U.S. Appl. No. 15/205,574 U.S. Pat. No. 9,728,266, filed Jul. 8, 2016, Memory Device Including Multiple Select Gates and Different Bias Conditions.
U.S. Appl. No. 15/669,311 U.S. Pat. No. 10,026,480, filed Aug. 4, 2017, Memory Device Including Multiple Select Gates and Different Bias Conditions.
U.S. Appl. No. 16/036,549 U.S. Pat. No. 10,360,979, filed Jul. 16, 2018, Memory Device Including Multiple Select Gates and Different Bias Conditions.
U.S. Appl. No. 15/205,640 U.S. Pat. No. 9,865,311, filed Jul. 8, 2016, Memory Device Including Current Generator Plate.
U.S. Appl. No. 15/844,007 U.S. Pat. No. 10,090,024, filed Dec. 15, 2017, Memory Device Including Current Generator Plate.
U.S. Appl. No. 16/125,315 U.S. Pat. No. 10,181,341, filed Sep. 7, 2018, Memory Device Including Current Generator Plate.

(56) References Cited

OTHER PUBLICATIONS

"European Application Serial No. 17824690.6, Partial Supplementary European Search Report dated Mar. 5, 2020", 15 pgs.
"Korean Application Serial No. 10-2019-7003832, Notice of Preliminary Rejection dated Jan. 8, 2020", W/ English Translation, 14 pgs.
"Korean Application Serial No. 10-2019-7003832, Response filed Apr. 8, 2020 to Notice of Preliminary Rejection dated Jan. 8, 2020", w/ English Claims, 34 pgs.

* cited by examiner

| | READ | | | WRITE | | | ERASE | | |
|---|---|---|---|---|---|---|---|---|---|
| | SELECTED BLOCK | | DESELECTED BLOCK | SELECTED BLOCK | | DESELECTED BLOCK | SELECTED BLOCK | | DESELECTED BLOCK |
| | SELECTED STRING | DESELECTED STRING | ALL STRINGS | SELECTED STRING | DESELECTED STRING | ALL STRINGS | SELECTED STRING | DESELECTED STRING | ALL STRINGS |
| BL | 0.5V | 0.5V | 0.5V | 0V or 2.3V | 0V or 2.3V | 0V or 2.3V | ~20V | ~20V | 20V |
| SGD$_A$ | V1 (5V) | | V3 (0.5V) | V5 3V | | V7 (2.3V) | V9 (10V/14V) | | V11 (F~20V) |
| SGD$_B$ | 5V | V2 (0V) | V4 (0V) | 3V | V6 (0V) | V8 (0V) | V10 (14V/10V) | V10 (14V/10V) | V12 (F~20V) |
| WL SELECTED | 0V | 0V | FLOAT ~0V | 20V | 20V | FLOAT ~0V | 0V | 0V | FLOAT ~20V |
| WL DESELECTED | 8V | 8V | FLOAT ~0V | 5V–10V | 5V–10V | FLOAT ~0V | 5V–10V (DUMMY) | 5V–10V (DUMMY) | FLOAT ~20V |
| SGS | 5V | 5V | 0V | 0V | 0V | 0V | 15V | 15V | F~20V |
| SRC | 0V | 0V | 0V | 2.3V | 2.3V | 2.3V | Verase (~20V) | Verase (~20V) | Verase (~20V) |

| | READ | | | WRITE | | | ERASE | | |
|---|---|---|---|---|---|---|---|---|---|
| | SELECTED BLOCK | | DESELECTED BLOCK | SELECTED BLOCK | | DESELECTED BLOCK | SELECTED BLOCK | | DESELECTED BLOCK |
| | SELECTED STRING | DESELECTED STRING | ALL STRINGS | SELECTED STRING | DESELECTED STRING | ALL STRINGS | SELECTED STRING | DESELECTED STRING | ALL STRINGS |
| BL | 0.5V | 0.5V | 0.5V | 0V or 2.3V | 0V or 2.3V | 0V or 2.3V | ~20V | ~20V | 20V |
| SGD$_A$ | 5V | V1 (0V/0.5V) | V3 (0.5V) | 3V | V5 (0V/2.3V) | V7 (2.3V) | V9 (10V/14V) | V9 (10V/14V) | V11 (F~20V) |
| SGD$_B$ | 5V | V2 (0V) | V4 (0V) | 3V | V6 (0V) | V8 (0V) | V10 (14V/10V) | V10 (14V/10V) | V12 (F~20V) |
| WL SELECTED | 0V | 0V | FLOAT ~0V | 20V | 20V | FLOAT ~0V | 0V | 0V | FLOAT ~20V |
| WL DESELECTED | 8V | 8V | FLOAT ~0V | 5V–10V | 5V–10V | FLOAT ~0V | 5V–10V (DUMMY) | 5V–10V (DUMMY) | FLOAT ~20V |
| SGS | 5V | 0V | 0V | 0V | 0V | 0V | 15V | 15V | F~20V |
| SRC | 0V | 0V | 0V | 2.3V | 2.3V | 2.3V | Verase (~20V) | Verase (~20V) | Verase (~20V) |

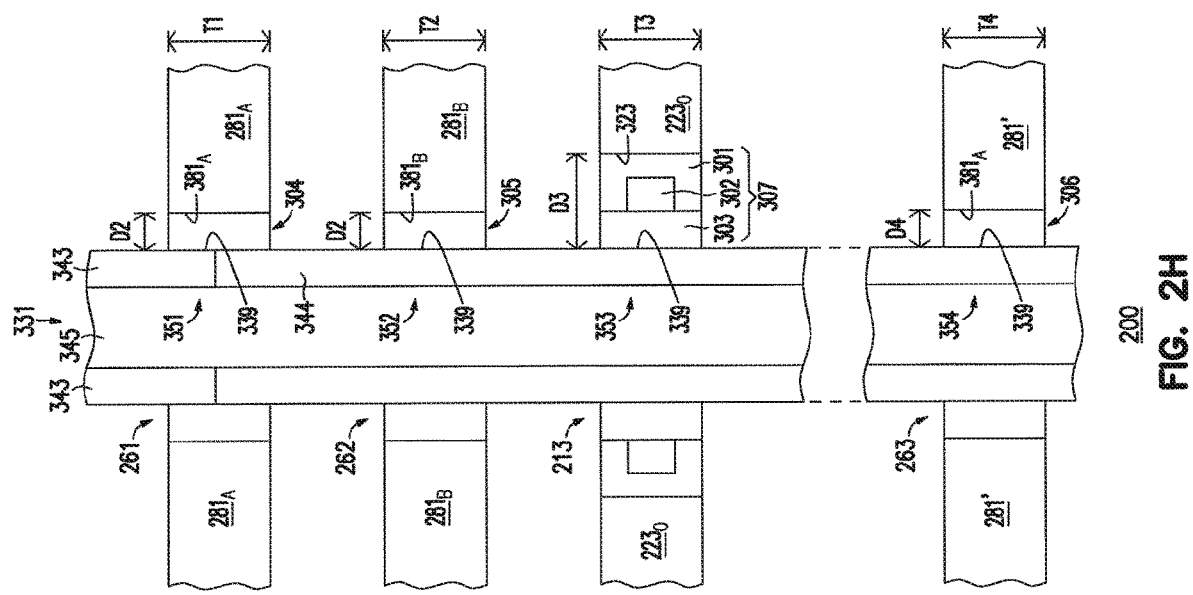

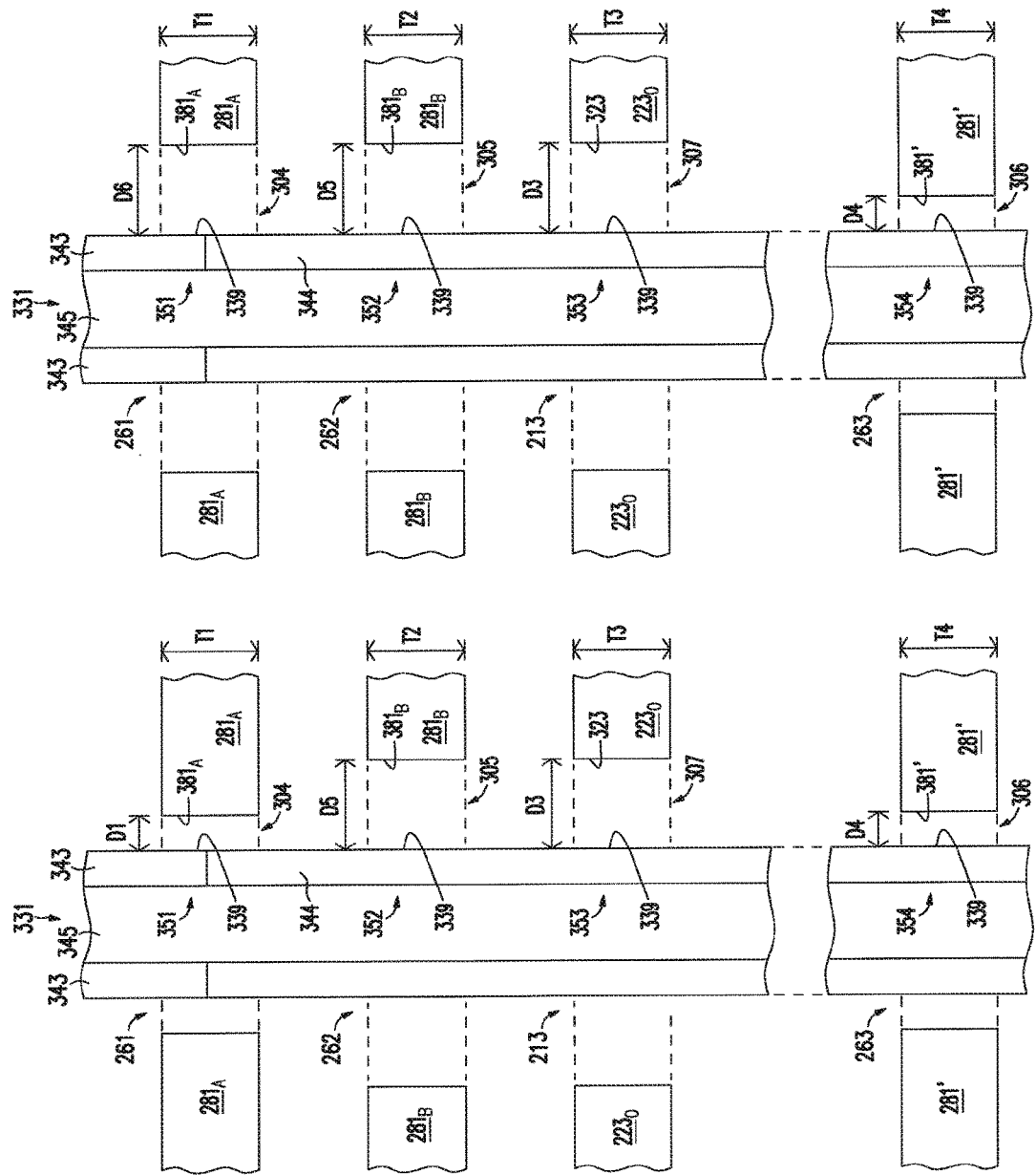

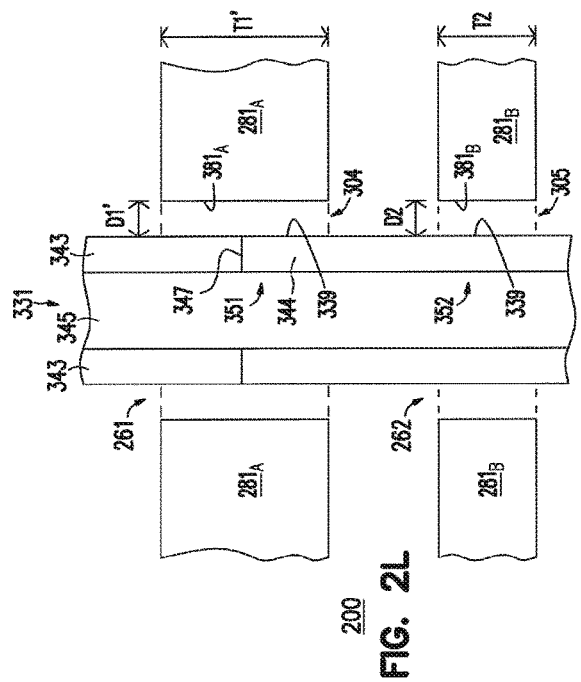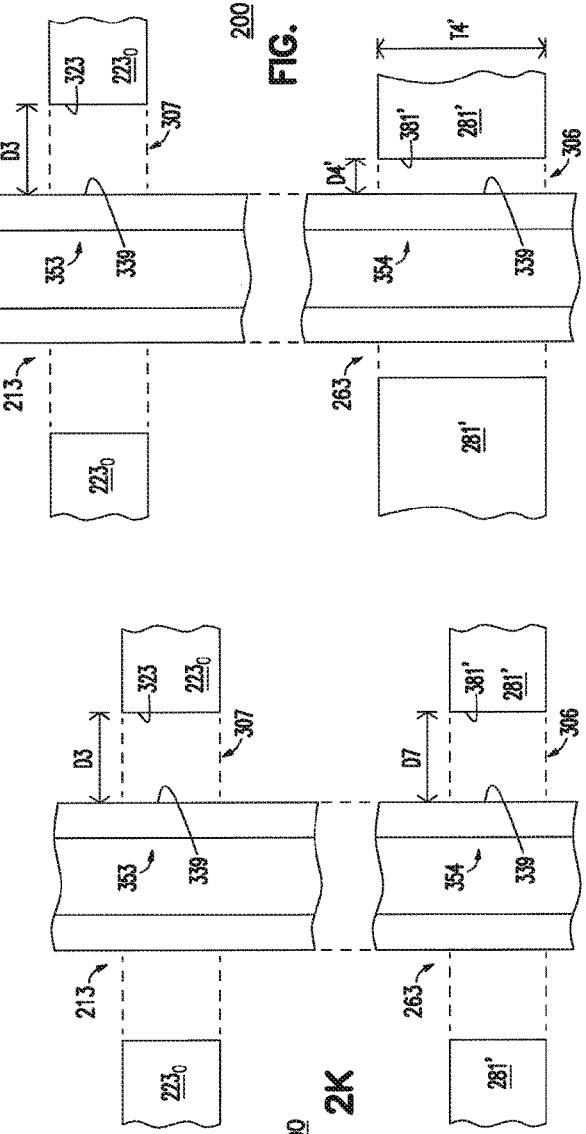

| | READ | | | WRITE | | | ERASE | | |
|---|---|---|---|---|---|---|---|---|---|
| | SELECTED BLOCK | | DESELECTED BLOCK | SELECTED BLOCK | | DESELECTED BLOCK | SELECTED BLOCK | | DESELECTED BLOCK |
| | SELECTED STRING | DESELECTED STRING | ALL STRINGS | SELECTED STRING | DESELECTED STRING | ALL STRINGS | SELECTED STRING | DESELECTED STRING | ALL STRINGS |
| BL | 0.5V | 0.5V | 0.5V | 0V or 2.3V | 0V or 2.3V | 0V or 2.3V | ~20V | ~20V | 20V |
| $SGD_A$ | V1 (5V) | V2 (0V) | V3 (0.5V) | 3V | 3V | V7 (2.3V) | V9 (10V/14V) | V10 (14V/10V) | V11 (F~20V) |
| $SGD_B$ | 5V | V2 (0V) | V4 (0V) | 3V | V6 (0V) | V8 (0V) | V10 (14V/10V) | V10 (14V/10V) | V12 (F~20V) |
| WL SELECTED | 0V | 0V | FLOAT ~0V | 20V | 20V | FLOAT ~0V | 0V | 0V | FLOAT ~20V |
| WL DESELECTED | 8V | 8V | FLOAT ~0V | 5V–10V | 5V–10V | FLOAT ~0V | 5V–10V (DUMMY) | 5V–10V (DUMMY) | FLOAT ~20V |
| $SGS_B$ | 5V | 0V | 0V | V14 (0V) | V16 (0V) | V18 (0V) | V20 (11V) | V20 (11V) | (F~20V) |
| $SGS_A$ | 5V | 0V | 0V | V13 (2.3V) | V15 (2.3V) | V17 (2.3V) | V19 (15V) | V19 (15V) | (F~20V) |
| SRC | 0V | 0V | 0V | 2.3V | 2.3V | 2.3V | Verase (~20V) | Verase (~20V) | Verase (~20V) |

| | READ | | | WRITE | | | ERASE | | |
|---|---|---|---|---|---|---|---|---|---|
| | SELECTED BLOCK | | DESELECTED BLOCK | SELECTED BLOCK | | DESELECTED BLOCK | SELECTED BLOCK | | DESELECTED BLOCK |
| | SELECTED STRING | DESELECTED STRING | ALL STRINGS | SELECTED STRING | DESELECTED STRING | ALL STRINGS | SELECTED STRING | DESELECTED STRING | ALL STRINGS |
| BL | 0.5V | 0.5V | 0.5V | 0V or 2.3V | 0V or 2.3V | 0V or 2.3V | ~20V | ~20V | 20V |
| SGD$_A$ | 5V | V1 (0V/0.5V) | V3 (0.5V) | 3V | V5 (0V/2.3V) | V7 (2.3V) | V9 (10V/14V) | V10 (14V/10V) | V11 (F~20V) |
| SGD$_B$ | 5V | V2 (0V) | V4 (0V) | 3V | V6 (0V) | V8 (0V) | V10 (14V/10V) | V10 (14V/10V) | V12 (F~20V) |
| WL SELECTED | 0V | 0V | FLOAT ~0V | 20V | 20V | FLOAT ~0V | 0V | 0V | FLOAT ~20V |
| WL DESELECTED | 8V | 8V | FLOAT ~0V | 5V–10V | 5V–10V | FLOAT ~0V | 5V–10V (DUMMY) | 5V–10V (DUMMY) | FLOAT ~20V |
| SGS$_B$ | 5V | 0V | 0V | V14 (0V) | V16 (0V) | V18 (0V) | V20 (11V) | V20 (11V) | (F~20V) |
| SGS$_A$ | 5V | 0V | 0V | V13 (2.3V) | V15 (2.3V) | V17 (2.3V) | V19 (15V) | V19 (15V) | (F~20V) |
| SRC | 0V | 0V | 0V | 2.3V | 2.3V | 2.3V | Verase (~20V) | Verase (~20V) | Verase (~20V) |

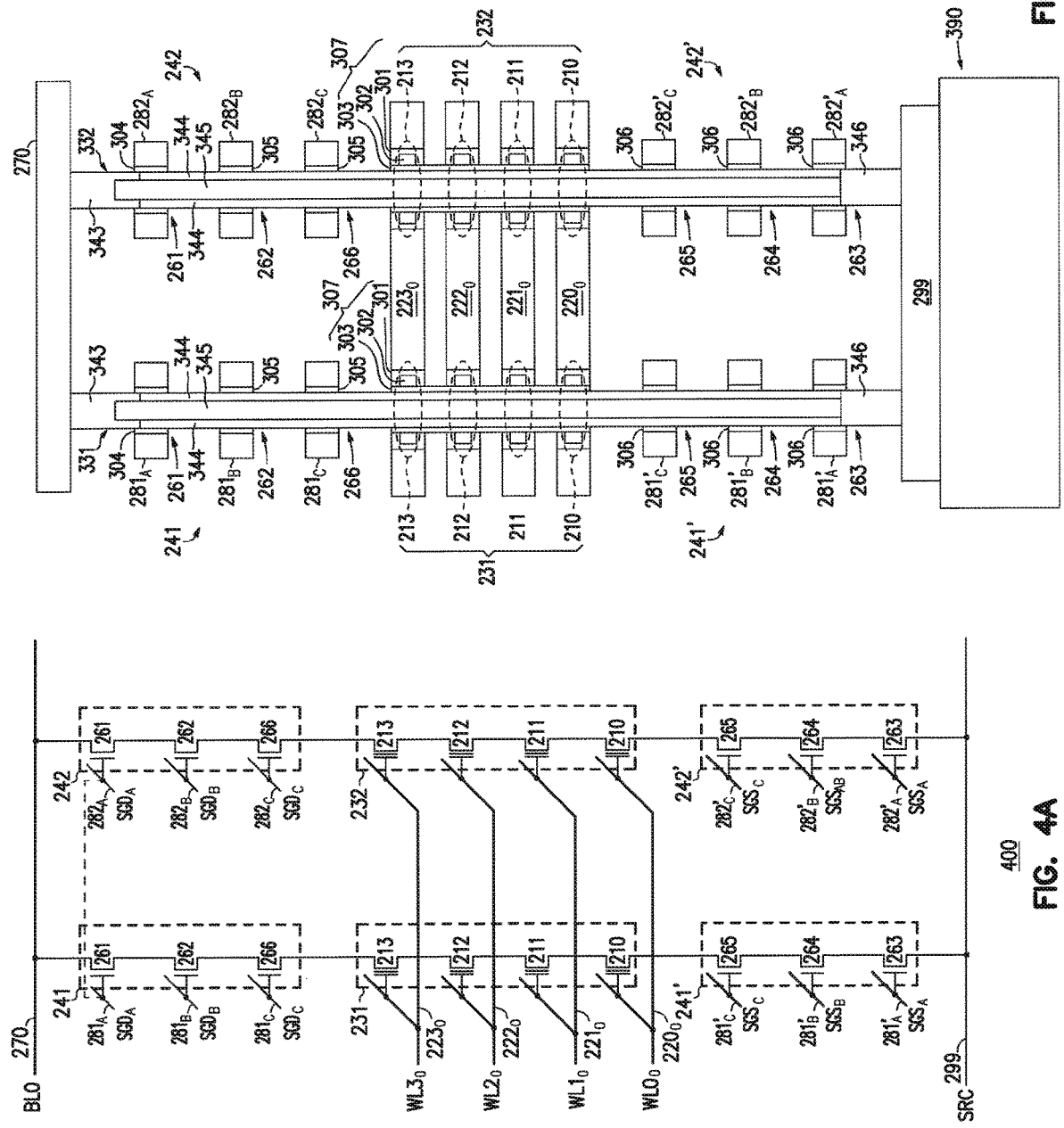

800

800

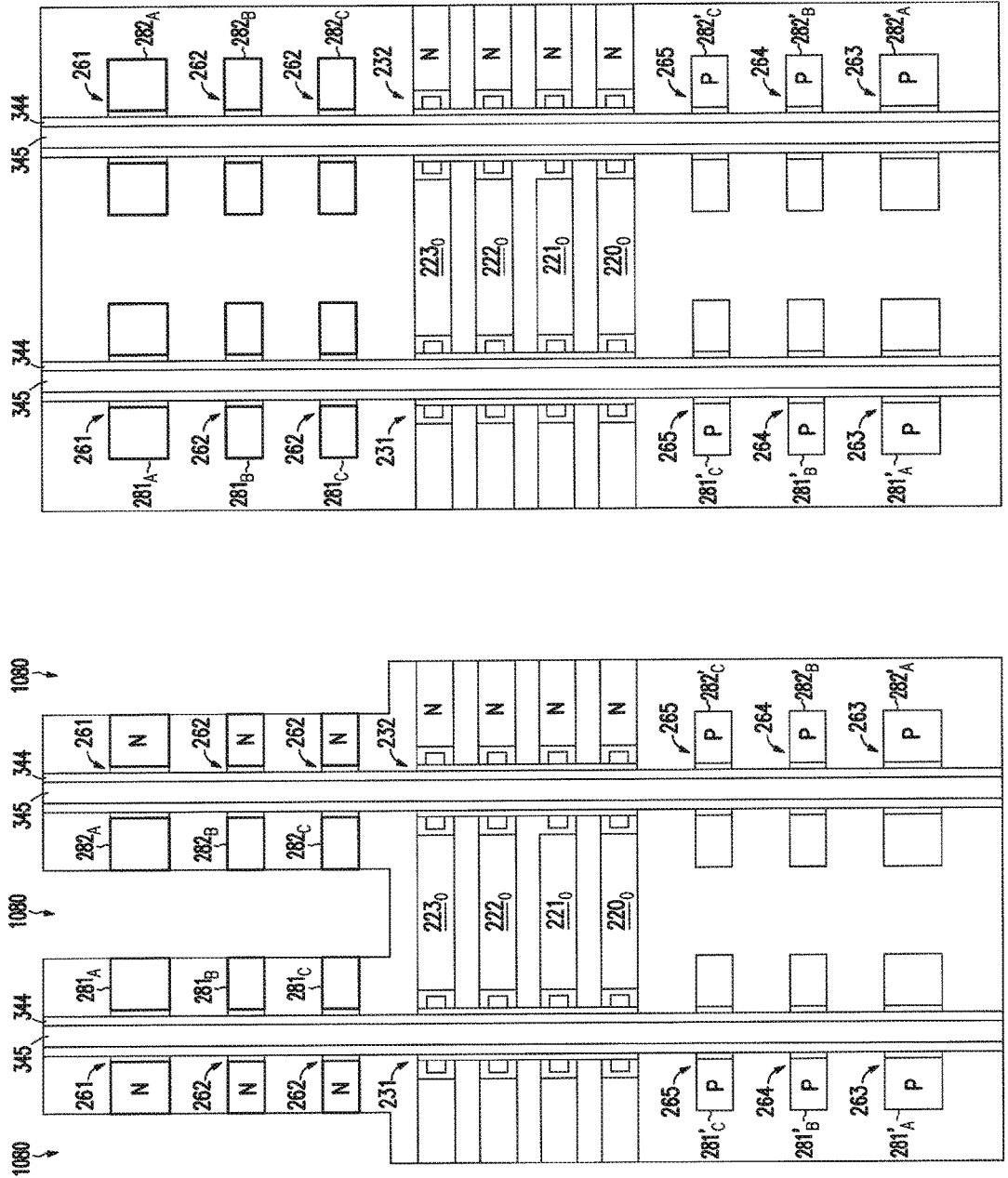

1100

1100

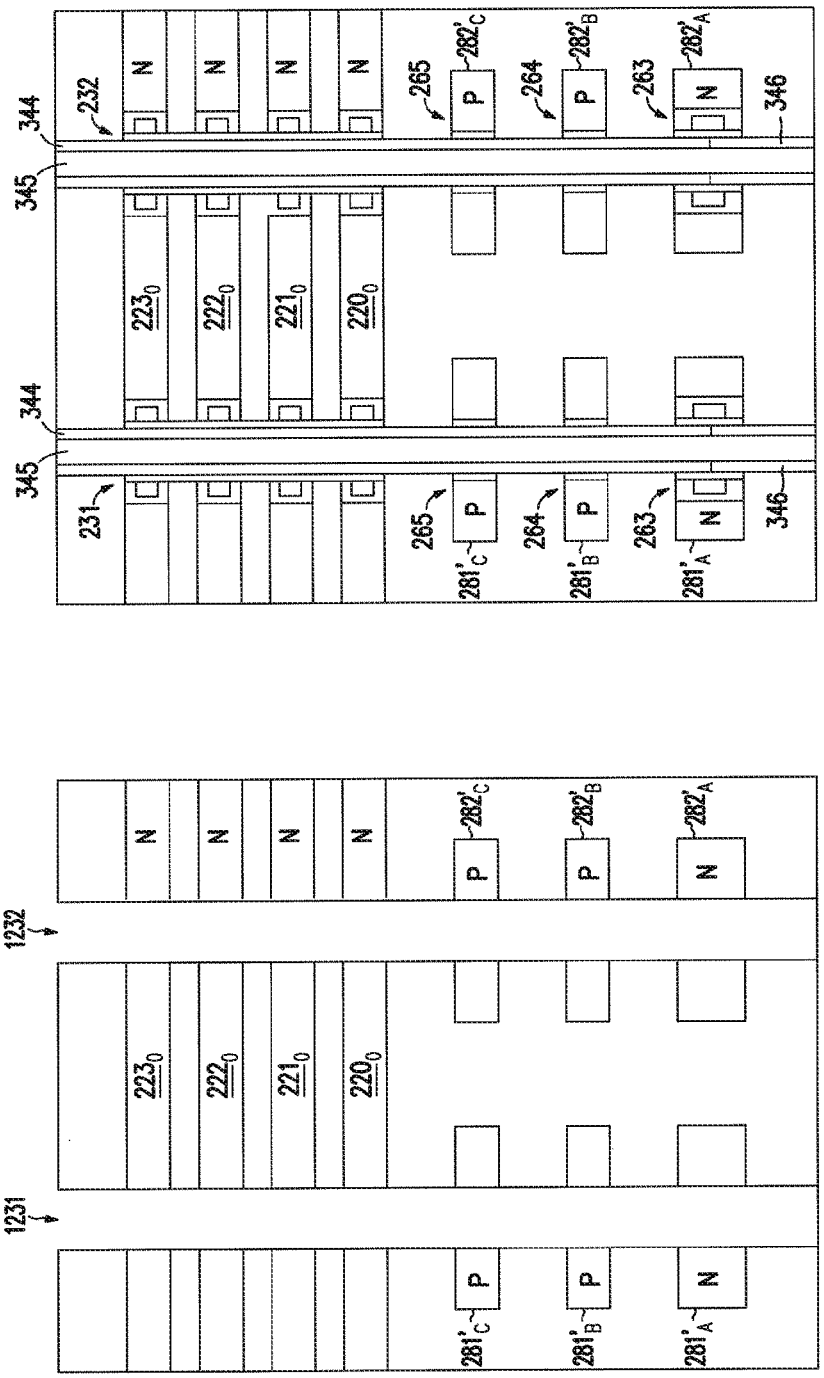

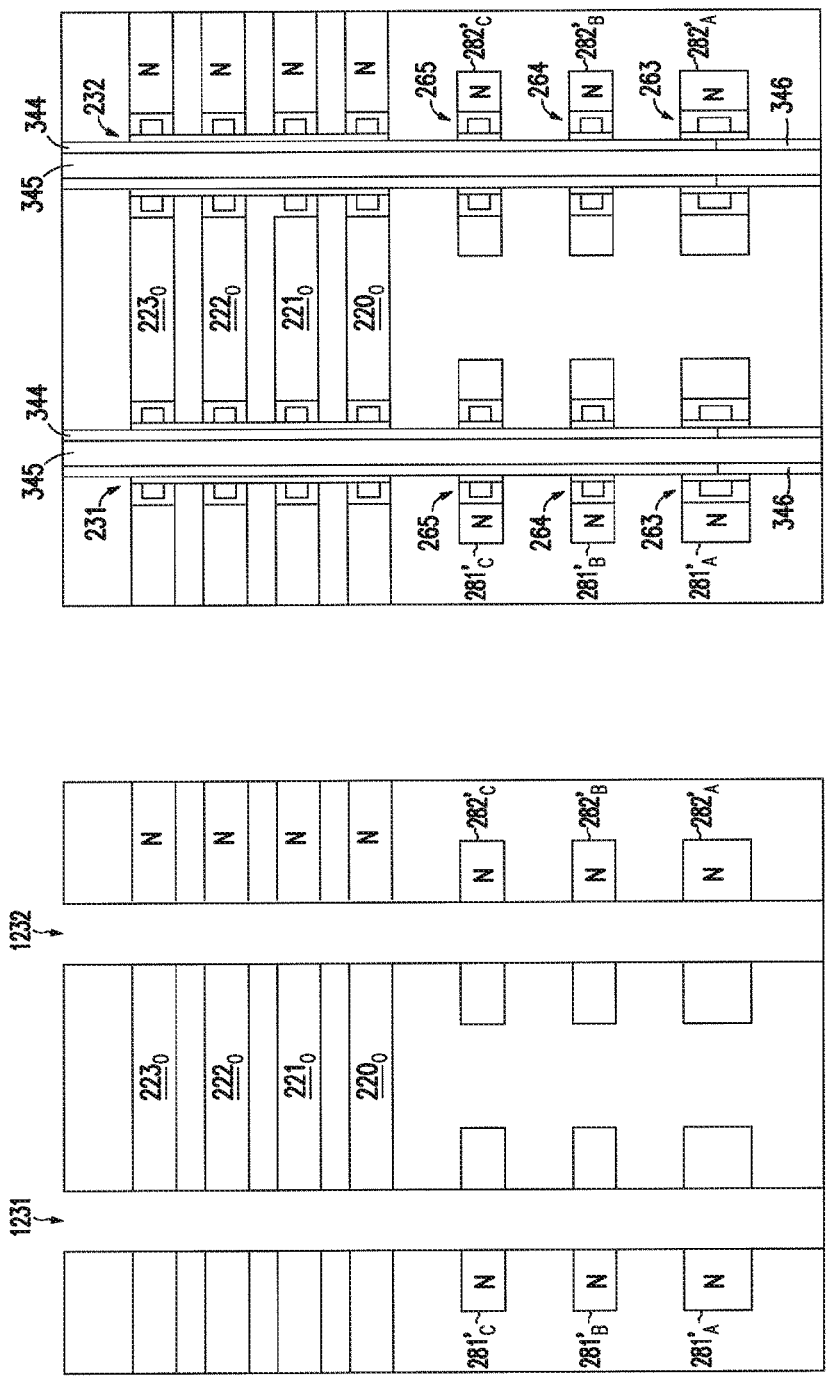

1600

1500 ic device of FIG. 2H and variations in thicknesses of select gates of the portion of memory device 200 of FIG. 2H, according to some embodiments described herein.

MEMORY DEVICE INCLUDING MULTIPLE SELECT GATES AND DIFFERENT BIAS CONDITIONS

PRIORITY APPLICATION

This application is a continuation of U.S. application Ser. No. 16/036,549, filed Jul. 16, 2018, which is a continuation of U.S. application Ser. No. 15/669,311, now issued as U.S. Pat. No. 10,026,480, which is a continuation of U.S. application Ser. No. 15/205,574, filed Jul. 8, 2016, now issued as U.S. Pat. No. 9,728,266, all of which are incorporated herein by reference in their entireties.

BACKGROUND

Memory devices are widely used in computers and many electronic items to store information. A memory device usually has numerous memory cells. The memory device performs a write operation to store information in the memory cells, a read operation to read the stored information, and an erase operation to erase information (e.g., obsolete information) from some or all of the memory cells. During these operations, an event such as a leakage of current near the memory cells may occur. Such an event may reduce the efficiency of some operations (e.g., read and write operations) of the memory device. However, for other operations (e.g., erase operations) of the memory device, such an event may be useful. Thus, designing a memory device and operating it to balance the effect of an event such as leakage current may pose a challenge.

BRIEF DESCRIPTION OF THE DRAWINGS

FIG. 2D is a chart showing example values of voltages provided to signals of the memory device of FIG. 2A through FIG. 2C during read, write, and erase operations of the memory device, according to some embodiments described herein.

FIG. 2E is a chart showing example values of voltages provided to signals of a variation of the memory device of FIG. 2A through FIG. 2C, according to some embodiments described herein.

FIG. 2H shows details of a portion of the structure of the memory device of FIG. 2F including sidewalls of some of parts of the memory device, according to some embodiments described herein.

FIG. 2I through FIG. 2M show variations in distances between different sidewalls of some parts of the memory device of FIG. 2H and variations in thicknesses of select gates of the portion of memory device 200 of FIG. 2H, according to some embodiments described herein.

FIG. 3D is a chart showing example values of voltages provided to signals of the memory device of FIG. 3A through FIG. 3C during read, write, and erase operations of the memory device, according to some embodiments described herein.

FIG. 3E is a chart showing example values of voltages provided to signals of a variation of the memory device of FIG. 3A through FIG. 3C, according to some embodiments described herein.

FIG. 4A and FIG. 4B show a schematic diagram and a structure, respectively, of a portion of a memory device including triple drain select gates and triple source select gates, according to some embodiments described herein.

FIG. 5A through FIG. 16 show processes of forming memory device including multiple select gates, according to some embodiments described herein.

DETAILED DESCRIPTION

Figure 1:
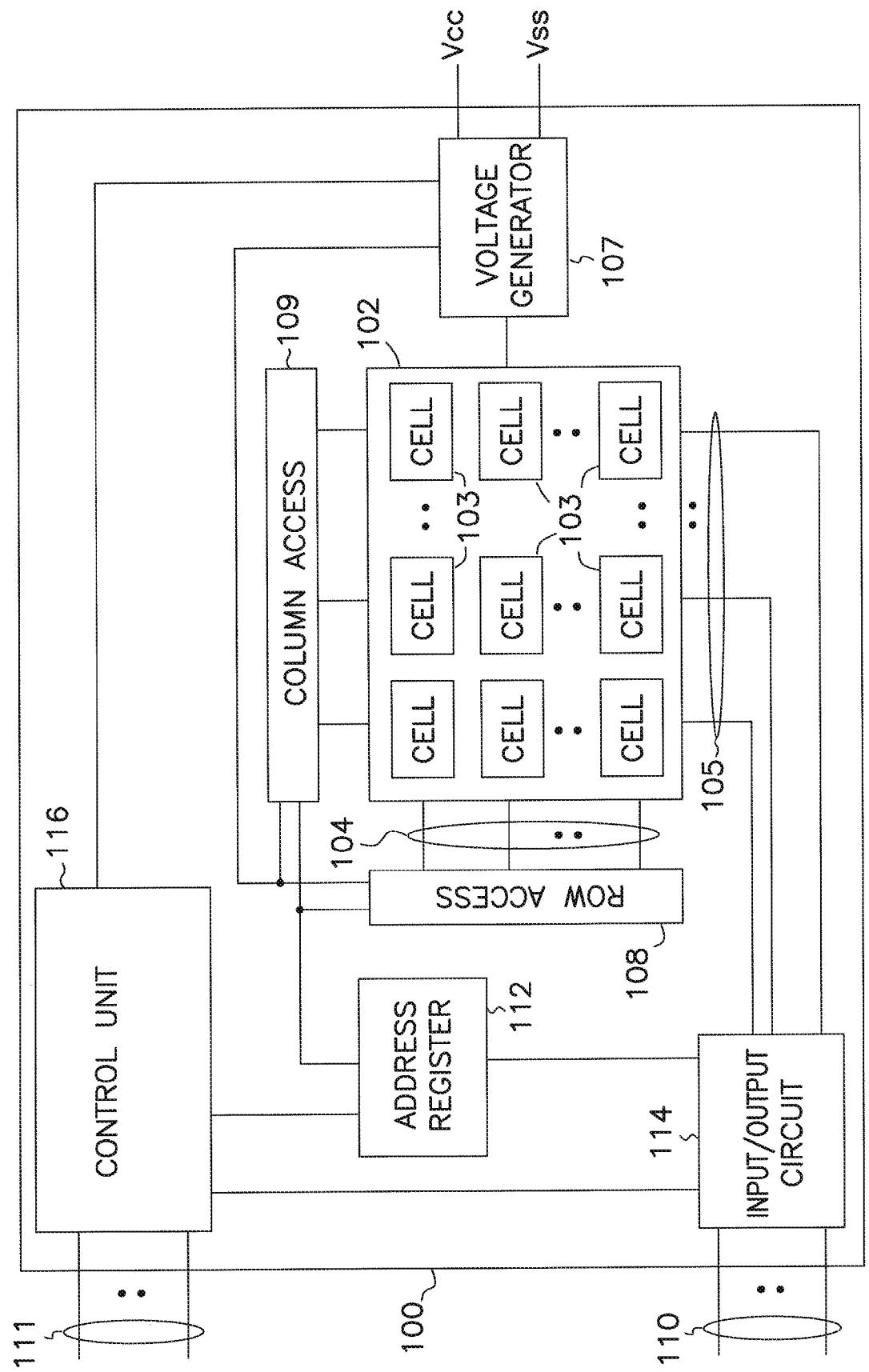
FIG. 1 shows a block diagram of an apparatus in the form of a memory device, according to some embodiments described herein.

FIG. 1 shows a block diagram of an apparatus in the form of a memory device 100, according to some embodiments described herein. Memory device 100 can include a memory array 102 having memory cells 103 that can be arranged in rows and columns along with lines (e.g., access lines) 104 and lines (e.g., data lines) 105. Memory device 100 can use lines 104 to access memory cells 103 and lines 105 to exchange information with memory cells 103.

Row access 108 and column access 109 circuitry can respond to an address register 112 to access memory cells 103 based on row address and column address signals on lines 110, 111, or both. A data input/output circuit 114 can be configured to exchange information between memory cells 103 and lines 110. Lines 110 and 111 can include nodes within memory device 100 or pins (or solder balls) on a package where memory device 100 can reside.

A control circuit 116 can control operations of memory device 100 based on signals present on lines 110 and 111. A device (e.g., a processor or a memory controller) external to memory device 100 can send different commands (e.g., read, write, and erase commands) to memory device 100 using different combinations of signals on lines 110, 111, or both.

Memory device 100 can respond to commands to perform memory operations on memory cells 103, such as performing a read operation to read information from memory cells 103 or performing a write (e.g., programming) operation to store (e.g., program) information into memory cells 103. Memory device 100 can also perform an erase operation to erase information from some or all of memory cells 103.

Memory device 100 can receive a supply voltage, including supply voltages Vcc and Vss. Supply voltage Vss can operate at a ground potential (e.g., having a value of approximately zero volts). Supply voltage Vcc can include an external voltage supplied to memory device 100 from an external power source such as a battery or an alternating current to direct current (AC-DC) converter circuitry. Memory device 100 can include a voltage generator 107 to generate different voltages for use in operations of memory device 100, such as read, write, and erase operations.

Each of memory cells 103 can be programmed to store information representing a value of a fraction of a bit, a value of a single bit, or a value of multiple bits such as two, three, four, or another number of bits. For example, each of memory cells 103 can be programmed to store information representing a binary value "0" or "1" of a single bit. The single bit per cell is sometimes called a single level cell. In another example, each of memory cells 103 can be programmed to store information representing a value for multiple bits, such as one of four possible values "00", "01", "10", and "11" of two bits, one of eight possible values "000", "001", "010", "011", "100", "101", "110", and "111" of three bits, or one of other values of another number of multiple bits. A cell that has the ability to store multiple bits is sometimes called a multi-level cell (or multi-state cell).

Memory device 100 can include a non-volatile memory device, and memory cells 103 can include non-volatile memory cells, such that memory cells 103 can retain information stored thereon when power (e.g., Vcc, Vss, or both) is disconnected from memory device 100. For example, memory device 100 can be a flash memory device, such as a NAND flash or a NOR flash memory device, or another kind of memory device, such as a variable resistance memory device (e.g., a phase change or resistive RAM device).

Memory device 100 can include a memory device where memory cells 103 can be physically located in multiple levels on the same device, such that some of memory cells 103 can be stacked over some other memory cells 103 in multiple levels over a substrate (e.g., a semiconductor substrate) of memory device 100. One of ordinary skill in the art may recognize that memory device 100 may include other elements, several of which are not shown in FIG. 1, so as not to obscure the example embodiments described herein.

At least a portion of memory device 100 can include structures similar to or identical to the memory devices described below with reference to FIG. 2A through FIG. 24.

Figure 2A:
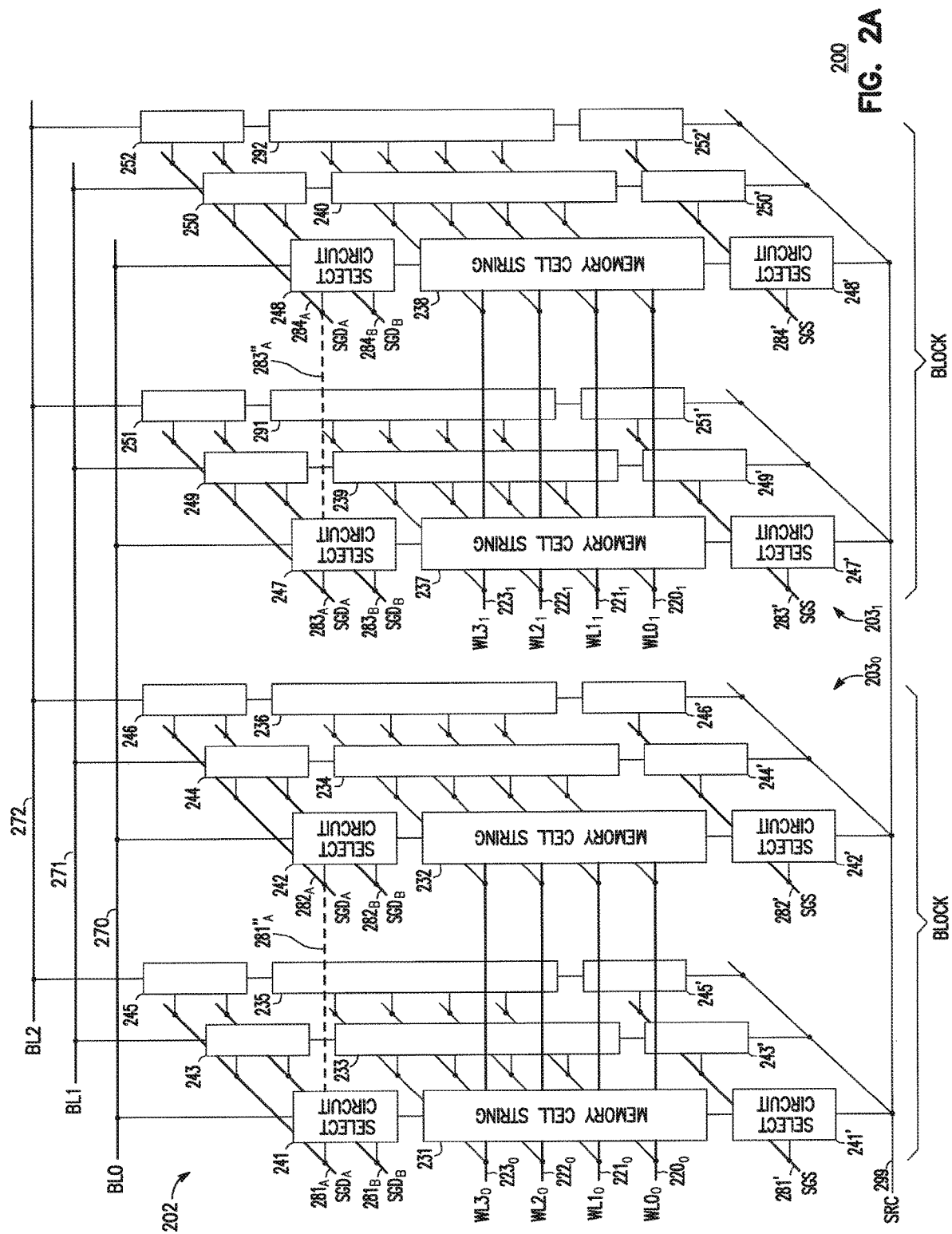
FIG. 2A shows a block diagram of a portion of a memory device including a memory array having memory cell strings, select circuits, and double drain select lines, according to some embodiments described herein.

FIG. 2A shows a block diagram of a portion of a memory device 200 including a memory array 202 having memory cell strings 231 through 240, 291, and 292, select circuits 241 through 252 and 241' through 252', and double drain select lines, according to some embodiments described herein. Memory device 200 can correspond to memory device 100 of FIG. 1. For example, memory array 202 can form part of memory array 102 of FIG. 1.

As shown in FIG. 2A, memory device 200 can include blocks (blocks of memory cells) blocks $203_0$ and $203_1$. Two blocks are shown as an example. Memory device 200 can include many blocks (e.g., up to thousands or more blocks). Each of blocks $203_0$ and $203_1$ has its own memory cell strings and associated select circuits. For example, block $203_0$ has memory cell strings 231 through 236, and select circuits 241 through 246 and 241' through 246'. Block $203_1$ has memory cell strings 237 through 240, 291, and 292, and select circuits 247 through 252 and 247' through 252'.

Each of the memory cell strings 231 through 240, 291, and 292, can be associated with (e.g., coupled to) two select circuits. For example, memory cell string 231 is associated with select circuit (e.g., top select circuit) 241 and select circuit (e.g., bottom select circuit) 241'. FIG. 2A shows an example of six memory cell strings and their associated circuits (e.g., top and bottom select circuits) in each of blocks $203_0$ and $203_1$. The number of memory cell strings and their associated select circuits in each of blocks $203_0$ and $203_1$ can vary.

Memory device 200 can include lines 270, 271, and 272 that carry signals BL0, BL1, and BL2, respectively. Each of lines 270, 271, and 272 can be structured as a conductive line (which includes a conductive material region) and can form part of a respective data line (e.g., bit line) of memory device 200. The memory cell strings of blocks $203_0$ and $203_1$ can share lines 270, 271, and 272. For example, memory cell strings 231, 232, 237, and 238 can share line 270. Memory cell strings 233, 234, 239, and 240 can share line 271. Memory cell strings 235, 236, 291, and 292 can share line 272. FIG. 2A shows three lines (e.g., data lines) 270, 271, and 272 as an example. The number of data line can vary.

Memory device 200 can include a line 299 that can carry a signal SRC (e.g., source line signal). Line 299 can be structured as a conductive line and can form part of a source (e.g., a source line) of memory device 200. Blocks $203_0$ and $203_1$ can share line 299.

Memory device 200 can include separate control lines in blocks $203_0$ and $203_1$. As shown in FIG. 2A, memory device 200 can include control lines $220_0$, $221_0$, $222_0$, and $223_0$ that can carry corresponding signals (e.g., word line signals) $WL0_0$, $WL1_0$, $WL2_0$, and $WL3_0$. Memory device 200 can include control lines $220_1$, $221_1$, $222_1$, and $223_1$ that can carry corresponding signals (e.g., word line signals) $WL0_1$, $WL1_1$, $WL2_1$, and $WL3_1$. Control lines $220_0$ through $223_0$ and $220_1$ through $223_1$ can be structured as conductive control lines (which include conductive materials) can form part of a respective access lines (e.g., word lines) of memory device 200 to access memory cells in a respective block. FIG. 2A shows four control lines ($220_0$ through $223_0$ or $220_1$ through $223_1$) in each of blocks $203_0$ and $203_1$ as an example. The number of control lines can vary.

As show in FIG. 2A, memory device 200 can include double (e.g., upper and lower) drain select lines, including select lines $281_A$, $282_A$, $283_A$, and $284_A$ (e.g., upper drain select lines) and select lines $281_B$, $282_B$, $283_B$, and $284_B$, (e.g., lower drain select lines). Each of select lines $281_A$, $282_A$, $283_A$, and $284_A$ can carry a separate (e.g., different) signal (e.g., an upper select line signal) $SGD_A$. Each of select lines $281_B$, $282_B$, $283_B$, and $284_B$ can carry a separate signal (e.g., a lower select line signal) $SGD_B$. Memory device 200 can include select lines (e.g., source select line) $281'$, $282'$, $283'$, and $284'$, and each can carry a separate (e.g., different) signal SGS.

FIG. 2A shows select line $281_A$ coupled to select lines $282_A$ (through a connection $281''_A$) and select line $283_A$ coupled to select lines $284_A$ (through a connection $283''_A$) to indicate an example of memory device 200 where signal $SGD_A$ associated with select line $281_A$ and signal $SGD_A$ associated with select line $282_A$ can be the same signal, and signal $SGD_A$ associated with select line $283_A$ and signal $SGD_A$ associated with select line $284_A$ can be the same signal. This means that signal $SGD_A$ associated with select line $281_A$ and signal $SGD_A$ associated with select line $282_A$ can be provided (e.g., bias) with voltages having the same value; and signal $SGD_A$ associated with select line $283_A$ and signal $SGD_A$ associated with select line $284_A$ can be provided (e.g., bias) with voltages having the same value.

In a variation of memory device 200, signal $SGD_A$ associated with select line $281_A$ and signal $SGD_A$ associated with select line $282_A$ can be separate signals; and signal $SGD_A$ associated with select line $283_A$ and signal $SGD_A$ associated with select line $284_A$ can be separate signals. Separate signals can be provided with voltages having different values at one point in time, but the separate signals can also be provided with voltages having the same value at another time. In the variation of memory device 200, select lines $281_A$ and $282_A$ can be uncoupled from each other; and select lines $283_A$ and $284_A$ can be uncoupled from each other. Separate signals may allow more precise bias conditions (e.g., precise voltage values) to be applied (e.g., separately applied) to select lines $281_A$, $282_A$, $283_A$, and $284_A$ during operations of memory device 200.

In the structure of memory device 200, connection $281''_A$ between select lines $281_A$ and $282_A$ can be a direct connection (e.g., physically connected to each other). As an example, in such a direct connection, select line $281_A$ and $282_A$ can be part of the same piece of conductive material (e.g., a same layer of conductive material). Alternatively, connection $281''_A$ between select lines $281_A$ and $282_A$ in FIG. 2A can be an indirect connection. For example, in the indirect connection, select lines $281_A$ and $282_A$ may not be formed from the same piece (e.g., layer) of conductive material but they can be connected (e.g., electrically connected) to each other through a transistor (or through multiple transistors). Similarly, in the structure of memory device 200, connection $283''_A$ between select lines $283_A$ and $284_A$ can be a direct connection (e.g., formed from the same piece of conductive material) or an indirect connection (e.g., not formed from the same piece of conductive material). In some operations (e.g., read and write operations) of memory device 200, providing the same signal (e.g., shared signal) to select lines $281_A$ and $282_A$ and providing the same signal (e.g., shared signal) to select lines $283_A$ and $284_A$ may simplify operations of memory device 200.

As shown in FIG. 2A, select circuits 241, 243, and 245 can share select line $281_A$ and $281_B$. Select circuits 242, 244, and 246 can share select line $282_A$ and $282_B$. Select circuits 247, 249, and 251 can share select line $283_A$ and $283_B$. Select circuits 248, 250, and 252 can share select line $284_A$ and $284_B$. Each of select circuits 241 through 252 can include multiple select gates (e.g., multiple transistors, shown in FIG. 2B) that can be controlled (e.g., turned on or turned off) by two respective select lines (e.g., $281_A$ and $281_B$, $282_A$ and $282_B$, $283_A$ and $283_B$, or $284_A$ and $284_B$).

Select circuits $241'$, $243'$, and $245'$ can share select line $281'$. Select circuits $242'$, $244'$, and $246'$ can share select line $282'$. Select circuits $247'$, $249'$, and $251'$ can share select line $283'$. Select circuits $248'$, $250'$, and $252'$ can share select line $284'$. Each of select circuits $241'$ through $252'$ can include a select gate (e.g., a transistor, shown in FIG. 2B) that can be controlled (e.g., turned on or turned off) by a respective select line among select lines $281'$, $282'$, $283'$, and $284'$. In a variation of memory device 200 (e.g., shown in FIG. 3B), each of select circuits $241'$ through $252'$ can include multiple select gates (e.g., multiple transistors) that can be controlled by multiple select lines (e.g., multiple source select lines).

In FIG. 2A, each of memory cell strings 231 through 240, 291, and 292 has memory cells (shown in FIG. 2B) arranged in a string (e.g., coupled in series among each other) to store information. During an operation (e.g., read, write, or erase operation) of memory device 200, memory cell strings 231 through 240, 291, and 292 can be individually selected to access the memory cells in the selected memory cell string in order to store information in or read information from the selected memory cell string.

During an operation (e.g., read, write, or erase operation) of memory device 200, one or both select circuits associated with a selected memory cell string can be activated (e.g., by turning on the transistors in the select circuits), depending on which operation memory device 200 performs on the selected memory cell string. During an operation of memory device 200, memory device 200 can select a memory cell (among memory cells 210, 211, 212, and 213) of a particular memory cell string as a selected memory cell in order to store information in (e.g., during a write operation) or to read information from (e.g., during a read operation) the selected memory cell. Thus, a selected memory cell string is a memory cell string that has a selected memory cell. A deselected (unselected) memory cell string is a memory cell string that does not have a selected memory cell. During a particular operation (e.g., read or write operation) of memory device 200, a selected block is a block that has a selected memory cell string; a deselected (unselected) block is a block that does not have a selected memory cell string during that particular operation.

Activating a particular select circuit among select circuits 247 through 252 during an operation of memory device 200 can include providing (e.g., applying) voltages having certain values to signals $SGD_A$ and $SGD_B$ associated with that particular select circuit. Activating a particular select circuit among select circuits $247'$ through $252'$ can include providing (e.g., applying) voltages having certain values to signal SGS associated with that particular select circuit. When a particular select circuit among select circuits 241 through 252 is activated, it can couple (e.g., form a current path from) a selected memory cell string associated with that particular select circuit to a respective data line (e.g., one of lines 270, 271, or 272). When a particular select circuit among select circuits $241'$ through $252'$ is activated, it can couple (e.g., form a current path from) a selected memory cell string associated with that particular select circuit to a source (e.g., line 299).

Figure 2B:
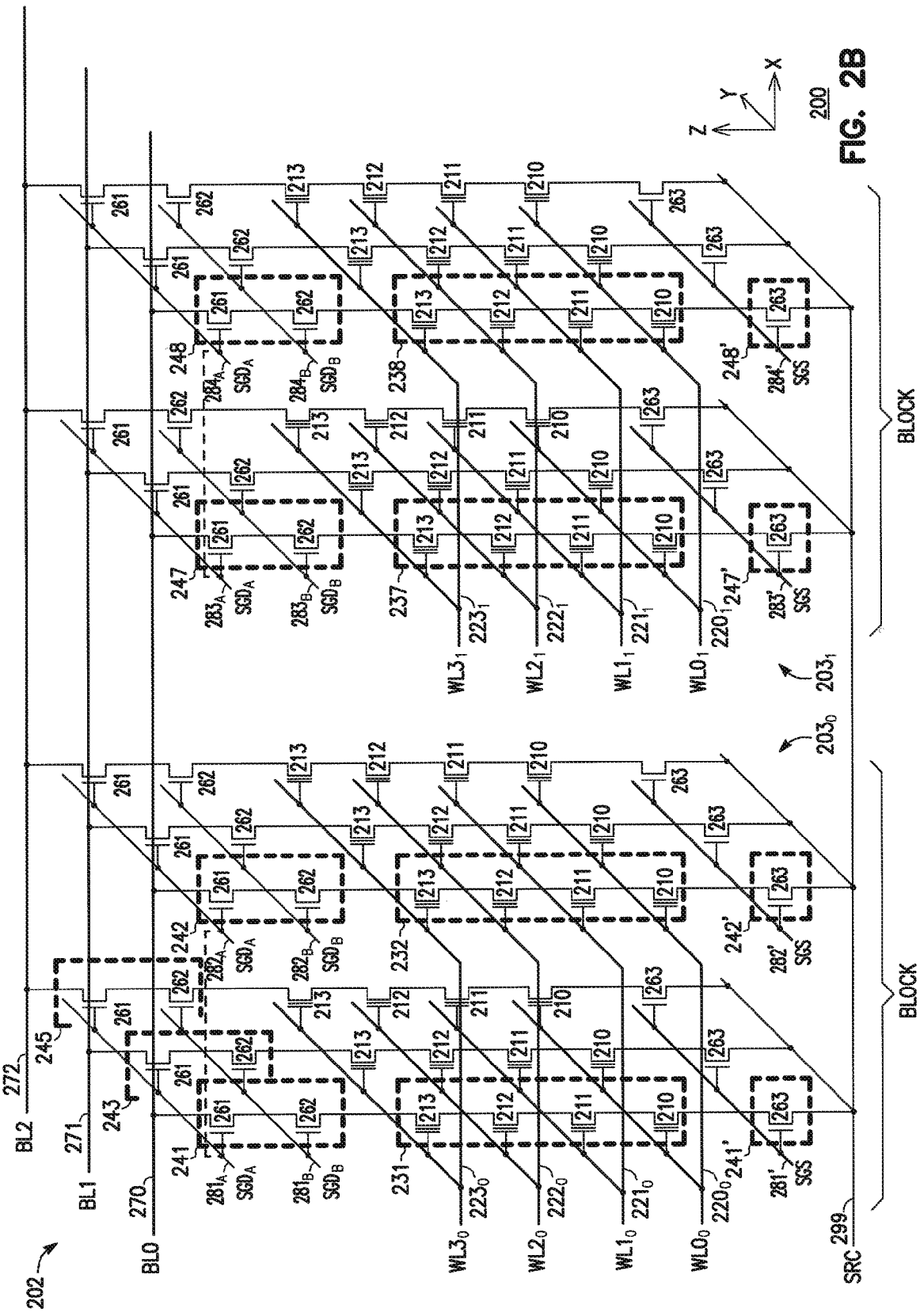
FIG. 2B shows a schematic diagram of the memory device of FIG. 2A including double drain select gates, according to some embodiments described herein.

FIG. 2B shows a schematic diagram of memory device 200 of FIG. 2A, according to some embodiments described herein. For simplicity, only four memory cell strings 231, 232, 237 and 238 and ten select circuits 241, 242, 243, 245, 247, 248, $241'$, $242'$, $247'$, and $248'$ of FIG. 2A are labeled in FIG. 2B. As shown in FIG. 2B, memory device 200 can include memory cells 210, 211, 212, and 213 and select gates (e.g., drain select transistors) 261 and 262 and select gates (e.g., source select transistors) 263 that can be physically arranged in three dimensions (3-D), such as x, y, and z dimensions, with respect to of the structure (shown in FIG. 2F and FIG. 2G) of memory device 200.

As shown in FIG. 2B, each of the memory cell strings (e.g., strings 231, 232, 237 and 238) of memory device 200 can include one of memory cells 210, one of memory cells 211, one of memory cells 212, and one of memory cells 213. FIG. 2B shows an example of four memory cells 210, 211, 212, and 213 in each memory cell string. The number of memory cells in each memory cell string can vary.

Each of select circuits 241, 242, 247, and 248 can include double select gates (e.g., double drain select gates): one of select gates 261 and one of select gates 262. Each of select circuits 241', 242'. 247', and 248' can include one of select gates 263. Each of select gates 261, 262, and 263 can operated as a transistor, such as a field-effect transistor (FET). An example of an FET includes a metal-oxide semiconductor (MOS) transistor. A select line shared among particular select circuits can be shared by select gates of those particular select circuits. For example, select line $281_A$ can be shared by select gates 261 of select circuit 241 and select circuits 243, and 245. In another example, select line $281_B$ can be shared by select gates 262 of select circuit 241 and select circuits 243, and 245. A select line (e.g., select line $281_A$, $282_A$, $283_A$, $284_A$, $281_B$, $282_B$, $283_B$, and $284_B$, 281', 282', 283', and 284') can carry a signal (e.g., signal $SGD_A$, $SGD_B$, or SGS) but it does not operate like a switch (e.g., a transistor). A select gate (e.g., select gate 261, 262, or 263) can receive a signal from a respective select line and can operate like a switch (e.g., a transistor).

In order to focus on the embodiments discussed herein, the description below with reference to FIG. 2C through FIG. 2G focuses on four memory cell strings 231, 232, 237, and 238, select circuits 241, 242, 247, 248, 241', 242'. 247', and 248'. Other memory cell strings and select circuits of memory device 200 have similar structures and connections.

Figure 2C:
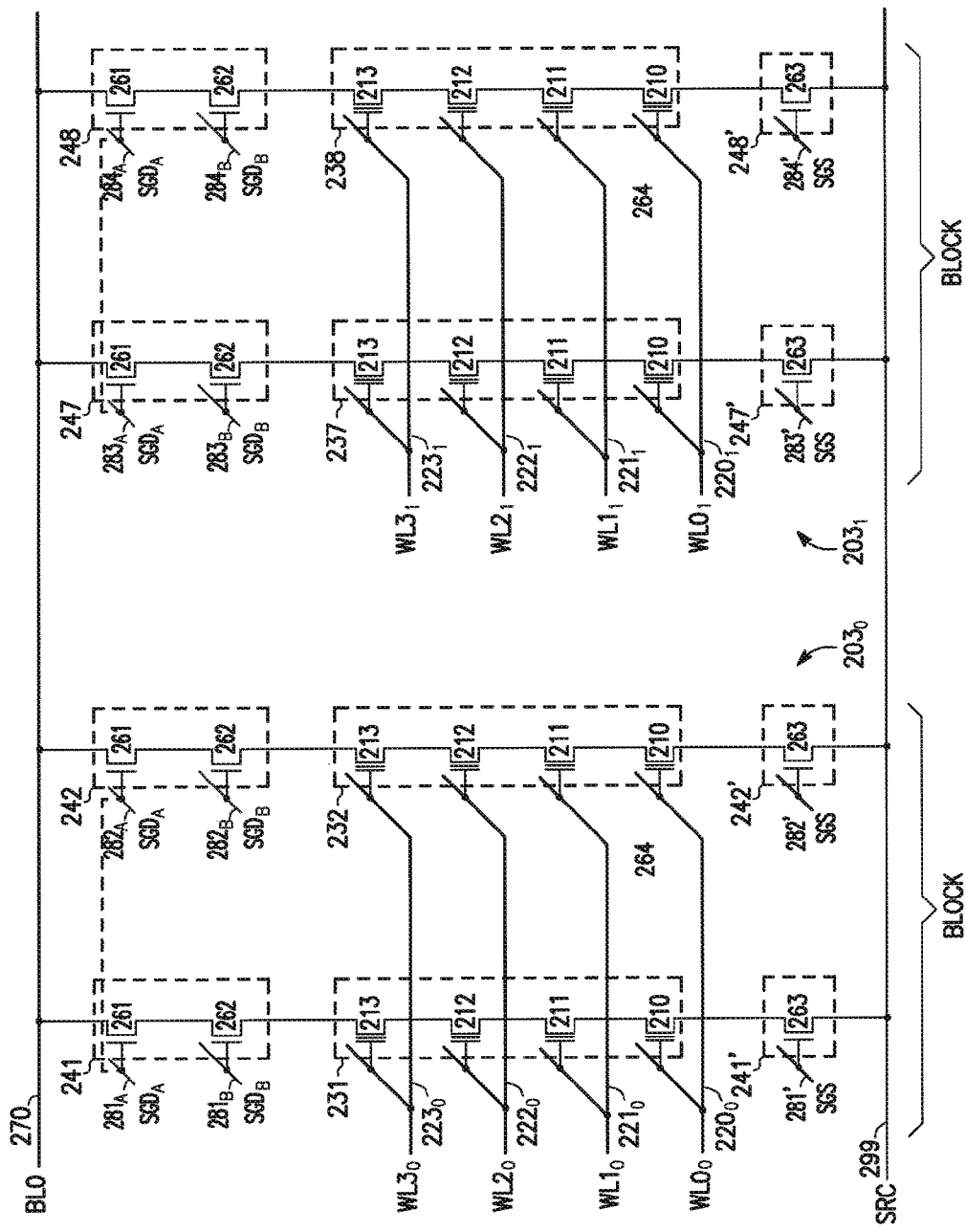
FIG. 2C shows a schematic diagram of a portion of the memory device of FIG. 2B, according to some embodiments described herein.

FIG. 2C shows a schematic diagram of a portion of memory device 200 of FIG. 2B including memory cell strings 231, 232, 237, and 238 and select circuits 241, 242, 247, 248, 241', 242', 247', and 248' Coupled between line 270 and line 299, according to some embodiments described herein. As shown in FIG. 2C, select gates (e.g., double drain select gates) 261 and 262 of each of select circuits 241, 242, 247, and 248 can be coupled in series between line 270 and a respective memory cell string among memory cell strings 231, 232, 237, and 238. Select gate 263 of each of select circuits 241', 242', 247', and 248' can be coupled between line 299 and a respective memory cell string among memory cell strings 231, 232, 237, and 238.

Select gate 261 of select circuit 241 has a terminal (e.g., a transistor gate) that can be part of (e.g., formed by a portion of) select line $281_A$. Select gate 262 of select circuit 241 has a terminal (e.g., a transistor gate) that can be part of (e.g., formed by a portion of) select line $281_B$. Select gates 261 and 262 of select circuit 241 can be controlled (e.g., turned on or turned off) by signals $SGD_A$ and $SGD_B$ provided to select lines $281_A$ and $281_B$, respectively. Select gate 263 of select circuit 241' has a terminal (e.g., a transistor gate) that can be part of (e.g., formed by a portion of) select line 281'. Select gate 263 of select circuit 241' can be controlled (e.g., turned on or turned off) by signal SGS provided to select lines 281'.

Similarly, as shown in FIG. 2C, select gates 261 and 262 of each of select circuits 242, 247, and 248 also have terminals (transistor gates) that can be parts of (e.g., formed by portions of) respective select lines among select lines $282_A$, $283_A$, $284_A$, $282_B$, $283_B$, and $284_B$. Select gate 263 of each select circuits 242', 247', and 248' also has a terminal (transistor gate) that can be part of (e.g., formed by a portion of) a respective select line among select line 282', 283', and 284'.

During an operation (e.g., a read or write operation) of memory device 200, select gates 261, 262, and 263 of particular select circuits associated with a selected memory cell string can be activated (e.g., turned on) to couple the selected memory cell string to a respective data line and the source. For example, in FIG. 2C, during a write operation of memory device 200, if memory cell string 231 is a selected memory cell string, then select gates 261 and 262 of select circuit 241 can be activated to couple memory cell string 231 to line 270; select gate 263 of select circuit 241' may not be activated. In another example, in FIG. 2C, during a read operation of memory device 200, if memory cell string 231 is a selected memory cell string, then select gates 261 and 262 of select circuit 241 can be activated to couple memory cell string 231 to line 270; select gate 263 of select circuit 241' can also be activated to couple memory cell string 231 to line 270 and line 299. In these two examples here, while memory cell string 231 is selected, memory cell strings 232, 237, and 238 are deselected. Thus, select gates 261, 262, and 263 in select circuits 242, 247, 248, 242', 247', and 248' (associated with memory cell strings 232, 237, and 238) can be deactivated (e.g., turned off) to decouple memory cell strings 232, 237, and 238 (deselected memory cell strings) from line 270 and line 299.

FIG. 2D is a chart 200D showing example values of voltages provided to signals BL, $SGD_A$, $SGD_B$, WL selected, WL unselected, SGS, and SRC during read, write, and erase operations of memory device 200, according to some embodiments described herein. As shown in FIG. 2D, in each of the read, write, and erase operations, the signals in chart 200D can be provided with voltages having different values (in volt unit), depending upon which block (selected or unselected block) and which memory cell string (selected or unselected string) the signals are used.

In FIG. 2D, signal BL refers to the signal on a data line (e.g., one of signals BL0, BL1, and BL2 FIG. 2B) associated with a selected memory cell. Signal WL selected refers to the signal on a control line of a selected block that is associated with a selected memory cell. Signal WL deselected refers to the signal on a control line of a selected block that is not associated with a selected memory cell. For example, if block $203_0$ (FIG. 2C) is a selected block, and memory cell 212 of memory cell string 231 is a selected memory cell, then WL selected refers to signal $WL2_0$ and WL deselected refers each of signals $WL0_0$, $WL1_0$, and $WL3_0$.

During a read or write operation, memory cell strings (e.g., strings 231, 232, 237, and 238 in FIG. 2C) associated the same data line (e.g., line 270) can be selected one at a time (e.g., sequentially selected). During an erase operation, memory cell strings in the entire selected block can be concurrently placed in the same bias condition (e.g., biased using voltages of the same value) to erase information from the memory cell strings of the selected block.

In the example read, write, and erase operations of memory device 200 (FIG. 2C) described below, the following assumptions are made. Block $203_0$ is a selected block. Block $203_1$ is a deselected block. Thus, all memory cell strings of block $203_1$ are deselected memory cell strings of a deselected block. Memory cell string 231 of block $203_0$ (selected block) is a selected memory cell string. Memory cell 212 of memory cell string 231 (selected memory cell string) is a selected memory cell. Memory cell string 232 of block $203_0$ (selected block) is a deselected memory cell string of a selected block. In this example, control line $222_0$ is a selected control line (associated with WL selected signal) because memory cell 212 of memory cell string 231 is a selected memory cell. Control lines $220_0$, $221_0$, and $223_0$ are deselected control lines (associated with WL deselected signal) because memory cells 210, 211, and 213 of memory cell string 231 are not selected (deselected) memory cells. In this example, control lines $220_1$, $221_1$, $222_1$, and $223_1$ of block $203_1$ (deselected block) can be provided with voltages having the same values.

The following descriptions of example read, write, and erase operations focus on the values of voltages provided to signals $SGD_A$ and $SGD_B$ (FIG. 2C) of block $203_0$ (selected block) and block $203_1$ (deselected block). Other signals of memory device 200 (e.g., BL, WL selected, WL deselected, SGS, and SRC) can be provided with voltages having example values shown in FIG. 2D, which are not described in detail in the following description to help focus on the description herein.

During a read operation of memory device 200 (FIG. 2C) for a selected block (e.g., block $203_0$), based on the above assumptions and as shown in chart 200D of FIG. 2D, signals $SGD_A$ and $SGD_B$ associated with a selected string of the selected block can be provided (e.g., bias) with voltages having the same value, such as $SGD_A=V1=5V$ and $SGD_B=5V$. Thus, in this example, select lines $281_A$ and $281_B$ (FIG. 2C) associated with memory cell string 231 (selected string) can be provided with voltages having the same value of 5V. Hence, select gates 261 and 262 of select circuit 241 can receive voltages having the same value of 5V. In a read operation, signals $SGD_A$ and $SGD_B$ associated with a deselected string of the selected block can be provided with voltages having different values, such as $SGD_A=V1=5V$ and $SGD_B=V2=0V$. Thus, in this example, select lines $282_A$ and $282_B$ associated with memory cell string 232 (deselected string) can be provided with voltages having values of 5V and 0V, respectively. Hence, select gates 261 and 262 of select circuit 242 can receive voltages of 5V and 0V, respectively.

During a read operation of memory device 200 (FIG. 2C) for a deselected block (e.g., block $203_1$), based on the above assumptions and as shown in chart 200D of FIG. 2D, signals $SGD_A$ and $SGD_B$ associated with all strings (e.g., string 237 and 238) of the deselected block can be provided (e.g., bias) with voltages having different values, such as $SGD_A=V3=0.5V$ and $SGD_B=V4=0V$. Thus, in this example, in block $203k$ (deselected block), each of select lines $283_A$ and $284_A$ can be provided with a voltage having a value of 0.5V; and each of select lines $283_B$ and $284_B$ can be provided with a voltage having a value of 0V. Hence, each of select gates 261 of select circuits 247 and 248 can receive a voltage having a value of 0.5V; and each of select gates 262 of select circuits 247 and 248 can receive a voltage having a value of 0V.

During a write operation of memory device 200 (FIG. 2C) for a selected block (e.g., block $203_0$), based on the above assumptions and as shown in chart 200D of FIG. 2D, signals $SGD_A$ and $SGD_B$ associated with a selected string can be provided (e.g., bias) with voltages having the same value, such as $SGD_A=V5=3V$ and $SGD_B=3V$. Thus, in this example, select lines $281_A$ and $281_B$ (FIG. 2C) associated with memory cell string 231 (selected string) can be provided with voltages having the same value of 3V. Hence, select gates 261 and 262 of select circuit 241 can receive voltages having the same value of 3V. In a write operation, signals $SGD_A$ and $SGD_B$ associated with a deselected string can be provided with voltages having different values, such as $SGD_A=V5=3V$ and $SGD_B=V6=0V$. Thus, in this example, select lines $282_A$ and $282_B$ associated with memory cell string 232 (deselected string) can be provided with voltages having values of 3V and 0V, respectively. Hence, select gates 261 and 262 of select circuit 242 can receive voltages of 3V and 0V, respectively.

During a write operation of memory device 200 (FIG. 2C) for a deselected block (e.g., block $203_1$), based on the above assumptions and as shown in chart 200D of FIG. 2D, signals $SGD_A$ and $SGD_B$ associated with all strings of block $203_1$ can be provided (e.g., bias) with voltages having different values such as $SGD_A=V7=2.3V$ and $SGD_B=V8=0V$. Thus, in this example, in block $203_1$ (deselected block), each of select lines $283_A$ and $284_A$ can be provided with a voltage having a value of 2.3V; and each of select lines $283_B$ and $284_B$ can be provided with a voltage having a value of 0V. Hence, each of select gates 261 of select circuits 247 and 248 can receive a voltage having a value of 2.3V; and each of select gates 262 of select circuits 247 and 248 can receive a voltage having a value of 0V.

During an erase operation of memory device 200 (FIG. 2C) for a selected block, based on the above assumptions and as shown in chart 200D of FIG. 2D, signals $SGD_A$ and $SGD_B$ associated with a selected string and a deselected string can be provided with voltages having different values, such as $SGD_A=V9=10V$ and $SGD_B=V10=14V$, or alternatively, $SGD_A=V9=14V$ and $SGD_B=V10=10V$. Thus, in this example, in block $203_0$, select lines $281_A$ and $282_A$ (FIG. 2C) can be provided with voltages having values of 10V; and select lines $281_B$ and $282_B$ can be provided with voltages having values of 14V. Hence, select gates 261 of select circuits 241 and 242 can receive voltages having values of 10V; and select gates 262 of select circuits 241 and 242 can receive voltages having values of 14V. Alternatively, in an erase operation, select lines $281_A$ and $282_A$ associated with memory cell string 231 (selected string) and memory cell string 232 (deselected string) can be provided with voltages having values of 14V; and select lines $281_B$ and $282_B$ can be provided with voltages having values of 10V. Hence, select gates 261 of select circuits 241 and 242 can receive voltages having values of 14V, and select gates 262 of select circuits 241 and 242 can receive voltages having values of 10V. Memory device 200 (FIG. 2A through FIG. 2C) may include dummy memory cells. In FIG. 2D, in erase operation portion, "5V-10V (DUMMY)" indicates a range of voltages (approximately 5V to 10V) that can be applied to the control lines (e.g., dummy word lines) of the dummy memory cells.

During an erase operation of memory device 200 (FIG. 2C) for a deselected block, based on the above assumptions and as shown in chart 200D of FIG. 2D, select lines $283_A$, $283_B$, $284_A$, and $284_B$ (FIG. 2C) of block $203_1$ (deselected block) may be placed in a "float" state (shown as "F" or "FLOAT" in FIG. 2D). In the float state, the voltages on select lines $283_A$, $283_B$, $284_A$, and $284_B$ may have values proportional to the value of the voltage (e.g., a value of approximately 20V of an erase voltage (e.g., Verase)) provided to signal BL (e.g., signal BL0 in this example). Hence, select gates 261 of select circuits 247 and 248 of block $203_1$ (deselected block) can be placed in the float state in an erase operation.

The example read, write, and erase operation described above assumes that block $203_0$ is a selected block and block $203_1$ is a deselected block. However, if block $203_0$ is assumed to be a deselected block, then select lines $281_A$ and $281_B$ can be provided with voltages used for a deselected block described above. For example, if block $203_0$ is a deselected block, based on chart 200D (FIG. 2D), select lines 281₁A and 281$_B$ can be provided with voltages having values of V3=0.5V and V4=0V, respectively, during a read operation, or voltages having values of V7=2.3V and V8=0V, respectively, during a write operation, or be placed in a float state with voltages having values of up to the value of the voltage provide to signal BL (e.g., signal BL0).

FIG. 2E is a chart 200E showing example values of voltages provided to signals BL, SGD$_A$, SGD$_B$, WL selected, WL unselected, SGS, and SRC of memory device 200 during read, write, and erase operations of memory device 200 when signal SGD$_A$ associated with select line 281$_A$ and signal SGD$_A$ associated with select line 282$_A$ can be separate signals (e.g., not shared) in a variation of memory device 200, according to some embodiments described herein. Chart 200E can be a variation of chart 200D of FIG. 2D. In chart 200D, signals SGD$_A$ associated with select line 281$_A$ and signal SGD$_A$ associated with select line 282$_A$ can be a shared signal (e.g., the same signal). In chart 200E, signals associated with select lines 281$_A$ and 282$_A$ are separate signals. Thus, in chart 200E, voltages of different values can be provide to signals SGD$_A$ associated with select line 281$_A$ and signal SGD$_A$ associated with select line 282$_A$ of a deselected string of a selected block.

For example, during a read operation of memory device 200 for a selected block (e.g., block 203$_0$), based on the above assumptions and as shown in chart 200E of FIG. 2E, signal SGD$_A$ associated with select line 282$_A$ of memory cell string 232 (deselected string) can be provided with voltages having values of either V1=0V or V1=0.5V (instead of 5V as in chart 200D). This means that in a variation of memory device 200 where select line 281$_A$ is uncoupled to select line 282$_A$ during a read operation, select gates 261 and 262 of select circuits 241 and 242 in FIG. 2B can receive voltages of different values of either 5V and 0V or 5V and 0.5V, respectively.

During a write operation of memory device 200, signal SGD$_A$ associated with select line 282$_A$ of memory cell string 232 (deselected string) can be provided with voltages having a value of either V5=0V or V5=2.3V (instead of 3V as in chart 200D). Hence, select gates 261 of select circuits 241 and 242 in FIG. 2B (when select line 281$_A$ is uncoupled to select line 282$_A$) can receive voltages of different values of either 3V and 0V, respectively, or 3V and 2.3V, respectively. In an erase operation of memory device 200, the values of voltages provided to the signals of memory device 200 based on charts 200E can be the same as those based on chart 300E.

Using the biasing techniques based on chart 200D and chart 200E may improve operation of memory device 200 during read, write, and erase operations. Description of such improvements is described in below after the description of FIG. 2F through FIG. 2M.

Figure 2F:
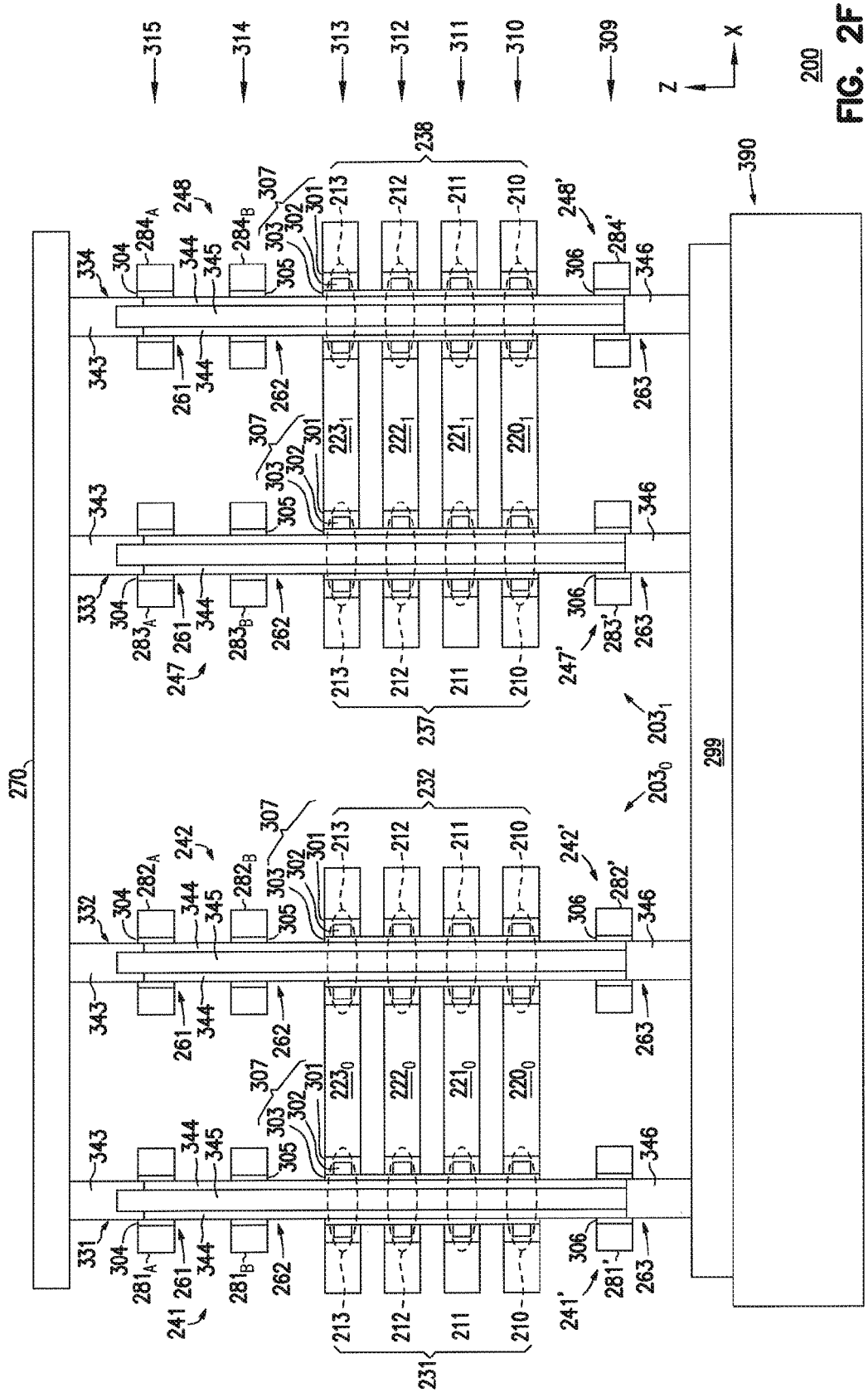
FIG. 2F shows a side view of a structure of a portion of the memory device of FIG. 2A through FIG. 2C, according to some embodiments described herein.

FIG. 2F shows a side view of a structure of a portion of memory device 200, according to some embodiments described herein. The structure of memory device 200 in FIG. 2F corresponds to the schematic diagram of memory device 200 shown in FIG. 2C. As shown in FIG. 2F, memory device 200 can include a substrate 390 over which memory cells 210, 211, 212, and 213 of memory cell strings 231 and 232 (of block 203$_0$) and memory cell strings 237 and 238 (of block 203$_1$) can be formed (e.g., formed vertically with respect to substrate 390). Memory device 200 includes different levels 309 through 315 (e.g., internal device levels between substrate and line 270) with respect to a z-dimension. Memory cells 210, 211, 212, and 213 can be located in levels 310, 311, 312, and 313, respectively (e.g., arranged vertically in the z-dimension with respect to substrate 390).

Select gates 261, 262, and 263 of select circuits 241, 241', 242, and 242' (of block 203$_0$) and select circuits 247, 247', 248, and 248' (of block 203$_1$) can also be formed (e.g., formed vertically) over substrate 390.

Memory device 200 can include pillars 331, 332, 333, and 334 having lengths extending outwardly (e.g., vertically) from substrate 390 in a z-dimension of memory device 200. The select lines (e.g., upper and lower drain select lines and source select lines) associated with memory cell strings 231, 232, 237, and 238 can be located along a respective pillar in the z-dimension as shown in FIG. 2F. For example, select lines 281$_A$, 281$_B$, and 281' associated with memory cell string 231 can be located in along pillar 331 in a z-dimension.

Figure 2G:
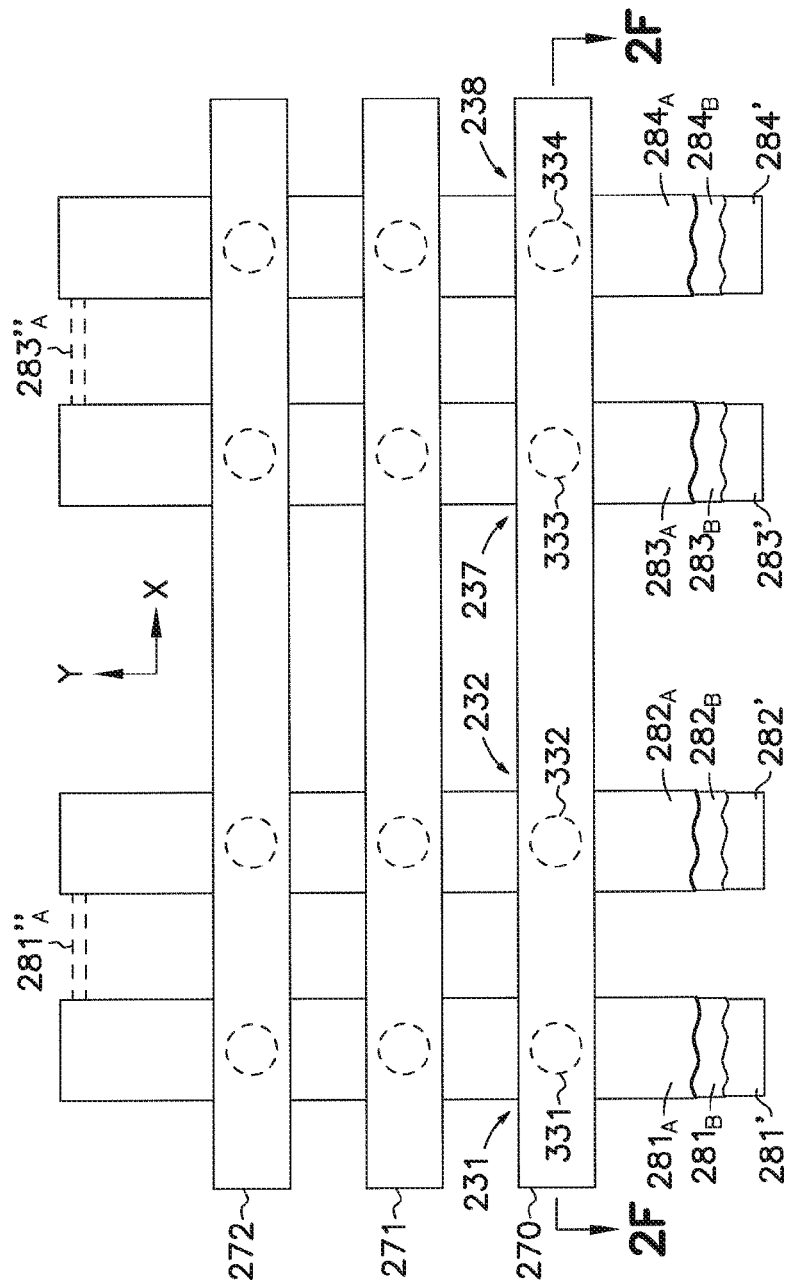
FIG. 2G shows a top view of the structure of the portion of the memory device of FIG. 2F, according to some embodiments described herein.

FIG. 2G shows a top view of a structure of a portion of memory device 200 of FIG. 2F, according to some embodiments described herein. As shown in FIG. 2G, lines 270, 271, and 272 (e.g., regions of conductive materials of respective lines 270, 271, and 272) can have their lengths extending in the x-dimension, which is perpendicular to the y-dimension. As shown in a cut-away view in FIG. 2G, select lines 281', 282', 283', and 284' have lengths extending in the y-dimension and are underneath (with respect to the z-dimension) select lines 281$_B$, 282$_B$, 283$_B$, and 284$_B$, respectively. Select lines 281$_B$, 282$_B$, 283$_B$, and 284$_B$ have lengths extending in the y-dimension and are underneath select lines 281$_A$, 282$_A$, 283$_A$, and 284$_A$, respectively. Select lines 281$_A$, 282$_A$, 283$_A$, and 284$_A$ have lengths extending in the y-dimension and are underneath lines 270, 271, and 272. FIG. 2G also show pillars 331, 332, 333, and 334 (which contacts the underside of line 270) and memory cell strings 231, 232, 237, and 238 at locations relative to the locations of pillars 331, 332, 333, and 334. Other pillars (dashed circles) of memory device 200 are not labeled. The side view (e.g., cross-sectional view) of memory device 200 in FIG. 2F is taken along section label 2F-2F of FIG. 2G.

Referring to FIG. 2F, substrate 390 of memory device 200 can include monocrystalline (also referred to as single-crystal) semiconductor material. For example, substrate 390 can include monocrystalline silicon (also referred to as single-crystal silicon). The monocrystalline semiconductor material of substrate 390 can include impurities, such that substrate 390 can have a specific conductivity type (e.g., n-type or p-type). Although not shown in FIG. 2F, substrate 390 can include circuitry that can be located directly under line 299 and pillars 331, 332, 333, and 334. Such circuitry can include buffers (e.g., page buffers), decoders, and other circuit components of memory device 200.

As shown in FIG. 2F, line 270 (e.g., a data line that includes a region of conductive material) can have a length extending in the x-dimension, which is perpendicular to a z-dimension. Line 299 can have a length extending in the x-dimension. FIG. 2F shows an example where line 299 (e.g., source) can be formed over (e.g., by depositing a conductive material) a portion of substrate 390. Alternatively, line 299 can be formed in or formed on a portion of substrate 390 (e.g., by doping a portion of substrate 390).

Each of pillars 331, 332, 333, and 334 can include a portion 343 coupled to line 270, a portion 346 coupled to line 299, a portion 344 between portions 343 and 346, and a portion 345 surrounded by portions 343, 344, and 346. Thus, each of pillars 331, 332, 333, and 334 is a pillar of materials that includes materials of respective portions 343, 344, 345, and 346. Each of portions 343, 344, and 346 can include conductive material (e.g., doped polycrystalline silicon (doped polysilicon)). Portion 345 (e.g., a filler) can include dielectric material (e.g., an oxide of silicon, such as silicon dioxide). FIG. 2F shows an example of where each of pillars 331, 332, 333, and 334 includes portion 345 (e.g., dielectric material). Alternatively, portion 345 can be omitted, such that the material of portion 344 may also occupy the space occupied by portion 345.

Portions 343 and 346 can include materials of the same conductivity type. Portion 344 can include a material having a different conductivity type from that of portions 343 and 346. For example, portions 343 and 346 can include a semiconductor material of n-type (e.g., n-type polycrystalline silicon), and portion 344 can include a semiconductor material of p-type (e.g., p-type polycrystalline silicon). Alternatively, portions 343, 344, and 346 can include materials of the same conductivity type (e.g., n-type polycrystalline silicon).

Portion 344 and at least part of each of portions 343 and 346 can form a conductive channel in a respective pillar among pillars 331, 332, 333, and 334. The conductive channel can carry current (e.g., current between line 270 (e.g., data line) and line 299 (e.g., source) during an operation (e.g., read, write, or erase) of memory device 200. FIG. 2F shows an example where part of portion 343 can extend from line 270 to a location in a respective pillar at approximately the level 315. However, part of portion 343 can extend from line 270 to any location in a respective pillar between level 313 and 315.

Memory cells 210, 211, 212, and 213 of memory cell string 231 can be located along a segment of pillar 331 (e.g., the segment of pillar 331 extending from level 310 to level 313). In a similar structure, memory cells 210, 211, 212, and 213 of memory cell strings 232, 237, and 238 can be located along a segment of a respective pillar among pillars 332, 333, and 334, as shown in FIG. 2F.

Control lines $220_0$, $221_0$, $222_0$, $223_0$ (of block $203_0$) and $220_1$, $221_1$, $222_1$, and $223_1$ (of block $203_1$) associated with respective memory cells 210, 211, 212, and 213 can also be located in levels 310, 311, 312, and 313, respectively, along a segment (e.g., the segment of extending from level 310 to level 313) of a respective pillar among pillars 332, 333, and 334, as shown in FIG. 2F. The materials of control lines $220_0$, $221_0$, $222_0$, $223_0$ (of block $203_0$) and $220_1$, $221_1$, $222_1$, and $223_1$ (of block $203_1$) can include a conductive material (e.g., conductively doped polycrystalline silicon of n-type, metals, or other conductive materials). Thus, as shown in FIG. 2F, control lines $220_0$, $221_0$, $222_0$, $223_0$ (of block $203_0$) can include respective conductive materials (a plurality of conductive materials) located along segments of pillars 331 and 332; and control lines $220_1$, $221_1$, $222_1$, $223_1$ (of block $203_1$) can include respective conductive materials (a plurality of conductive materials) located along segments of pillars 333 and 334.

Select line $281_A$ (which includes a portion of select gate 261) can be located in level 315 along a segment of pillar 331 (e.g., the segment of pillar 331 on level 315). Select line 281 (which includes a portion of select gate 262) can be located in level 314 along a segment of pillar 331 (e.g., the segment of pillar 331 on level 314). Select line 281' (which includes a portion of select gate 263) can be located in level 309 along a segment of pillar 331 (e.g., the segment of pillar 331 on level 309).

In a similar structure, select lines $282_A$, $283_A$, and $284_A$ can be located in level 315 along a segment (e.g., the segment in level 315) of a respective pillar among pillars 332, 333, and 334. Select lines $282_B$, $283_B$, and $284_B$ can be located in level 314 along a segment (e.g., the segment in level 314) of a respective pillar among pillars 332, 333, and 334. Select lines 282', 283', and 284' can be located in level 309 along a segment (e.g., the segment in level 309) of a respective pillar among pillars 332, 333, and 334.

The select lines on the same level (e.g., select lines $281_A$, $282_A$, $283_A$, and $284_A$ on level 315) can have the same material. The select lines on different levels can have the same material or different materials. The materials for the select lines of memory device 200 can include conductively doped polycrystalline silicon (e.g., either n-type or p-type), metals, or other conductive materials.

As shown in FIG. 2F, each of memory cells 210, 211, 212, and 213 can include a structure 307, which includes portions 301, 302, and 303 between a respective pillar and a control line. For example, memory cell 213 of memory cell string 231 includes a structure 307 (which includes portions 301, 302, and 303) between pillar 331 and control line $223_0$. Portion 301 can include a charge blocking material or materials (e.g., a dielectric material such as silicon nitride) that is capable of blocking a tunneling of a charge. Portion 302 can include a charge storage element (e.g., charge storage material or materials) that can provide a charge storage function to represent a value of information stored in memory cell 210, 211, 212, or 213. For example, portion 302 can include polycrystalline silicon, which can operate as a floating gate (e.g., to store charge) in a memory cell (e.g., a memory cell 210, 211, 212, or 213). In this example, each of memory cells 210, 211, 212, and 213 has a floating-gate memory cell structure. Alternatively, portion 302 can include a charge trapping material (e.g., silicon nitride) that can operate to trap charge in a memory cell (e.g., a memory cell 210, 211, 212, or 213). In this example, each of memory cells 210, 211, 212, and 213 has a charge-trap memory cell structure. Portion 303 can include a tunnel dielectric material or materials (e.g., an oxide of silicon) that is capable of allowing tunneling of a charge (e.g., electrons). For example, portion 303 can allow tunneling of electrons from portion 344 (e.g., conductive channel) to portion 302 during a write operation and tunneling of electrons from portion 302 to portion 344 during an erase operation of memory device 200.

In FIG. 2F, each of select gates 261 can include a structure 304 between a respective select line and a respective pillar. For example, select gate 261 of select circuit 241 includes structure 304 between select line $281_A$ and pillar 331.

Each of select gates 262 can include a structure 305 between a respective select line and a respective pillar. For example, select gate 262 of select circuit 241 includes structure 305 between select line $281_B$ and pillar 331.

Each of select gates 263 can include a structure 306 between a respective select line and a respective pillar. For example, select gate 263 of select circuit 241' includes structure 306 between select line 281' and pillar 331.

Structures 304, 305, and 306 can be similar or the same material (or materials). For example, each of select gates 261, 262, and 263 can have a structure similar to a FET structure. An example of an FET includes a metal-oxide semiconductor (MOS) transistor. As is known to those skilled in the art, a FET usually includes a transistor gate, a channel, and a gate oxide between the transistor gate and the channel and can be in direct contact with the transistor gate and the channel. A FET does not have a charge storage element (e.g., a floating gate) that provides a charge storage function. Thus, each of structures 304, 305, and 306 may not include a charge storage element that provides a charge storage function. Therefore, unlike memory cells 210, 211, 212, and 213, each of select gates 261, 262, and 263 may not include a charge storage element that provides a charge storage function. For example, each of structures 304, 305, and 306 can include only a dielectric material (e.g., includes only an oxide of silicon without a charge storage element).

Thus, as described above, shown in FIG. 2F and FIG. 2G, a select line (e.g., select line $281_A$, $282_A$, $283_A$, $284_A$, $281_B$, $282_B$, $283_B$, and $284_B$, 281', 282', 283', and 284') is a piece (e.g., a line) of conductive material. The conductive material can be a piece of polycrystalline silicon, silicide, metal, or any combination of these materials, or other conductive materials. As described above, a select line can carry a signal (e.g., signal $SGD_A$, $SGD_B$, or SGS) but it does not operate like a switch (e.g., a transistor). A select gate (e.g., select gate 261, 262, or 263) can include a portion of a select line (e.g., a portion of the piece of the conductive material that formed the select line) and additional structures to perform a function (e.g., function of a transistor). For example, in select circuit 241 in FIG. 2F, select gate 261 can include a portion of select line $281_A$ and a structure 304; and select gate 262 can include a portion of select line 281s and a structure 305.

FIG. 2H shows details of a portion of memory device 200 of FIG. 2F including structures 304, 305, 306, and 307, according to some embodiments described herein. For simplicity, only structures 304, 305, 306, and 307 and part of select line $281_A$, select line $281_B$, and select line 281', control line $223_0$, memory cell 213, and select gates 261, 262, and 263 of memory device are shown in FIG. 2H.

As shown in FIG. 2H, select line $281_A$, select line $281_B$, control line $223_0$, and select line 281' can be located along segments 351, 352, 353, and 354, respectively, of pillar 331. Pillar 331 includes a sidewall (e.g., a vertical sidewall) 339. Sidewall 339 can be the sidewall of the conductive channel formed by portion 344.

Select line $281_A$ includes a sidewall $381_A$ (e.g., a vertical sidewall of the conductive material of select line $281_A$) facing sidewall 399 of pillar 331. Sidewall $381_A$ can be located at a distance D1 from a portion of pillar 331. Distance D1 can be measured straight across structure 304 from sidewall $381_A$ to a respective portion of sidewall 339 of pillar 331, such that distance D1 can be the shortest distance between sidewalls $381_A$ and 339.

Select line $281_B$ includes a sidewall $381_B$ (e.g., a vertical sidewall of the conductive material of select line $281_B$) facing sidewall 399 of pillar 331. Sidewall $381_B$ can be located at a distance D2 from a portion of pillar 331. Distance D2 can be measured straight across structure 305 from sidewall $381_B$ to a respective portion of sidewall 339 of pillar 331, such that distance D2 can be the shortest distance between sidewalls $381_B$ and 339.

Control line $223_0$ includes a sidewall 323 (e.g., a vertical sidewall of the conductive material control line $223_0$) facing sidewall 399 of pillar 331. Sidewall 323 can be located at a distance D3 from a portion of pillar 331. Distance D3 can be measured straight across structure 307 from sidewall 323 to a respective portion of sidewall 339 of pillar 331, such that distance D3 can be the shortest distance between sidewalls 323 and 339.

Select line 281' includes a sidewall 381' (e.g., a vertical sidewall of the conductive material of select line 281') facing sidewall 399 of pillar 331. Sidewall 381' can be located at a distance D4 from a portion of pillar 331. Distance D4 can be measured straight across structure 306 from sidewall 381' to a respective portion of sidewall 339 of pillar 331, such that distance D4 can be the shortest distance between sidewalls 381' and 339.

Distances D1, D2, and D4 can be the same. For example, select lines $281_A$, $281_B$, and 281' can be formed to have a similar or the same structure that may result in distances D1, D2, and D4 to be the same among each other. Each of select lines $281_A$, $281_B$, and 281' and memory cells 210, 211, 212, and 213 can be formed to have different structures. For example, as shown in FIG. 2H, memory cell 213 can be formed to include a charge storage element included in portion 302. This may cause distance D3 to be greater than each of distances D1, D2, and D4.

As shown in FIG. 2H, structure 304 can extend from sidewall $381_A$ of select line $281_A$ to sidewall 339 of pillar 331. Structure 305 can extend from sidewall $381_B$ of select line $281_B$ to sidewall 339 of pillar 331. Structure 307 can extend from sidewall 323 of control line $223_0$ to sidewall 339 of pillar 331. Structure 306 can extend from sidewall 381' of select line 281' to sidewall 339 of pillar 331.

As shown in FIG. 2H, select line $281_A$, select line $281_B$, control line $223_0$, and select line 281' have thickness T1, T2, T3, and T4, respectively. Thickness T1, T2, T3, and T4 can be the same or different. For example, thickness T1, T2, and T4 can be the same but can be different from (e.g., greater than) thickness T3.

The following description with reference to FIG. 2I through FIG. 2M describes variations of memory device 200 including variations in distances between pillar 331 and respective sidewalls of select lines $281_A$, $281_B$, 281', control line $223_0$, variations in structures 304, 305, 306, and 307, and variations in at least some of thicknesses T1, T2, T3, and T4. For simplicity, structures 304, 305, 306, and 307 in FIG. 2I through FIG. 2M are shown in dashed lines and their description are not described in detail.

FIG. 2I shows a variation of the portion of memory device 200 of FIG. 2H including sidewall $381_B$ located at distance D5 that is greater than distance D2 of FIG. 2H, according to some embodiments described herein. As shown in FIG. 2I, since distance D5 is greater than distance D2 (FIG. 2H), structure 305 in FIG. 2I can also be different from (e.g., wider than) structure 305 of FIG. 2H. Structure 305 in FIG. 2I can also include materials different from the materials of structure 305 of FIG. 2I-H. For example, structure 305 can include portions and materials similar to those of portions 301, 302, and 303 of structure 307 of memory cell 213. In this example, structure 305 in FIG. 2I may be formed when structure 307 of memory cell 213 is formed (formed concurrently with structure 307). Thus, in the variation of memory device 200 of FIG. 2I, each of select gates 262 can have a memory cell-type structure like memory cell 213. The memory cell-type structure of select gate 262 allows it to be electrically programmed in order to adjust the threshold voltage of select gate 262.

FIG. 2J shows a variation of the portion of memory device 200 of FIG. 2I including sidewall $381_A$ located at distance D6 that is greater than distance D1 of FIG. 2I, according to some embodiments described herein. Structure 304 in FIG. 2J can include materials similar to those of structure 305. Structure 304 may be formed concurrently with structure 305 or, alternatively, concurrently with both structures 305 and 307. In this example, structure 304 can include portions and materials similar to those of portions 301, 302, and 303 of structure 307 of FIG. 2H. Thus, in the variation of memory device 200 of FIG. 2J, each of select gates 261 and 262 can have a memory cell-type structure like memory cell 213. The memory cell-type structure of select gate 261 allows it to be electrically programmed in order to adjust the threshold voltage of select gate 261.

FIG. 2K shows a variation of the portion of memory device 200 of FIG. 2H including sidewall 381' of select line 281' located at distance D7 that is greater than distance D4 of FIG. 2H, according to some embodiments described herein. As shown in FIG. 2K, since distance D7 is greater than distance D4 (FIG. 2H), structure 306 in FIG. 2K can also be different from (e.g., wider than) structure 306 of FIG. 2H. Structure 306 in FIG. 2K can also include materials different from the materials of structure 306 of FIG. 2H. For example, structure 306 can include portions and materials similar to those of portions 301, 302, and 303 of structure 307 of memory cell 213. In this example, structure 306 may be formed when structure 307 of memory cell 213 is formed (formed concurrently with structure 307). Thus, in the variation of memory device 200 in FIG. 2K, each of select gates 263 can have a memory cell-type structure like memory cell 213. Structure 306 with associated distance D7 can be included in any of the variations of memory device 200 shown in FIG. 2H through FIG. 2J. For example, select line 281' and structure 306 (and associated distance D7) of FIG. 2K can replace select line 281' and structure 306 (and associated distance D4) of FIG. 2H, FIG. 2I, and FIG. 2J.

FIG. 2L shows a variation of the portion of memory device 200 of FIG. 2H including select line $281_A$ having a thickness T1' that is greater than each of thicknesses T1, T2, T3, and T4 of FIG. 2H, according to some embodiments described herein. Distance D1' in FIG. 2L can be the same or different from distance D1 of FIG. 2H. As an example, distance D1' can be similar to (e.g., equal to) distance D1 and less than distance D3 (FIG. 2H). Select line $281_A$ having thickness T1' (FIG. 2L) can be included in any of the variations of memory device 200 shown in FIG. 2H through FIG. 2K. For example, select line $281_A$ having thickness T1' can be replace select line $281_A$ of FIG. 2H, FIG. 2I, and FIG. 2J.

The greater thickness of T1' allows more process flexibility during processes of forming portion 343. As described above, portions 343 and 344 may include materials of different conductivity type. For example, portion 343 may include polycrystalline silicon of n-type. Portion 344 may include polycrystalline silicon of p-type. As shown in FIG. 2L, portion 343 may contact (e.g., interface with) portion 344 at a location (e.g., junction) 347 in segment 351 of pillar 331. By forming select line $281_A$ having thickness T1' that is relatively greater than the thickness (e.g., T2) of another select line (e.g., select line $281_B$ immediately next to select line $281_A$), the length (e.g., channel length) of portion 344 at segment 351 (which is proportional to thickness T1') may also extended to be relatively greater than length of portion 344 at segment 352. This greater length may compensate for process variation in forming portion 343. For example, a greater length may allow forming an enough overlap (N+ junction overlap) between portion 343 and select line $281_A$ without extending portion 343 too far towards select line $281_B$. Such an overlap may allow enough gate-induced drain-leakage (GIDL) current to be generated during an erase operation and may keep any GIDL current to be at relatively low amount during read and write operations. The size (value) of thickness T1' can depend on the amount of the overlap. As an example, thickness T1' can be up to 1.5 times thickness T2. In another example, thickness T1' can be between 1.5 times thickness T2 to 2 times thickness T2. In another example, thickness T1' can be more than 2 times thickness T2.

FIG. 2M shows a variation of the portion of memory device 200 of FIG. 2H including select line 281' having a thickness T4' that is greater than thicknesses T1, T2, T3, and T4 of FIG. 2H, according to some embodiments described herein. Distance D4' in FIG. 2M can be the same or different from distance D4 of FIG. 2H. As an example, distance D4' can be similar to (e.g., equal to) distance D4 and less than distance D3 (FIG. 2H). Select line 281' having thickness T4' (FIG. 2M) can be included in any of the variations of memory device 200 shown in FIG. 2H, through FIG. 2L. For example, select line 281' having thickness T4' can replace select line 281' of in FIG. 2H through FIG. 2L.

As described above with reference to FIG. 2A through FIG. 2M, memory device 200 can include double select gates (e.g., double drain select gates) and can be based on techniques shown in charts 200D and 200E. The combination of the double gates and the biasing techniques described above may allow memory device 200 to achieve improvements over some conventional memory devices during read, write, and erase operations. For example, some conventional memory devices may include only one SGD select line between a memory cell string and a data line. In such a conventional memory device, during a read or write operation, a voltage of 0V may be provided to the SGD select line if it is associated with a deselected block. The relatively low voltage (e.g., 0V) used in a conventional memory device may cause a GIDL event to occur near the location between the data line and the SGD select line. It may also increase the coupling capacitance between the data line and the SGD select line. Further, during an erase operation in such a conventional memory device, relatively higher values of voltages are applied to the data line and the SGD select line of a selected block. This may cause a relatively higher electric field stress to occur near the SGD select line.

As is known to those skilled in the art, GIDL current (e.g., too much GIDL current) may sometimes be harmful for a read or write operation in a block of a particular memory device. But GIDL current may sometimes be useful during an erase operation in a block of the particular memory device. The structure of the memory device and the biasing techniques described herein may help reduce or suppress GIDL current (e.g., GIDL current in a deselected block) during a read or write operation of memory device 200. It may also help generate (e.g., increasing) GIDL current (e.g., GIDL current in a selected block) during an erase operation of memory device 200.

For example, as described above with reference to chart 200D (FIG. 2D) and chart 200E (FIG. 2E), select lines $283_A$ and $284_A$ in block $203_1$ (e.g., deselected block) in FIG. 2F can be provided (e.g., applied) with voltages (e.g., V3 or V7) having a relatively higher value (e.g., V3=0.5V>0V during a read operation, or V7=2.3V>0V during a write operation). This higher voltages value may reduce the effective coupling capacitance between line 270 and each of select lines $283_A$ and $284_A$ (FIG. 2F). This may also reduce or suppress GIDL current between line 270 and each of select lines $283_A$ and $284_A$ (e.g., reduce GIDL current near the location between structure 304 and portion 343) during a read or write operation.

Additionally, as described above with reference to chart 200D (FIG. 2D) and chart 200E (FIG. 2E), select lines $283_B$ and $284_B$ in block $203_1$ (e.g., deselected block) in FIG. 2F can be provided (e.g., applied) with voltages (e.g., V4 and V8) having a relatively lower value (e.g., V4=0V<V3=0.5V during a read operation, or V8=0V<V7=2.3V during a write operation). This lower voltage value may reduce subthreshold leakage current that may occur at the location near select lines $283_B$ and $284_B$.

Further, as described above with reference to chart 200D (FIG. 2D) and chart 200E (FIG. 2E), select lines $281_A$ and $282_A$ in block $203_0$ (selected block) can be provided (e.g., applied) with voltages having a value of V9=10V. Since the value of the voltage provided to signal BL (associated with line 270) is 20V, the value of 10V may be sufficient to generate (e.g., to cause) enough GIDL to assist with the erase operation performed on block $203_0$. As mention above with reference to the description of chart 200D (FIG. 2D), the values of the voltages shown in chart 200D are example values. Thus, the value of voltage V9 may be selected to be an alternative value different from 10V (e.g., selected based on the value of the voltage provide to signal BL in chart 200D) as long as such an alternative value can result in enough GIDL being generated during an erase operation of a selected block of memory device 200.

Moreover, as described above with reference to chart 200D (FIG. 2D) and chart 200E (FIG. 2E), select lines $281_B$ and $282_B$ in block $203_0$ (selected block) can be provided (e.g., applied) with voltages having a value of V10=14V during an erase operation. Since the value of the voltage provided to signal BL (associated with line 270) is 20V, the value of 14V can help reduce an electric field stress that may occur near select line $281_B$ (e.g., at a location between select line $281_B$ and pillar 331) and near select line $282_B$ (e.g., at a location between select line $282_B$ and pillar 332) during an erase operation performed on block $203_0$. As also described above, select lines $281_B$ and $282_B$ in block $203_0$ (selected block) can alternatively be provided with voltages having a value of V10=10V. This voltage value may be sufficient (e.g., relative to 5V provided to control line $220_0$) to help reduce an electric field stress that may occur near select line $281_B$ (e.g., at a location between select line $281_B$ and control line $220_0$) during an erase operation performed on block $203_0$.

Thus, as described above with reference to FIG. 2A through FIG. 2M, the structure of memory device 200 and the biasing techniques (e.g., based on chart 200D of FIG. 2D and chart 200E of FIG. 2E) described herein may help reduce or suppress GIDL current in a block (e.g., selected block, deselected block, or both) during a read or write operation of memory device 200. The structure of memory device 200 and the biasing techniques described herein may also help provide enough GIDL current during an erase operation performed on a block of memory device 200.

Figure 3A:
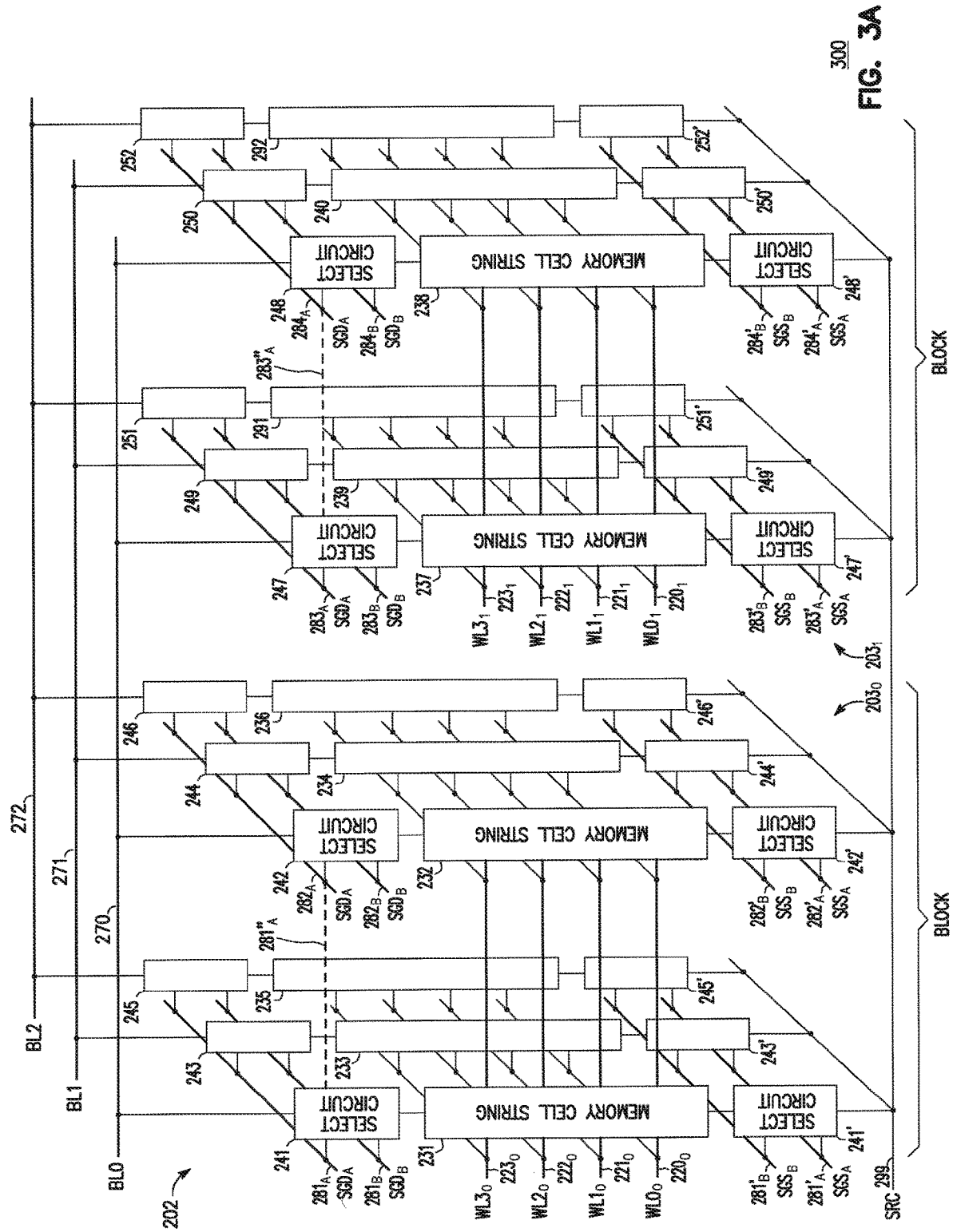
FIG. 3A shows a block diagram of a portion of another memory device including double drain select lines and double source select lines, which can be a variation of the memory device of FIG. 2A, according to some embodiments described herein.

FIG. 3A shows a block diagram of a portion of a memory device 300, which can be a variation of memory device 200, according to some embodiments described herein. Memory device 300 includes elements similar to or identical to those of memory device 200. For simplicity, the description of similar or identical elements (which have the same labels in FIG. 2A and FIG. 3A) between memory devices 200 and 300 is not repeated in the description of FIG. 3A.

As shown in FIG. 3A, memory device 300 can include double (e.g., upper and lower) source select lines, including select lines $281'_A$, $282'_A$, $283'_A$, and $284'_A$ (e.g., upper source select lines) and select lines $281'_B$, $282'_B$, $283'_B$, and $284'_B$. This different from memory device 200 of FIG. 2A where memory device 200 has only one source select line (e.g., 281', 282', 283', and 284') associated with each of select circuits 241' through 252'. In FIG. 3A, select lines $281'_A$, $282'_A$, $283'_A$, and $284'_A$ can correspond to select lines 281', 282', 283', and 284' of FIG. 2A.

In memory device 300 of FIG. 3A, each of select lines $281'_A$, $282'_A$, $283'_A$, and $284'_A$ can carry a separate (e.g., different) signal $SGS_A$. Each of select lines $281'_B$, $282'_B$, $283'_B$, and $284'_B$ can carry a separate (e.g., different) signal $SGS_B$. Each of select circuits 241' through 252' can share two select lines. For example, select circuits 241', 243', and 245' can share select lines $281'_A$ and $281'_B$. Select circuits 242'. 244', and 246' can share select lines $282'_A$ and $282'_B$. Select circuits 247', 249', and 251' can share select lines $283'_A$ and $283'_B$. Select circuits 248', 250', and 252' can share select lines $284'_A$ and $284'_B$. FIG. 3A shows select line $281_A$ being coupled to select lines $282_A$ and select line $283_A$ being coupled to select lines $284_A$. However, similar to memory device 200 of FIG. 2A, select lines $281_A$ and $282_A$ Can be uncoupled from each other, and select lines $283_A$ and $284_A$ can be uncoupled from each other.

Figure 3B:
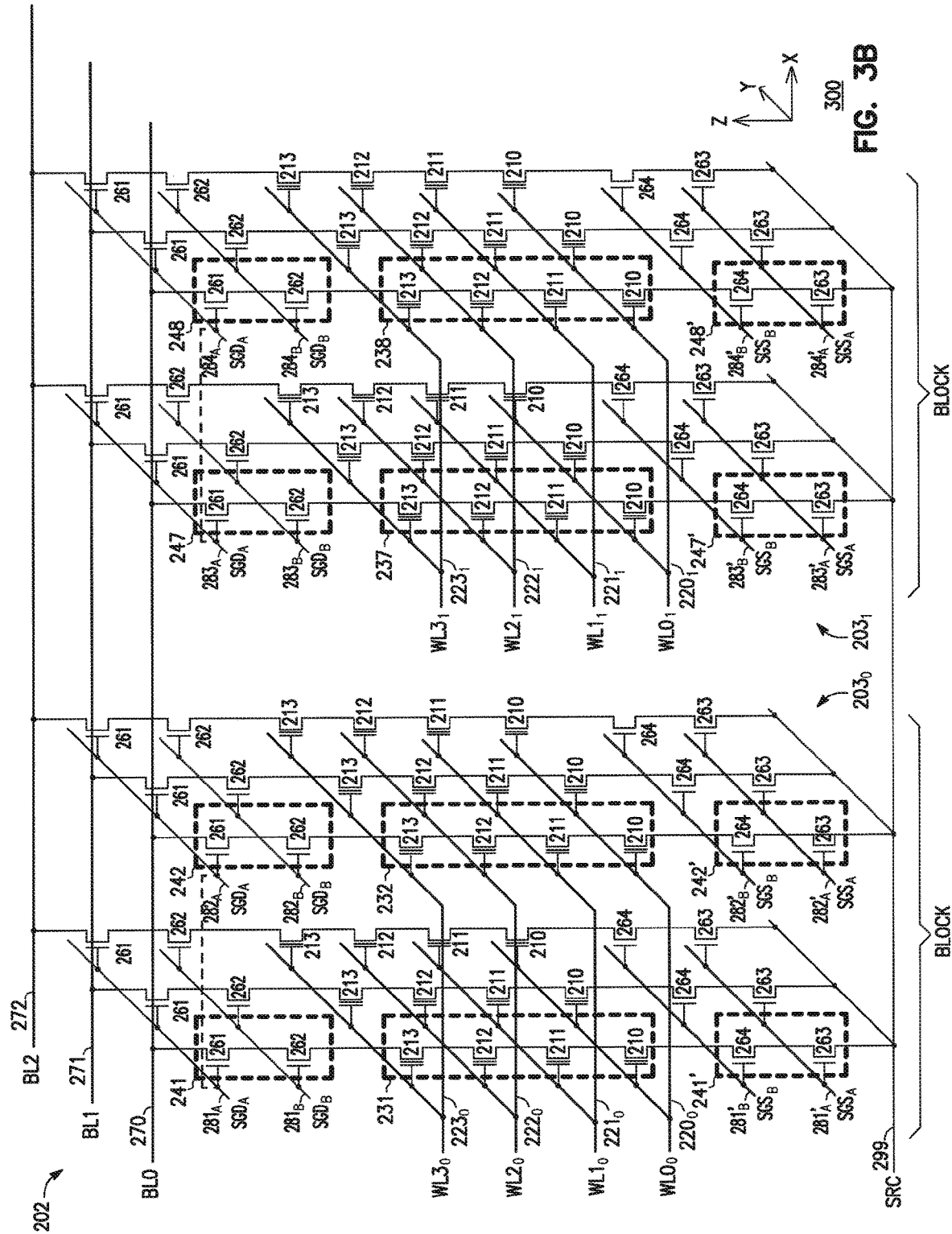
FIG. 3B shows a schematic diagram of the memory device of FIG. 3A including double drain select gates and double source select gates, according to some embodiments described herein.

FIG. 3B shows schematic diagram of memory device 300 of FIG. 3A, according to some embodiments described herein. Memory device 300 includes elements similar to or identical to those of memory device 200 of FIG. 2B. For simplicity, the description of similar or identical elements (which have the same labels in FIG. 2B and FIG. 3B) between memory devices 200 and 300 is not repeated in the description of FIG. 3B.

As shown in FIG. 3B, each of select circuits 241' through 252' can include double select gates (e.g., double source select gates): one of select gates 263 and one of select gates 264. Similar to each of select gates 263, each of select gates 264 can also operate as a transistor (e.g., a FET).

FIG. 3B shows an example where signal $SGS_A$ associated with select line $281'_A$ and signal $SGS_A$ associated with select line $282'_A$ are separate signals, and signal $SGS_A$ associated with select line $283'_A$ and signal $SGS_A$ associated with select line $284'_A$ are separate signals. In a variation of memory device 300, signal $SGS_A$ associated with select line $281'_A$ and signal $SGS_A$ associated with select line $282'_A$ can be a shared signal (e.g., can be the same signal); and signal $SGS_A$ associated with select line $283'_A$ and signal $SGS_A$ associated with select line $284'_A$ can be a shared signal (e.g., can be the same signal).

FIG. 3B shows an example where signal $SGS_B$ associated with select line $281'_B$ and signal $SGS_B$ associated with select line $282'_B$ are separate signals, and signal $SGS_B$ associated with select line $283'_B$ and signal $SGS_B$ associated with select line $284'_B$ are separate signals. In a variation of memory device 300, signal $SGS_B$ associated with select line $281'_B$ and signal $SGS_B$ associated with select line $282'_B$ can be a shared signal; and signal $SGS_B$ associated with select line $283'_B$ and signal $SGS_B$ associated with select line $284'_B$ can be a shared signal.

Figure 3C:
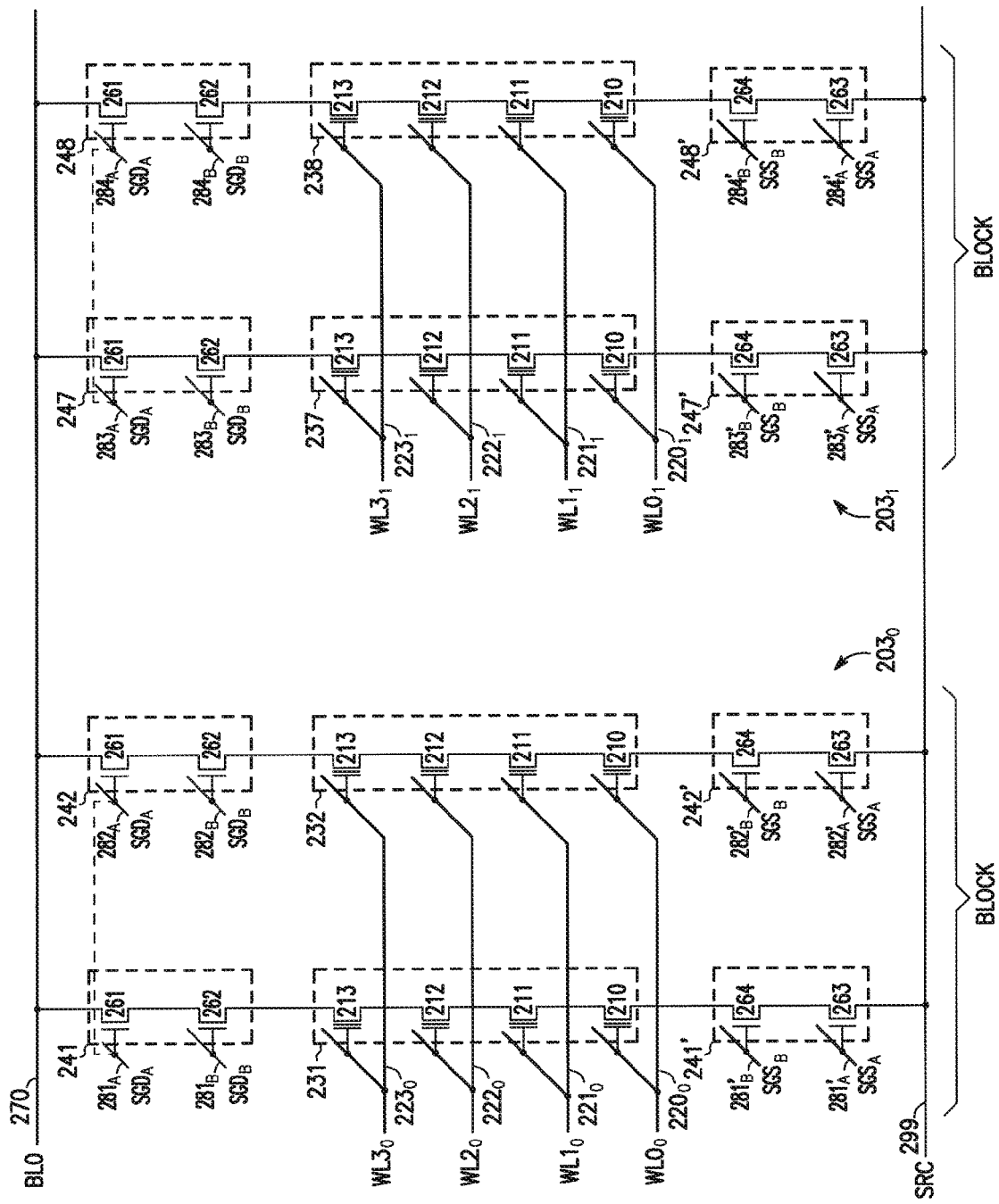
FIG. 3C shows a schematic diagram of a portion of the memory device of FIG. 3B, according to some embodiments described herein.

FIG. 3C shows a schematic diagram of a portion of memory device 300 of FIG. 3B including memory cell strings 231, 232, 237, and 238 and select circuits 241, 242, 247, 248, 241', 242', 247', and 248' coupled between line 270 and line 299, according to some embodiments described herein. Portion of memory device 300 shown in FIG. 3C includes elements similar to or identical to those of memory device 200 of FIG. 2C. For simplicity, the description of similar or identical elements between memory devices 200 and 300 is not repeated in the description of FIG. 3C.

As shown in FIG. 3C, select gates (e.g., double source select gates) 263 and 264 of each of select circuits 241', 242', 247', and 248' can be coupled in series between line 299 and a respective memory cell string among memory cell strings 231, 232, 237, and 238. Select gate 263 of select circuit 241' has a terminal (e.g., a transistor gate) that can be part of (e.g., formed by a portion of) select line $281'_A$. Select gate 264 of select circuit 241' has a terminal (e.g., a transistor gate) that can be part of (e.g., formed by a portion of) select line $281'_B$. Select gates 263 and 264 of select circuit 241' can be controlled (e.g., turned on or turned off) by signals $SGS_A$ and $SGS_B$ provided to select lines $281'_A$ and $281'_B$, respectively. Similarly, as shown in FIG. 3C, select gates 263 and 264 of each of select circuits 242', 247' and 248' also have terminals (transistor gates) that can be parts of (e.g., formed by portions of) respective select lines among select lines $282'_A$, $283'_A$, $284'_A$, $282'_B$, $283'_B$, and $284'_B$.

FIG. 3D is a chart 300D showing example values of voltages provided to signals BL, $SGD_A$, $SGD_B$, WL selected, WL unselected, $SGS_A$, $SGS_B$, and SRC of memory device 300 during read, write, and erase operations of memory device 300, according to some embodiments described herein. Differences between chart 300D and chart 200D (FIG. 2D) include the values of voltages provided to signals $SGS_A$ and $SGS_B$ during read, write, and erase operations of memory device 300. Other signals shown in chart 300D of FIG. 3D can be provided with voltages having values similar to or identical to those of chart 200D of FIG. 2D. The following description of FIG. 3D uses the same assumptions (e.g., selected and deselected blocks and strings) used in description of FIG. 2D.

During a read operation of memory device 300 (FIG. 3C), for a selected block (e.g., block $203_0$), signals $SGS_A$ and $SGS_B$ in FIG. 3D associated with a selected string of the selected block can be provided (e.g., bias) with voltages having the same value, such as $SGS_A = SGS_B = 5V$. Thus, in this example, select lines $281'_A$ and $281'_B$ (FIG. 3C) associated with memory cell string 231 (e.g., selected string) can be provided with voltages having the same value of 5V. Hence, select gates 263 and 264 of select circuit 241' can receive voltages having the same value of 5V. Signals $SGS_A$ and $SGS_B$ associated with a deselected string of the selected block can be provided with voltages having the same value, such as $SGS_A = SGS_B = 0V$. Thus, in this example, select lines $282'_A$ and $282'_B$ associated with memory cell string 232 (e.g., deselected string) can be provided with voltages having the same value of 0V. Hence, select gates 263 and 264 of select circuit 242' can receive voltages having the same value of 0V.

During a read operation of memory device 300 (FIG. 3C) for a deselected block (e.g., block $203_1$), signals $SGS_A$ and $SGS_B$ associated with all strings (e.g., strings 237 and 238) of the deselected block can be provided (e.g., bias) with voltages having the same, such as $SGS_A = SGS_B = 0V$. Thus, in this example, in block $203_1$ (deselected block), select lines $283'_A$ and $284'_A$ can be provided with voltages having the same value of 0V; and select lines $283'_B$ and $284'_B$ can be provided with voltages having values of 0V. Hence, select gates 263 of select circuits 247' and 248' can receive voltages having the same value of 0V; and select gates 264 of select circuits 247' and 248' can receive voltages having the same value of 0V.

During a write operation of memory device 300 (FIG. 3C) for a selected block (e.g., block $203_0$), signals $SGS_A$ and $SGS_B$ associated with a selected string can be provided (e.g., bias) with voltages having different values, such as $SGS_A = V13 = 2.3V$ and $SGS_B = V14 = 0V$. Thus, in this example, select lines $281'_A$ and $281'_B$ (FIG. 3C) associated with memory cell string 231 (selected string) can be provided with voltages having values of 2.3V and 0V, respectively. Hence, select gates 263 and 264 of select circuit 241' can receive voltages of 2.3V and 0V, respectively. Signals $SGS_A$ and $SGS_B$ associated with a deselected string can be provided with voltages having different values, such as $SGS_A = V15 = 2.3V$ and $SGS_B = V16 = 0V$. Thus, in this example, select lines $282'_A$ and $282'_B$ associated with memory cell string 232 (deselected string) can be provided with voltages having values of 2.3V and 0V, respectively. Hence, select gates 263 and 264 of select circuit 242' can receive voltages having values of 2.3V and 0V, respectively.

During a write operation of memory device 300 (FIG. 3C) for a deselected block (e.g., block $203_1$), signals $SGS_A$ and $SGS_B$ associated with all strings of block $203_1$ can be provided (e.g., bias) with voltages having different values, such as $SGS_A = V17 = 2.3V$ and $SGS_B = V18 = 0V$. Thus, in this example, in block $203_1$ (deselected block), select lines $283'_A$ and $284'_A$ can be provided with voltages having values of 2.3V; and select lines $283'_B$ and $284'_B$ can be provided with voltages having values of 0V. Hence, each of select gates 263 of select circuits 247' and 248' can receive a voltage having a value of 2.3V; each of select gates 264 of select circuits 247' and 248' can receive a voltage having a value of 0V.

During an erase operation of memory device 300 (FIG. 3C) for a selected block, based on the above assumptions and as shown in chart 300D of FIG. 3D, signals $SGS_A$ and $SGS_B$ associated with a selected string and a deselected string can be provided with voltages having different values, such as $SGS_A = V19 = 15V$ and $SGS_B = V20 = 11V$. Thus, in this example, in block $203_0$, select lines $281'_A$ and $282'_A$ (FIG. 3C) can be provided with voltages having values of 15V; and select lines $281'_B$ and $282'_B$ can be provided with voltages having values of 11V. Hence, select gates 263 of select circuits 241' and 242' can receive voltages having values of 15V; select gates 264 of select circuits 241' and 242' can receive voltages having values of 11V.

During an erase operation of memory device 300 (FIG. 3C) for a deselected block, select lines $2833'_A$ and $283'_B$ (FIG. 3C) of block $203_1$ (deselected block) may be placed in a "float" state (shown as "F" in FIG. 3D). In the float state, the voltages on select lines $283'_A$, $283'_B$, $284'_A$, and $284'_B$ may have values proportional to the value (e.g., approximately 20V) of the voltage provided to signal BL (e.g., signal BL0 in this example). Hence, select gates 263 and 264 of select circuits 247' and 248' of block $203_1$ (deselected block) can be placed in the float state in an erase operation.

FIG. 3E is a chart 300E showing example values of voltages provided to signals BL, $SGD_A$, $SGD_B$, WL selected, WL unselected, SGS, and SRC of memory device 300 during read, write, and erase operations of memory device 300 when signal $SGD_A$ associated with select line $281_A$ and signal $SGD_A$ associated with select line $282_A$ can be separate signals (e.g., not a shared signal) in a variation of memory device 300, according to some embodiments described herein. Chart 300E can be a variation of chart 300D where signals $SGD_A$ and $SGD_B$ are separate signals. Thus, in chart 300E, voltages of different values can be provided to signals $SGD_A$ associated with select line $281_A$ and signal $SGD_A$ associated with select line $282_A$ of a deselected string of a selected block. The values of voltages provided to signals in chart 300E can be the same as those in chart 200E of FIG. 2E.

Providing (e.g., applying) voltages to signals $SGD_A$, $SGD_B$, $SGS_A$ and $SGS_B$ as shown in chart 300E may allow memory device 300 to achieve improvements at least similar to (e.g., better than) the improvements provided by memory device 200, as described above with reference to FIG. 2A through FIG. 2E. For example, the structure of memory device 300 and the biasing (e.g., based on chart 300E of FIG. 3E) techniques described herein may help reduce or suppress GIDL current in a block (e.g., in a deselected block and in a portion associated with deselected strings of a selected block) during a read or write operation of memory device 300. In another example, the structure of memory device 300 and the biasing techniques described herein may also help provide enough GIDL current and reduce electric field stress during an erase operation performed on a block of memory device 300.

Figure 3F:
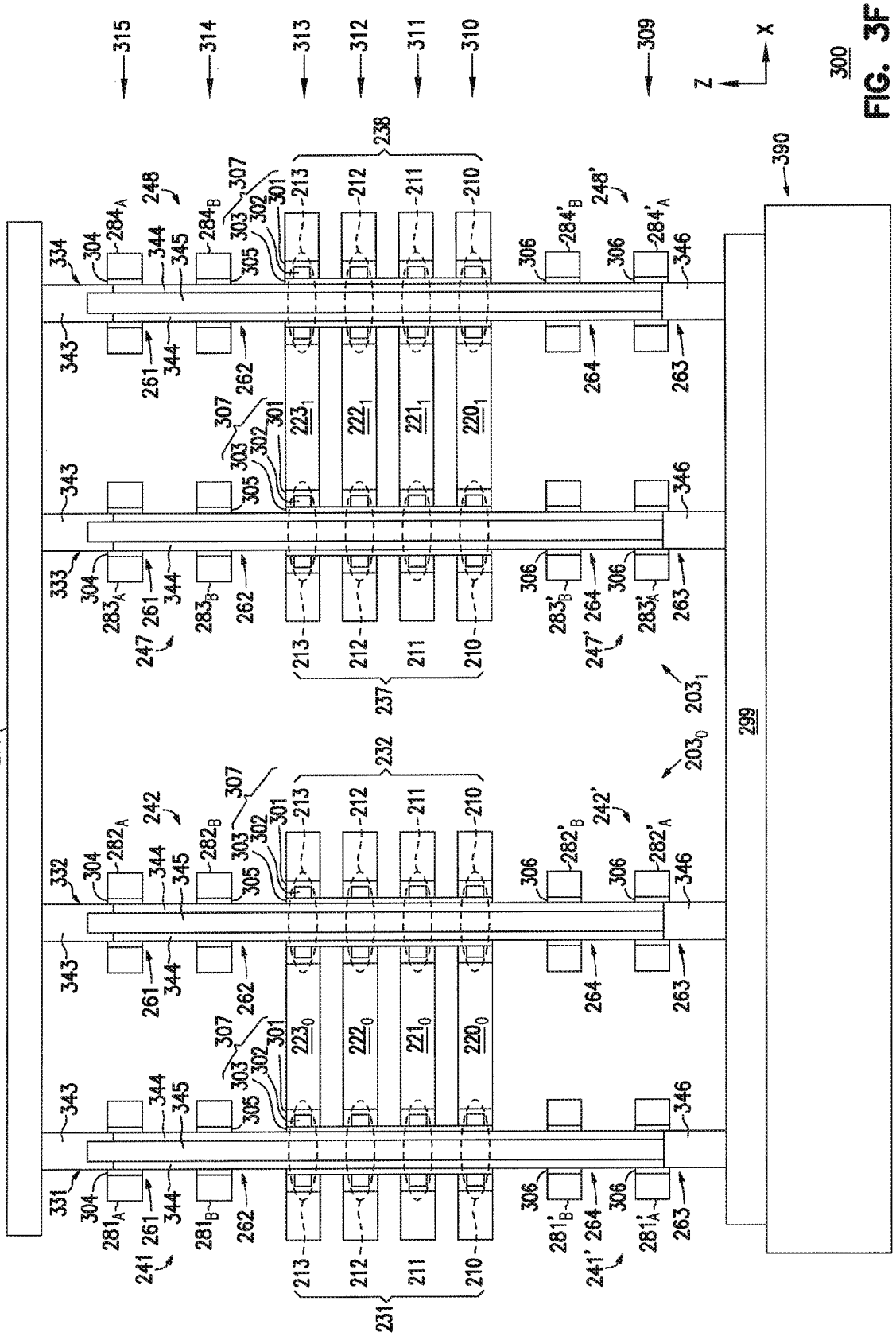
FIG. 3F shows a side view of a structure of a portion of the memory device of FIG. 3A through FIG. 3C, according to some embodiments described herein.
Figure 3G:
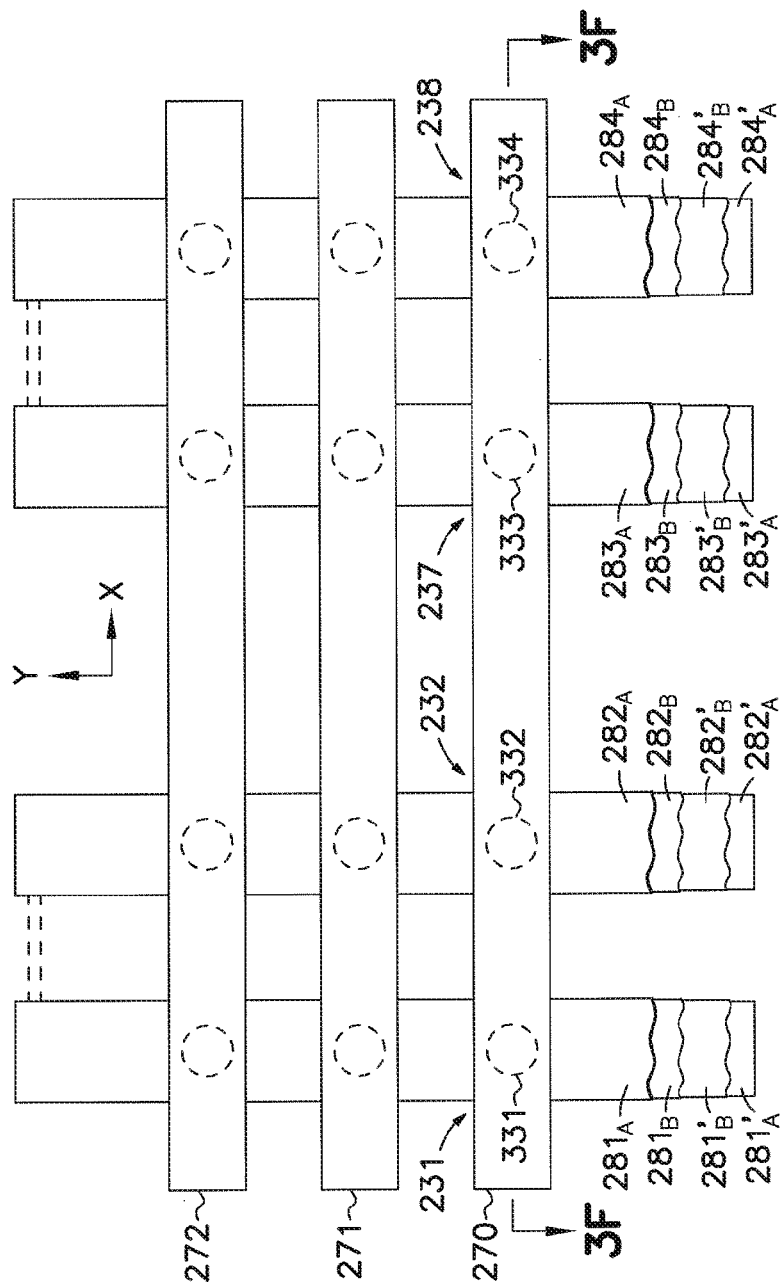
FIG. 3G shows a top view of the structure of the portion of the memory device of FIG. 3F, according to some embodiments described herein.

FIG. 3F shows a side view of a structure of a portion of memory device 300, according to some embodiments described herein. The structure of memory device 300 in FIG. 3F corresponds to the schematic diagram of memory device 300 shown in FIG. 3C. The structure of memory device 300 in FIG. F can be a variation of the structure of memory device 200 of FIG. 2F. For simplicity, the description of similar or identical elements (which have the same labels in FIG. 2F and FIG. 3F) between memory devices 200 and 300 is not repeated in the description of FIG. 3F. FIG. 3G shows a top view of a structure of a portion of memory device 300 of FIG. 3F, according to some embodiments described herein. Differences between memory device 300 of FIG. 3F and memory device 200 (FIG. 2F) include, as shown in FIG. 3F the double select lines (e.g., select lines $281'_A$, $282'_A$, $283'_A$, and $284'_A$ and select lines $281'_B$, $282'_B$, $283'_B$, and $284'_B$) between substrate 390 and a respective memory cell string.

Select lines $281'_A$, $282'_A$, $283'_A$, and $284'_A$ can have any of the variations (e.g., material, distance from its sidewall to the respective pillar, and thickness) of select line 281' described above with reference to FIG. 2A through FIG. 2M. Select lines $281'_B$, $282'_B$, $283'_B$, and $284'_B$ can have any of the variations (e.g., material, distance from its sidewall to the respective pillar, and thickness) of select line 281' described above with reference to FIG. 2A through FIG. 2M.

Memory device 300 can include improvements at least similar to those of memory device 200. For example, the structure of memory device 300 and the biasing techniques (e.g., based on chart 300D of FIG. 3D and chart 300E of FIG. 3E) described herein may help reduce or suppress GIDL current in a block (e.g., selected block, deselected block, or both) during a read or write operation of memory device 300 and providing enough GIDL current during an erase operation performed on a selected block of memory device 300.

FIG. 4A and FIG. 4B show a schematic diagram and a structure, respectively, of a portion a memory device 400 including triple drain select lines and associated drain select transistors and triple source select lines and associated source select transistors, according to some embodiments described herein. Memory device 400 can be a variation of memory device 300. For simplicity, only a portion of memory device 400 is shown in FIG. 4A and FIG. 4B. The description of similar or identical elements (which have the same labels in FIG. 3B, FIG. 4A, and FIG. 4B) between memory device 300 and 400 is not repeated in the description of FIG. 4A and FIG. 4B. Differences between memory devices 300 and 400 include, as shown in FIG. 4A and FIG. 4B, an addition of select lines $281_C$ and $282_C$, select gates 266, and a signal $SGD_C$ associated with each of select lines $281_C$ and $282_C$, and an addition of select lines $281'_C$ and $282'_C$, select gates 265, and a signal $SGS_C$ associated in each of select lines $281'_C$ and $282'_C$. As shown in FIG. 4A, select lines $281'_A$ and $282'_A$ can be connected to each other by a connection $281'''_A$ (which can be a direct or indirect connection similar to connection $281''_A$ in FIG. 2A). In FIG. 4A, memory device 400 can include variations of memory devices 200 and 300 described above with reference to FIG. 2A through FIG. 3G.

During an operation (e.g., read, write, or erase operation) of memory device 400, signals $SGD_B$ and $SGD_C$ can be provided with the same voltages as those provided to signal $SGD_B$ in chart 300D (FIG. 3D) or chart 300E (FIG. 3E), and signals $SGS_B$ and $SGS_C$ can be provided with the same voltages as those provided to signal $SGS_B$ in chart 300D (FIG. 3D) or chart 300E (FIG. 3E). Including triple select lines (e.g., drain select lines) $281_A$, $281_B$, and $281_C$, and triple select lines (e.g., source select lines) $281'_A$, $281'_B$, and $281'_C$ may allow memory device 400 to achieve similar improvements as memory device 200 or memory device 300 described above with reference to FIG. 2A through FIG. 3G.

FIG. 5A through FIG. 24 show processes of forming memory devices, according to some embodiments described herein. The processes described with reference to FIG. 5A through FIG. 24 can be used to form memory devices including memory devices 200, 300, and 400 and their variations. Some of the processes of forming memory devices and some of the elements of memory device, such as the memory devices shown in FIG. 5A through FIG. 24, may be readily known to those skilled in the art. Thus, to help focus on the embodiments described herein, some of the processes of forming the memory devices shown in FIG. 5A through FIG. 24 and additional processes to complete those memory devices are omitted. Further, for simplicity, similar or identical elements among in FIG. 2 through FIG. 4B and FIG. 5A through FIG. 24 are given the same labels.

Figure 5B:
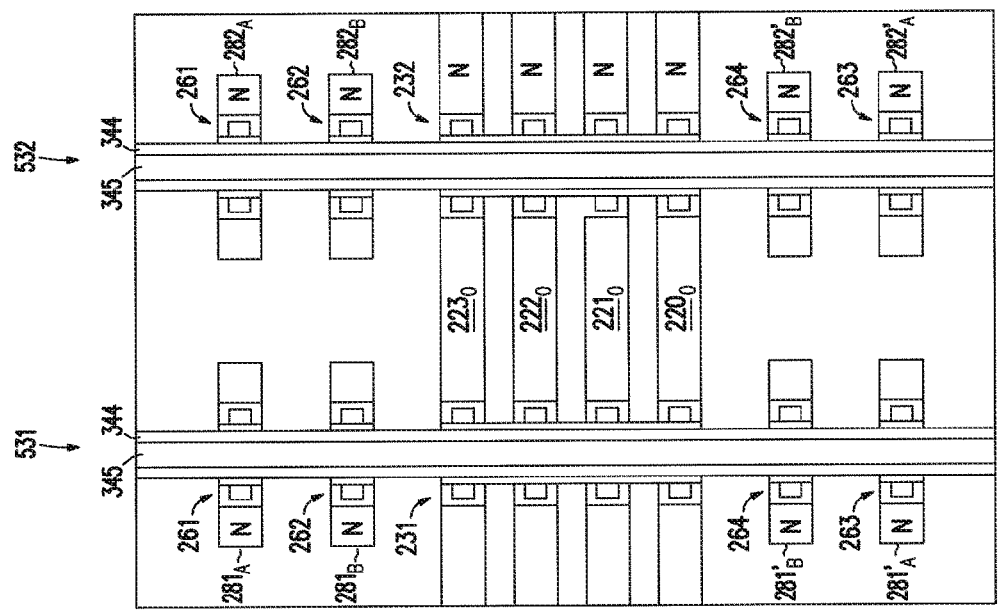
Figure 5A:
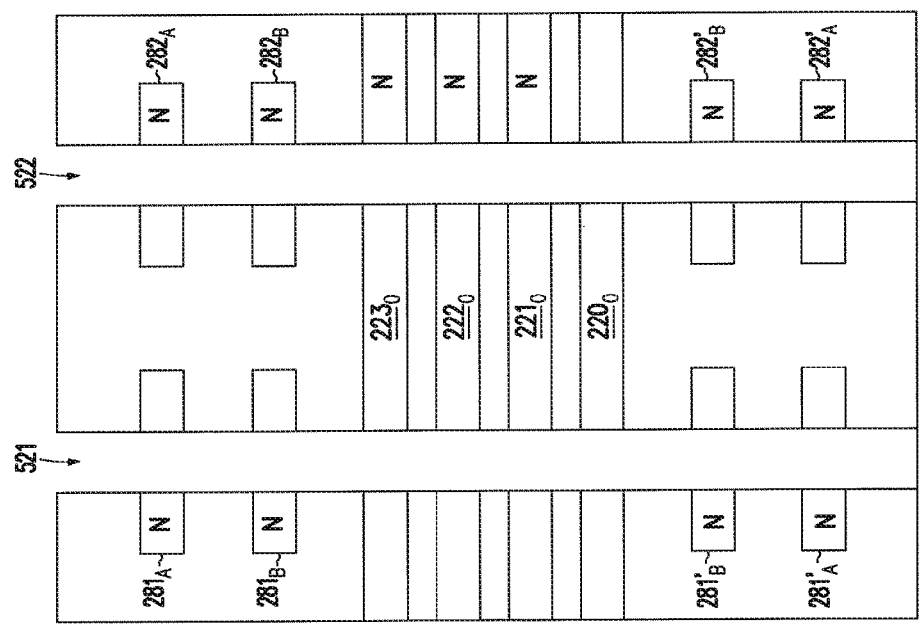

FIG. 5A and FIG. 5B show processes of forming a memory device 500, according to some embodiments described herein. FIG. 5A shows memory device 500 after select lines $281_A$, $281_B$, $281'_A$, $281'_B$, $282_A$, $282_B$, $282'_A$, and $282'_B$, and control lines $220_0$, $221_0$, $222_0$, and $223_0$ are formed, such as by depositing alternating dielectric materials between the conductive materials (e.g., layers) of select lines $281_A$, $281_B$, $281'_A$, $281'_B$, $282_A$, $282_B$, $282'_A$, and $282'u$, and control lines $220_0$, $221_0$, $222_0$, and $223_0$. Then, pillar holes 521 and 522 can be formed in the alternating conductive materials and the dielectric materials. In FIG. 5A, label "N" refers to conductive material of n-type (e.g., conductively doped polycrystalline silicon of n-type) that can be included in select lines $281_A$, $281_B$, $281'_A$, $281'_B$, $282_A$, $282_B$, $282'_A$, and $282'_B$, and control lines $220_0$, $221_0$, $222_0$, and $223_0$. The n-type materials are used as an example. Other conductive materials (e.g., p-type materials, metals, and other conductive materials) can be used. FIG. 5B shows memory device 500 after memory cell strings 231 and 232 and select gates 261, 262, 263, and 264 are formed. Portion 344 (e.g., conductive channel) and portion 345 (e.g., dielectric filler) can be formed in each of pillar holes 521 and 522 after memory cell strings 231 and 232 and select gates 261, 262, 263, and 264 are formed. Pillar holes 521 and 522 including respective portions 344 and 345 are parts of pillars (pillars of materials) 531 and 532, respectively.

As shown in FIG. 5B, each of select gates 261, 262, 263, and 264 can be formed such that it can have a memory cell-type structure, which is similar or identical structure of each of the memory cells of memory cell strings 231 and 232. The memory cell-type structure of each of select gates 261, 262, 263, and 264 may simplify fabrication process. It may also allow electrical programming of select gates 261, 262, 263, and 264 in order to adjust the threshold voltages of select gates 261, 262, 263, and 264. This may improve biasing of select lines $281_A$, $281_B$, $281'_A$, $281'_B$, $282_A$, $282_B$, $282'_A$, and $282'_B$ during operations of memory device 500. Further, since each of select gates 261 and 263 have a memory cell-type structure, select gates 261 and 263 may not be susceptible to degradation from GIDL erase techniques used in memory device 500.

Figure 6B:
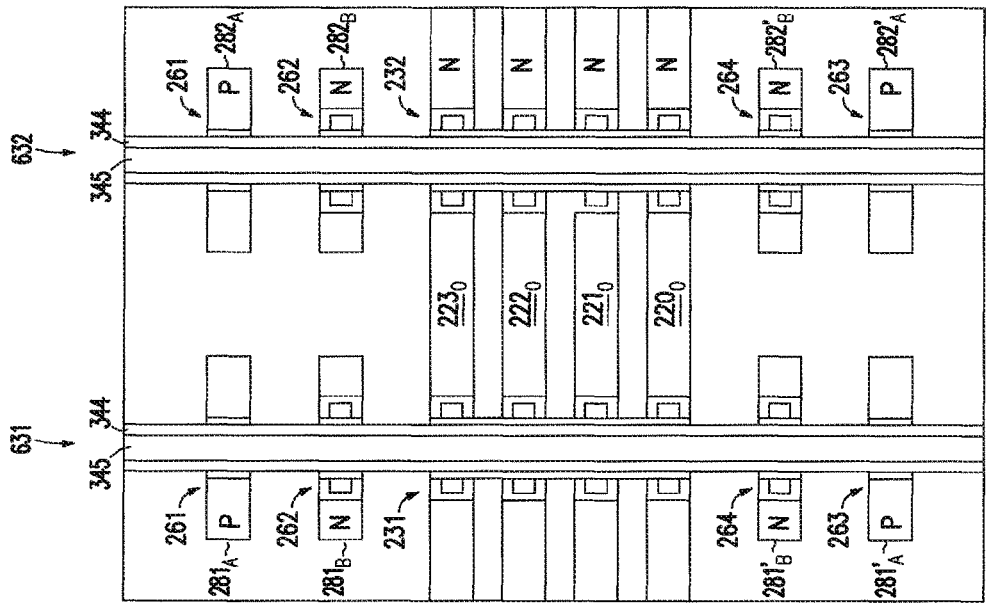
Figure 6A:
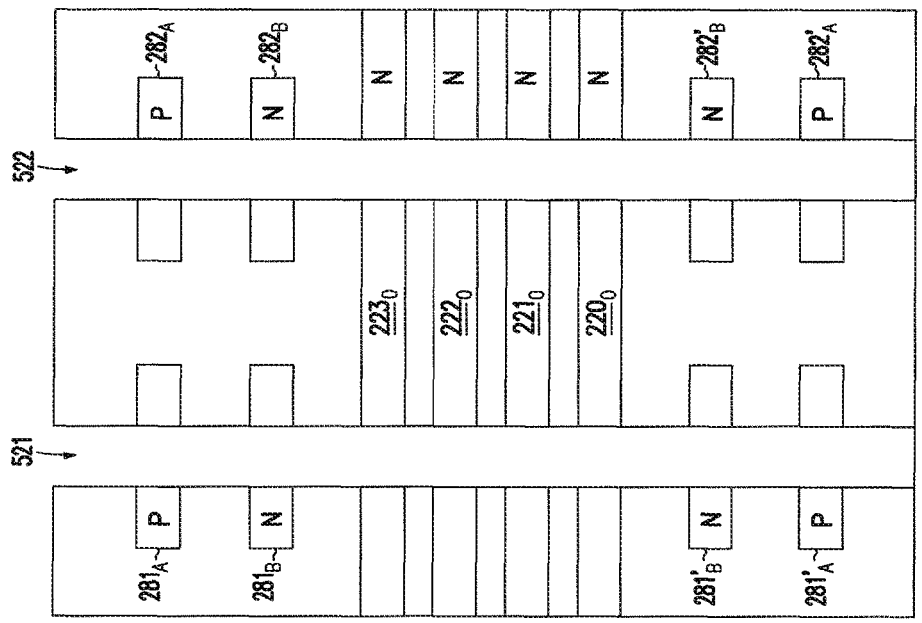

FIG. 6A and FIG. 6B show processes of forming a memory device 600, according to some embodiments described herein. Similar to memory device 500 (FIG. 5A and FIG. 5B), FIG. 6A shows memory device 600 after select lines $281_A$, $281_B$, $281'_A$, $281'_B$, $282_A$, $282_B$, $282'_A$, and $282'_B$, and control lines $220_0$, $221_0$, $222_0$, and $223_0$, and pillar holes 521 and 522 are formed. In FIG. 6A, label "P" refers to conductive material of p-type (e.g., conductively doped-polycrystalline silicon of p-type). Select line $281_A$, $282_A$, $281'_A$, and $282'_A$ can include conductive material of p-type. FIG. 6B shows memory device 600 after memory cell strings 231 and 232, select gates 261, 262, 263, and 264 are formed. Pillars (pillars of materials) 631 and 632 are also formed. Each of pillars 631 and 632 can include materials of respective portions 344 and 345. Similar to memory device 500 (FIG. 5B), each of select gates 262 and 264 of memory device 600 can be formed such that it can have a memory cell-type structure. Unlike select gates 261 and 263 of memory device 500, each of select gates 261 and 263 of memory device 600 can be formed such that it can have a FET-type structure. The memory cell-type structure of each of select gates 262 and 264 may allow electrical programming of select gates 262 and 264 in order to adjust the threshold voltages of select gates 262 and 264. This may improve biasing of select lines $281_B$, $281'_B$, $282_B$, and $282'_B$ during operations of memory device 600.

Figure 7B:
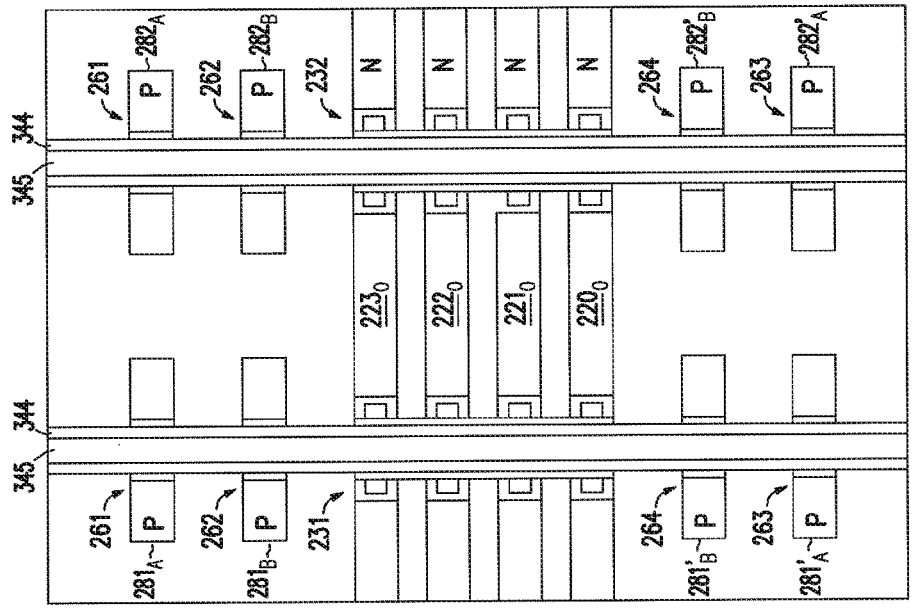
Figure 7A:
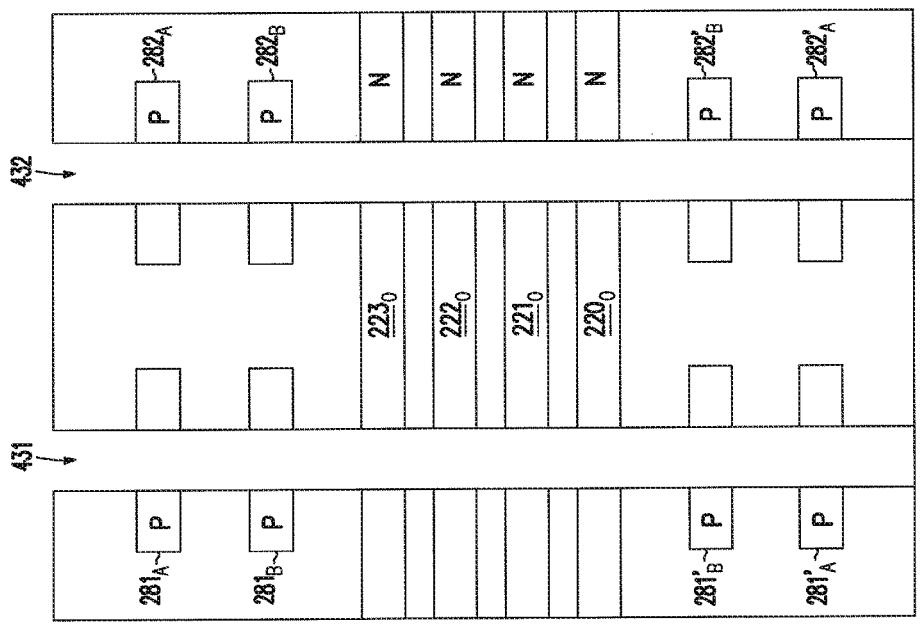

FIG. 7A and FIG. 7B show processes of forming a memory device 700, according to some embodiments described herein. The processes of forming memory device 700 are similar to those used to form memory device 600 of FIG. 6B. In memory device 700, however, each of select gates 261, 262, 263, and 264 can be formed such that it can have a FET-type structure. This structure may help maintain the relative size of memory device 700 (e.g., allowing chip size to remain unchanged).

Figure 8B:
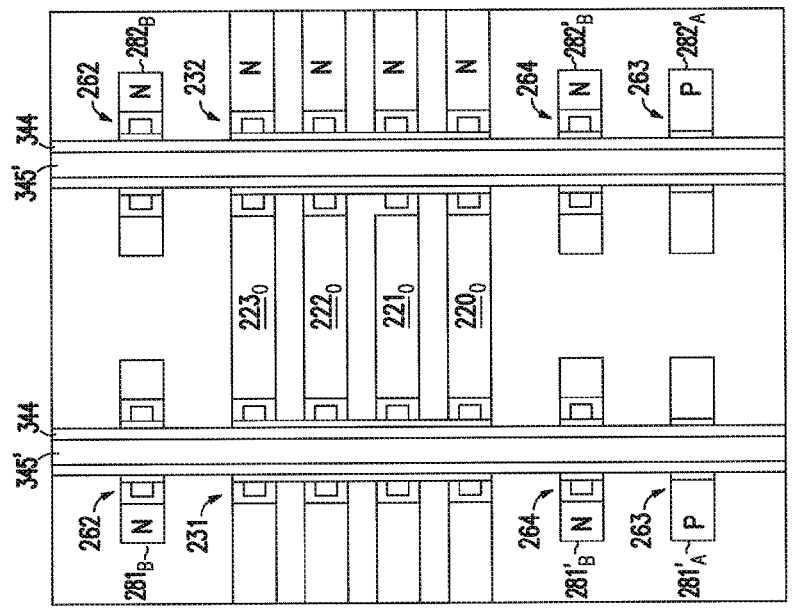
Figure 8A:
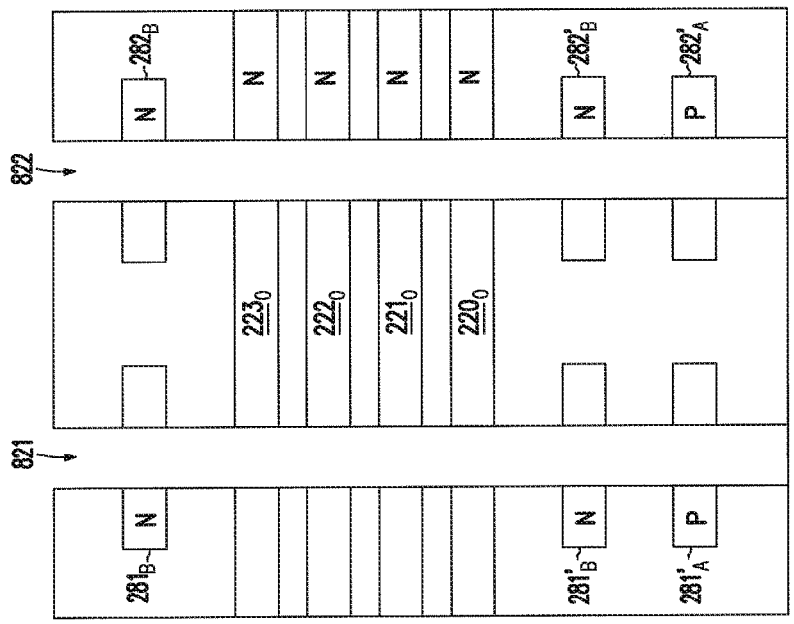

FIG. 8A through FIG. 8D show processes of forming a memory device 800 including forming multiple pillar holes at different times, according to some embodiments described herein. FIG. 8A shows memory device 800 after select lines $281_B$, $281'_A$, $281'_B$, $282_B$, $282'_A$, and $282'_B$, and control lines $220_0$, $221_0$, $222_0$, and $223_0$ are formed. Pillar holes 821 and 822 can be formed after select lines $281_B$, $281'_A$, $281'_B$, $282_B$, $282'_A$, and $282'_B$, and control lines $220_0$, $221_0$, $222_0$, and $223_0$ are formed.

FIG. 8B shows memory device 800 after memory cell strings 231 and 232 and select gates 262, 263, and 264 are formed. Portion 344 and portion 345' (e.g., dielectric filler) can be formed in each of pillar holes 821 and 822 after memory cell strings 231 and 232 and select gates 262, 263, and 264 are formed. As shown in FIG. 8B, each of select gates 262 and 264 can be formed such that it can have a memory cell-type structure. Each of select gates 263 can be formed such that it can have a FET-type structure.

Figure 8D:
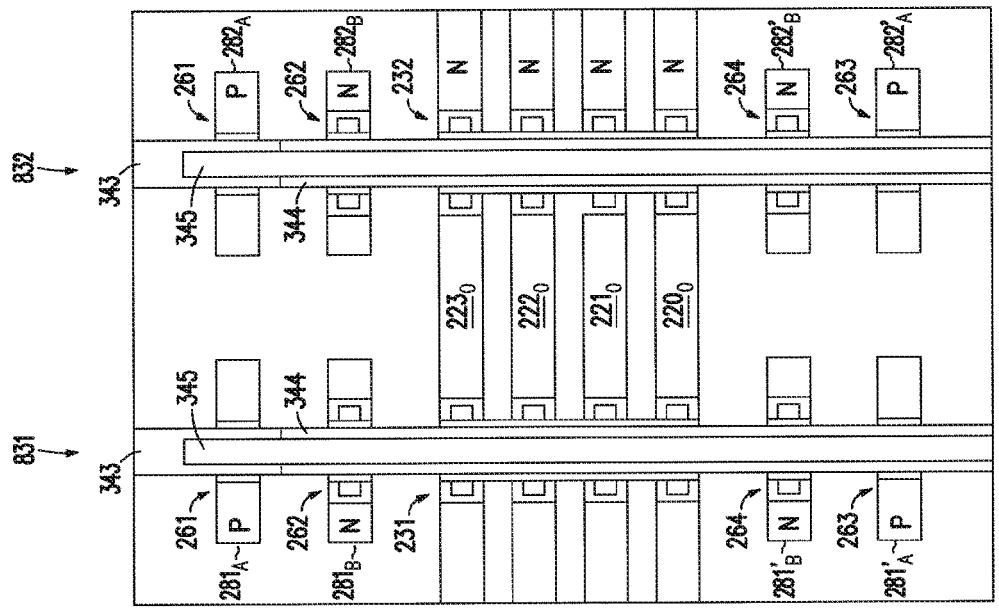
Figure 8C:
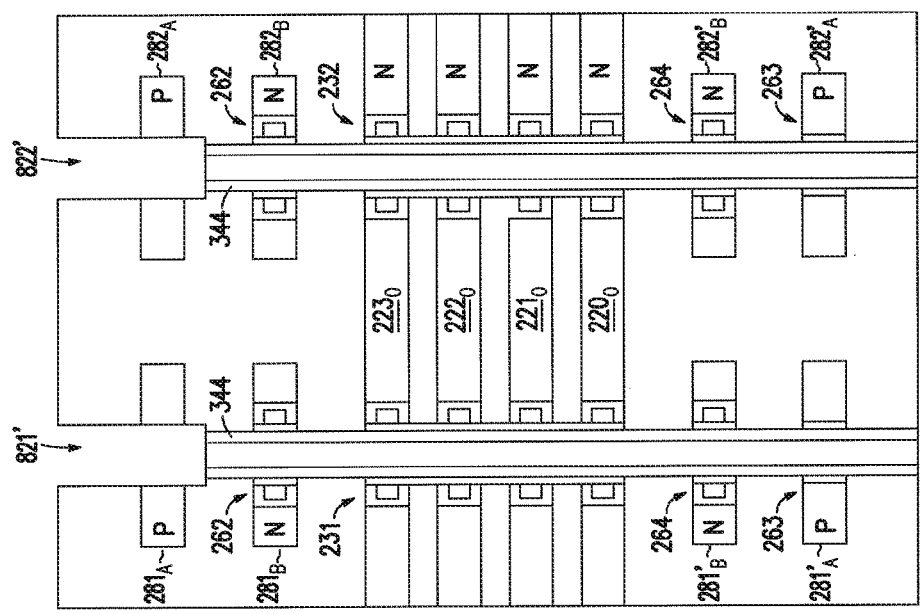

FIG. 8C shows memory device 800 after select lines $281_A$ and $282_A$ are formed. Pillar holes 821' and 822' can be formed after select lines $281_A$ and $282_A$ are formed.

FIG. 8D shows memory device 800 after select gates 261 are formed. Each of select gates 261 can be formed such that it can have a FET-type structure. Portions 343 and 345 can be formed after select gates 261 are formed. Portions 343, 344, and 345 are parts of a respective pillar, such as pillar 831 or 832.

Figure 9B:
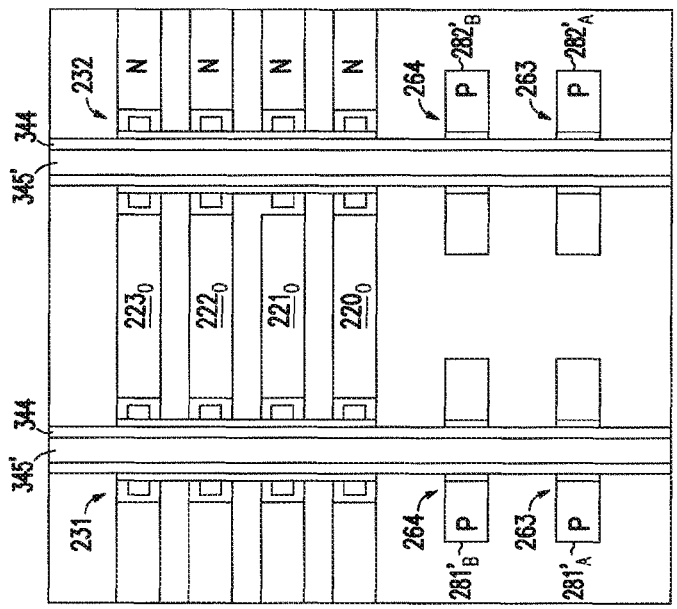
Figure 9A:
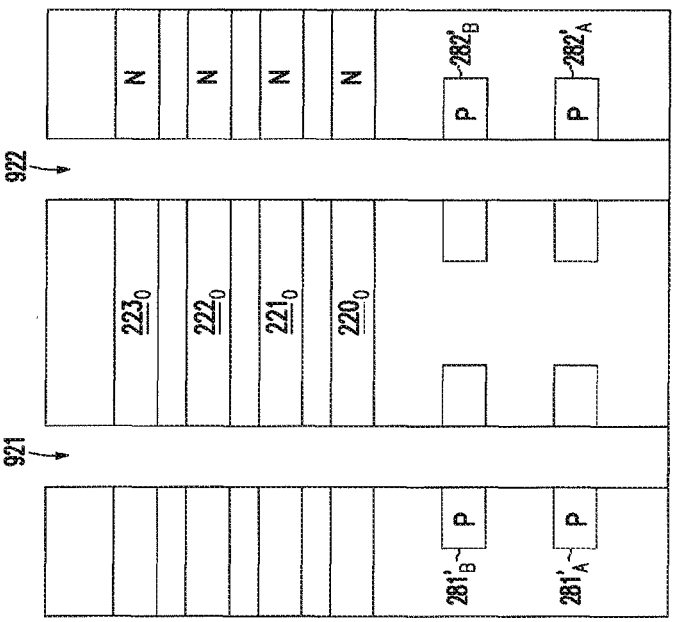

FIG. 9A through FIG. 9D show processes of forming a memory device 900 including forming multiple pillar holes at different times, according to some embodiments described herein. FIG. 9A shows memory device 900 after select lines $281'_A$, $281'_B$, $282'_A$, $282'_B$, and control lines $220_0$, $221_0$, $222_0$, and $223_0$ are formed. Pillar holes 921 and 922 can be formed after select lines $281'_A$, and $281'_B$, and control lines $220_0$, $221_0$, $222_0$, and $223_0$ are formed.

FIG. 9B shows memory device 900 after memory cell strings 231 and 232 and select gates 263 and 264 are formed. Portion 344 and portion 345' (e.g., dielectric filler) can be formed in each of pillar holes 921 and 922 after memory cell strings 231 and 232 and select gates 263 and 264 are formed. As shown in FIG. 9B, each of select gates 263 and 264 can be formed such that it can have a FET-type structure.

Figure 9D:
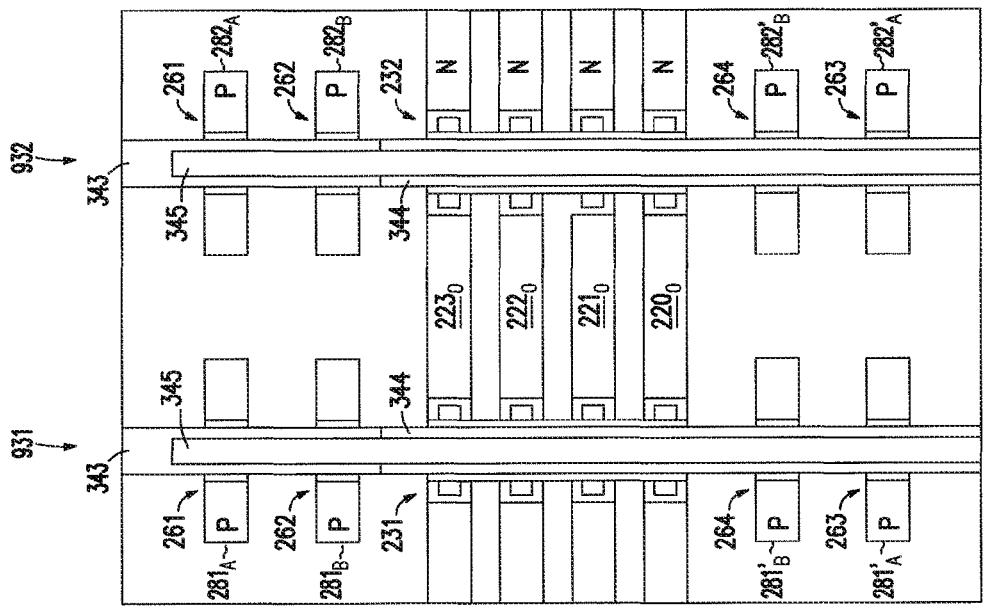
Figure 9C:
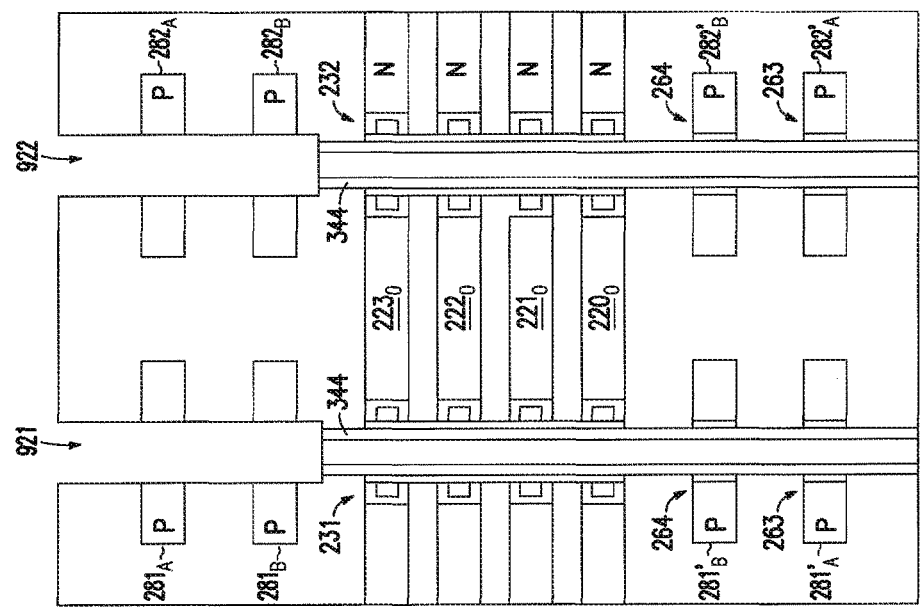

FIG. 9C shows memory device 900 after select lines $281_A$, $282_A$, $281_B$, and $282_B$ are formed. Then, pillar holes 921' and 922' can be formed. FIG. 9D shows memory device 900 after select gates 261 and 262 are formed. Each of select gates 261 and 262 can be formed such that it can have a FET-type structure. Portions 343 and 345 can be formed after select gates 261 and 262 are formed. The materials of portions 343, 344, and 345 are parts of the materials of a respective pillar, such as pillar 931 or 932.

Figure 10B:
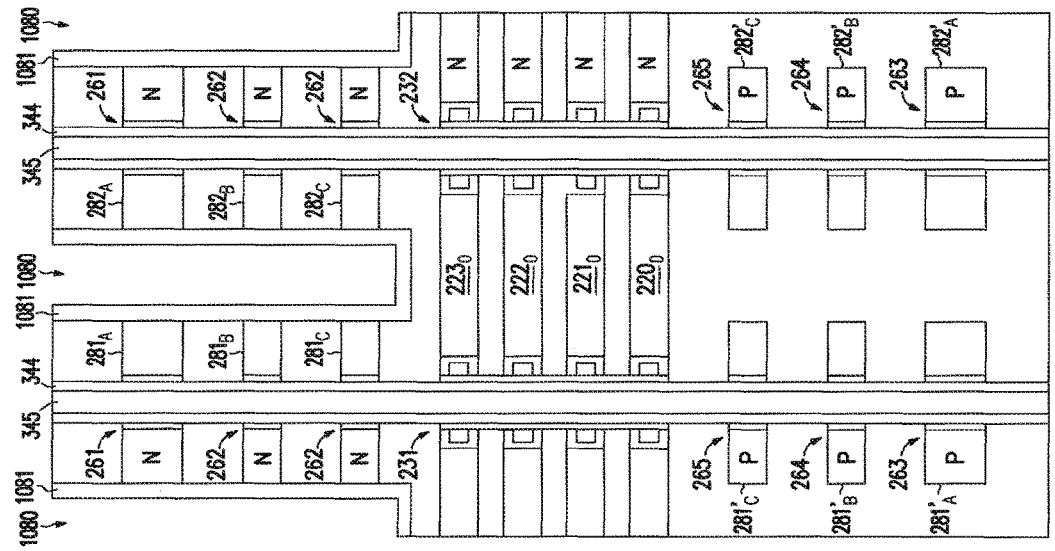
Figure 10A:
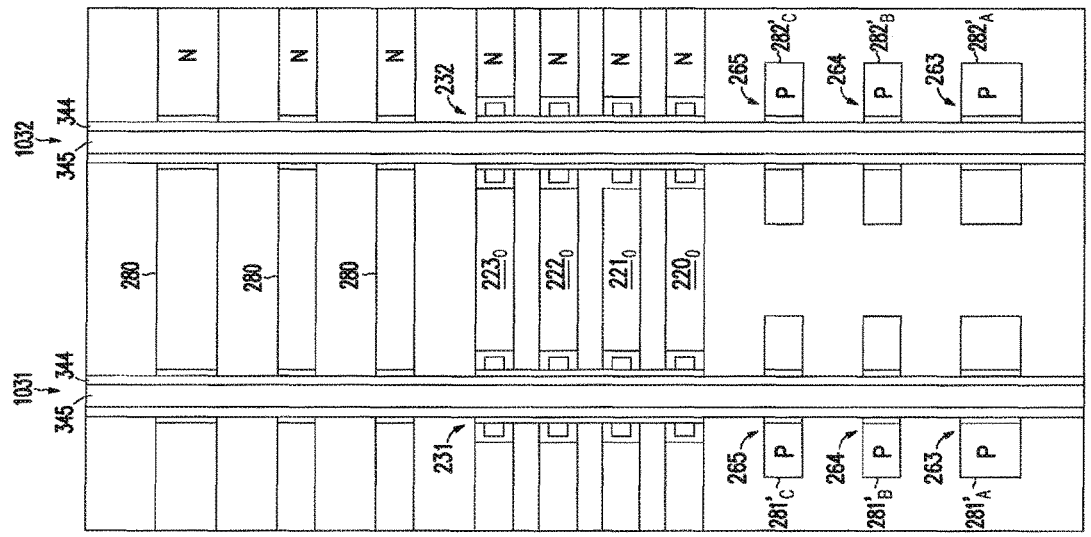

FIG. 10A through FIG. 10D show processes of forming a memory device 1000 including triple silicide drain select lines, according to some embodiments described herein. FIG. 10A shows memory device 1000 after select lines $281'_A$, $281'_B$, $281'_C$, $282'_A$, $282'_B$, and $282'_C$, select gates 263, 264, and 265, control lines $220_0$, $221_0$, $222_0$, and $223_0$, memory cell strings 231 and 232, structures (e.g., layers of n-type materials) 280, and pillars 1031 and 1032 are formed. Each of select gates 263, 264, and 265 can be formed such that it can have a FET-type structure. Portion 344 (e.g., conductive channel) and portion 345 (e.g., dielectric filler) can be also formed. Portions 344 and 345 are parts of a respective pillar, such as pillar 1031 or 1032.

FIG. 10B shows memory device 1000 after openings (e.g., slits or cuts) 1080 are formed (e.g., by etching portions of structures 280 at openings 1080), resulting in the formation of select lines $281_A$, $281_B$, $281_C$, $282_A$, $282_B$, $282_C$ and select gates 261, 262, and 266. Then, material 1081 can be formed (e.g., by deposition) in openings 1080. Material 1081 can include cobalt, nickel, or other conductive materials. As shown in FIG. 10B, select lines $281_A$, $281_B$, $281_C$ can include n-type material (e.g., n-type polycrystalline silicon).

FIG. 10C shows memory device 1000 after a silicidation process is performed and after materials 1081 are removed from openings 1080. The silicidation process causes the material (e.g., n-type polycrystalline silicon) of select lines $281_A$, $281_B$, $281_C$, $282_A$, $282_B$, $282_C$ to become silicide materials (e.g., NiSi, CoSi, or other silicide materials).

FIG. 10D shows memory device 1000 after dielectric materials (e.g., an oxide of silicon) are formed in openings 1080 (FIG. 10C). Providing select lines $281_A$, $281_B$, $281_C$, $282_A$, $282_B$, and $282_C$ with silicide materials may reduce the resistance of these select lines.

Figure 11B:
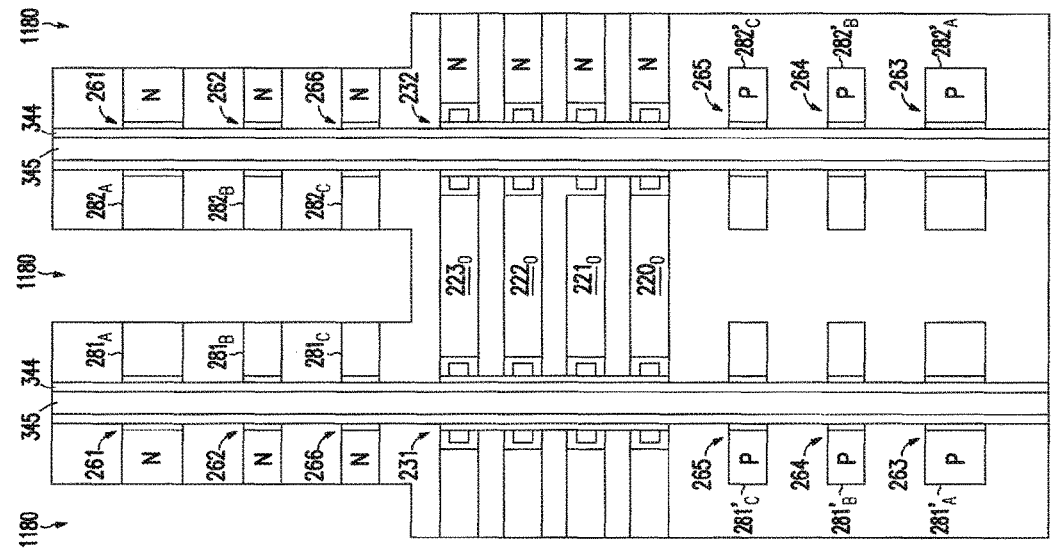
Figure 11A:
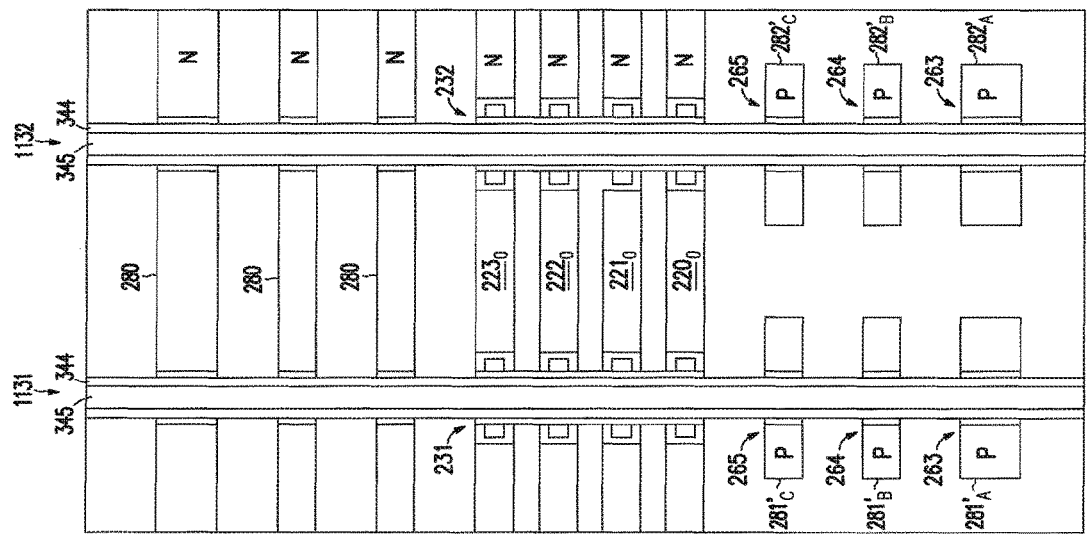

FIG. 11A through FIG. 11F show processes of forming a memory device 1100 including triple metal drain select lines, according to some embodiments described herein. Similar to memory device 1000 of FIG. 10A, FIG. 11A shows memory device 1100 after select lines $281'_A$, $281'_B$, $281'_C$, $282'_A$, $282'_B$, and $282'_C$, select gates 263, 264, and 265, control lines $220_0$, $221_0$, and $222_0$, and $223_0$, memory cell strings 231 and 232, pillar 1131 and 1132, and structures (e.g., layers of materials) 280 are formed. FIG. 11A shows structures 280 including n-type material (e.g., n-type polycrystalline silicon) as an example. Structures 280 can include silicon nitride. Portion 344 (e.g., conductive channel) and portion 345 (e.g., dielectric filler) can also be formed. Portions 344 and 345 are parts of a respective pillar, such as pillar 1131 or 1132.

FIG. 11B shows memory device 1100 after openings 1180 are formed (e.g., by etching portions of structures 280 at openings 1180). This results in the formation of select lines $281_A$, $281_B$, $281_C$, $282_A$, $282_B$, and $282_C$ and select gates 261, 262, and 266.

Figure 11D:
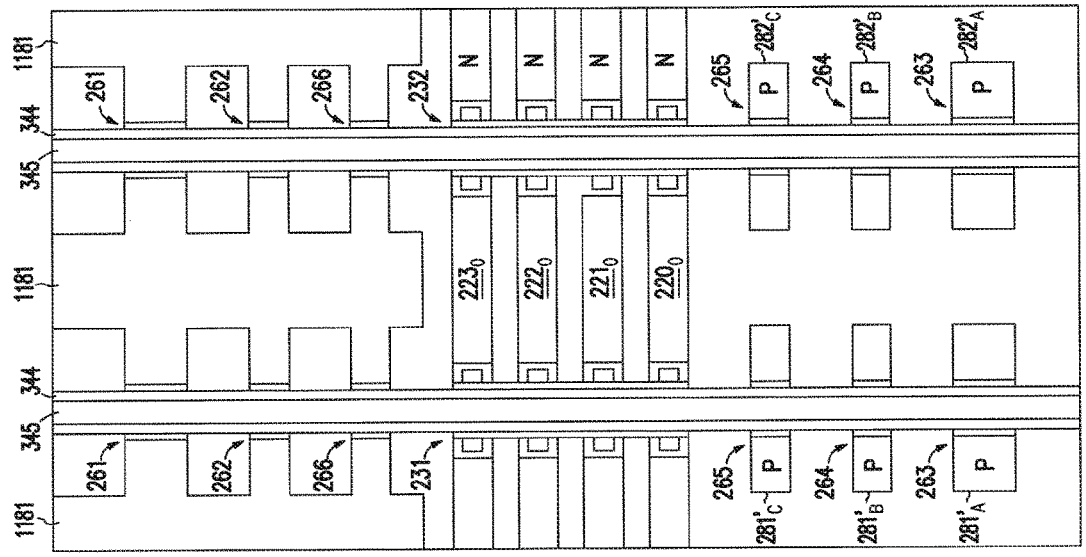
Figure 11C:
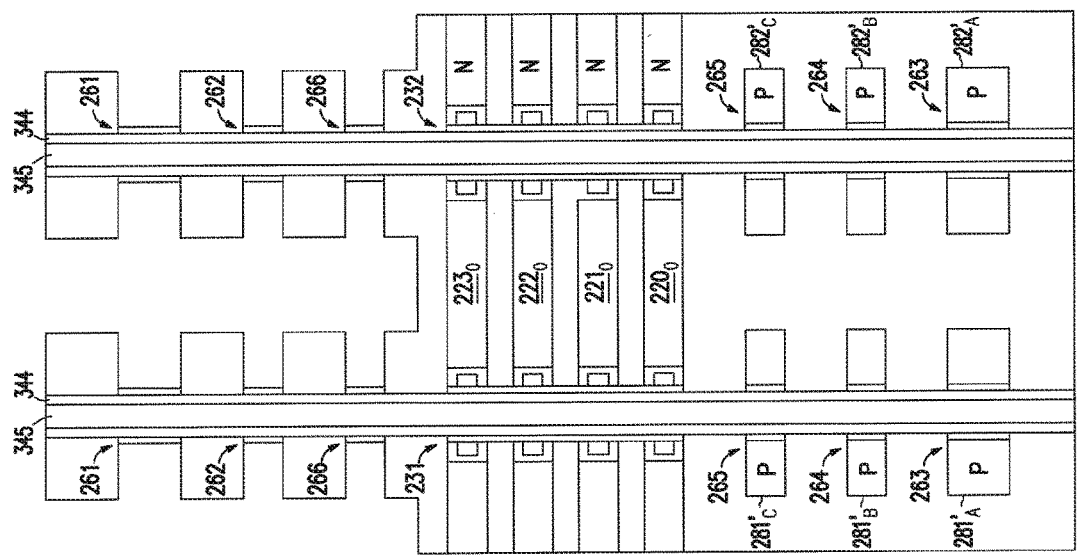

FIG. 11C shows memory device 1100 after the materials of select lines $281_A$, $281_B$, and $281_C$ are removed. This creates voids at the locations where the materials of select lines $281_A$, $281_B$, and $281_C$ were.

FIG. 11D shows memory device 1100 after materials 1181 fill (e.g., by deposition) the voids at the locations where the materials of select lines $281_A$, $281_S$, $281_C$, $282_A$, $282_B$, and $282_C$ were removed (FIG. 11C). Materials 1181 can include metals or other conductive materials (e.g., W, Ti, Ta, WN, TiN, TaN, or other conductive materials).

Figure 11F:
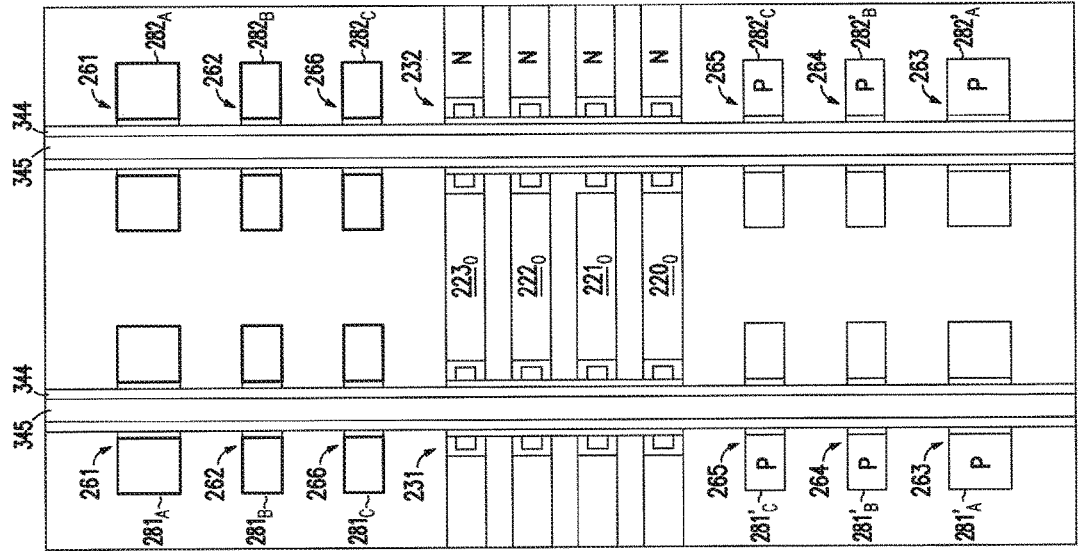
Figure 11E:
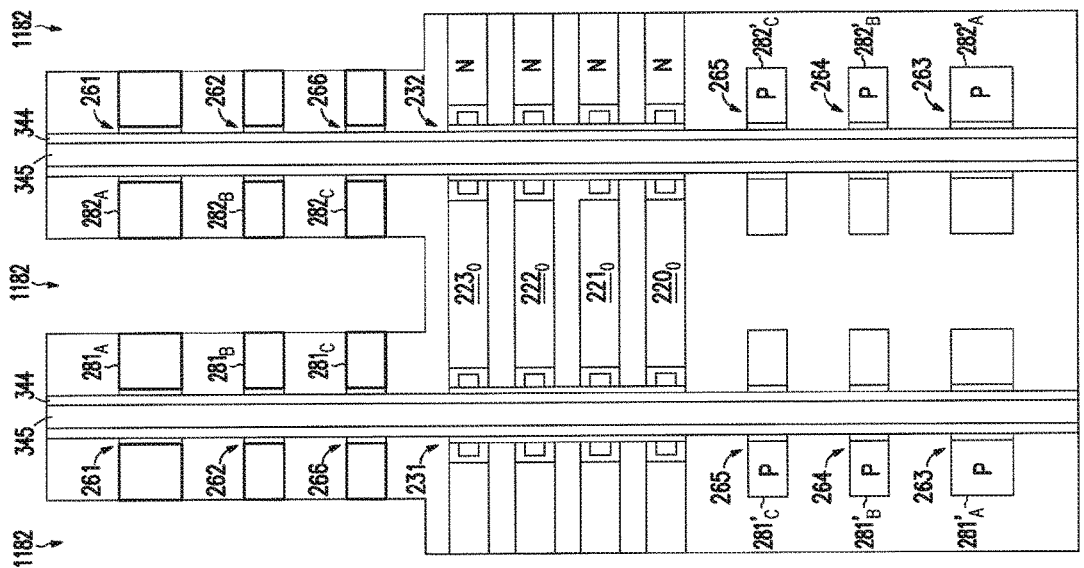

FIG. 11E shows memory device 1100 after openings 1182 are formed (e.g., by etching portions of materials 1181 at openings 1182). A portion of materials 1181 were removed at opening 1182. The remaining portion of materials is included in select lines $281_A$, $281_B$, $281_C$, $282_A$, $282_B$, and $282_C$.

FIG. 11F shows memory device 1100 after dielectric materials (e.g., an oxide of silicon) are formed in openings 1182 (FIG. 11E). Providing select lines $281_A$, $281_B$, $281_C$, $282_A$, $282_B$, and $282_C$ with materials 1181 (e.g., metals) may reduce the resistance of these select lines.

Figure 12B:
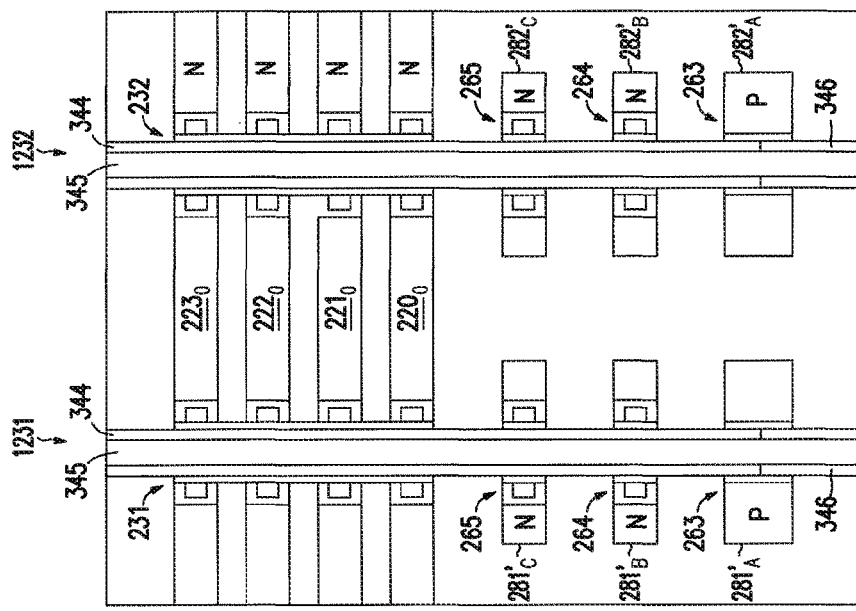
Figure 12A:
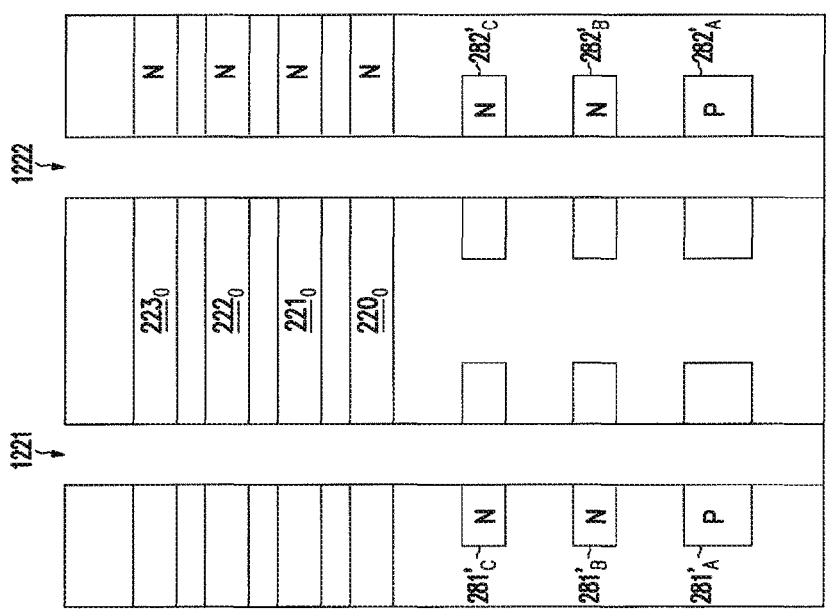

FIG. 12A and FIG. 12B show processes of forming a memory device 1200 including triple source select transistors having a combination of memory cell-type and FET-type structures, according to some embodiments described herein. FIG. 12A shows memory device 1200 after select lines $281'_A$, $281'_B$, $218'_C$, $282'_A$, $282'_B$, and $282'_C$, control lines $220_0$, $221_0$, $222_0$, and $223_0$, and pillar holes 11221 and 1222 are formed. FIG. 12B shows memory device 1200 after memory cell strings 231 and 232 and select gates 263, 264, and 265 are formed. Portion 346 (e.g., N+ material), portion 344 (e.g., conductive channel), and portion 345 (e.g., dielectric filler) can be formed in each of pillar holes 1221 and 1222. Portions 344 and 345 are parts of a respective pillar, such as pillar 1231 or 1232. As shown in FIG. 12B, the thickness of select lines $281'_A$ and $282'_A$ can be greater than the thickness of select lines $281'_B$, $218'_C$, $282'_B$, and $282'_C$.

Each of select gates 264 and 265 can be formed such that it can have a memory cell-type structure, which is similar or identical structure of each of the memory cells of memory cell strings 231 and 232. Each of select gates 263 can be formed such that it can have a FET-type structure. Other parts of memory device 1200 (e.g., SGD select lines and associated transistors (e.g., 261, 262 and 263)) can be formed by processes similar to any of the processes described above with reference to FIG. 5A through FIG. 11F. The combination of memory cell-type and FET-type structures of select gates 263, 264, and 265 shown in FIG. 12B may allow select lines $281'_B$, $282'_B$, $281'_C$, and $282'_C$ to be relatively thin. It may also make process path easier.

FIG. 13A and FIG. 13B show processes of forming a memory device 1300 including triple source select transistors having a combination of memory cell-type and FET-type structures, according to some embodiments described herein. FIG. 13A shows memory device 1300 after formation of elements similar to memory device 1200 of FIG. 12A. As shown in FIG. 13B, however, each of select gates 264 and 265 can be formed such that it can have a FET-type structure. Each of select gates 263 can be formed such that it can have a memory cell-type structure, which is similar or identical structure of each of the memory cells of memory cell strings 231 and 232. Other parts of memory device 1300 (e.g., SGD select lines and associated transistors (e.g., 261, 262 and 263)) can be formed by processes similar to any of the processes described above with reference to FIG. 5A through FIG. 11F. The combination of memory cell-type and FET-type structures of select gates 263, 264, and 265 shown in FIG. 13B may reduce the resistance of select lines $281'_A$ and $282'$ A.

FIG. 14A and FIG. 14B show processes of forming a memory device 1400 including triple source select transistors having a combination of memory cell-type and FET-type structures, according to some embodiments described herein. FIG. 14A shows memory device 1400 after formation of elements similar to memory device 1200 of FIG. 12A. As shown in FIG. 14B, however, each of select gates 263, 264, and 265 can be formed such that it can be a memory cell-type structure, which is similar or identical structure of each of the memory cells of memory cell strings 231 and 232. Other parts of memory device 1400 (e.g., SGD select lines and associated transistors (e.g., 261, 262 and 263) can be formed by processes similar to any of the processes described above with reference to FIG. 5A through FIG. 11F. The combination of memory cell-type and FET-type structures of select gates 263, 264, and 265 shown in FIG. 14B may reduce the resistance of select lines $281'_A$ and $282_A$.

Figure 15:
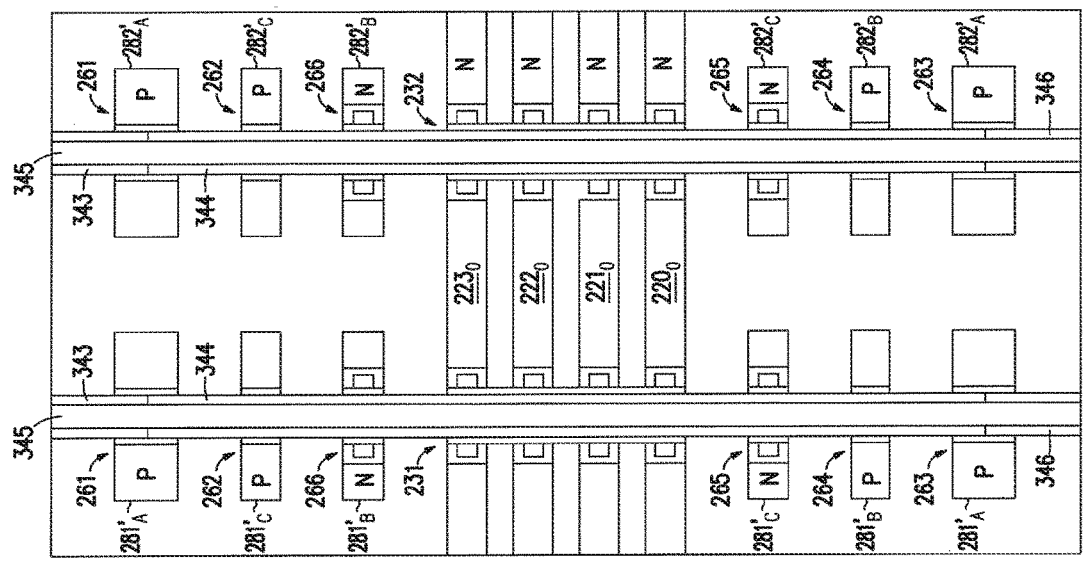

FIG. 15 shows a memory device 1500 including triple drain select transistors and triple source select transistors, according to some embodiments described herein. Memory device 1500 can be formed using any combination of the processes described above with reference to FIG. 5A through FIG. 14B. As shown in FIG. 15, memory device 1500 can include elements similar to or identical to the elements of the memory devices described above (FIG. 2A through FIG. 14B). Thus, for simplicity, the description of the elements of memory device 1500 is not described here. As shown in FIG. 15, each of select gates 265 and 266 can be formed such that it can have a memory cell-type structure, which is similar or identical structure of each of the memory cells of memory cell strings 231 and 232. Each of select gates 261, 262, 263, and 264 can be formed such that it can have a FET-type structure. The memory cell-type structures of select gates 265 and 266 may allow them to be electrically programmed in order to adjust the threshold voltage of the combination of select gates 261, 262, and 266 and the threshold voltage of the combination of select gates 263, 264, and 265.

Figure 16:
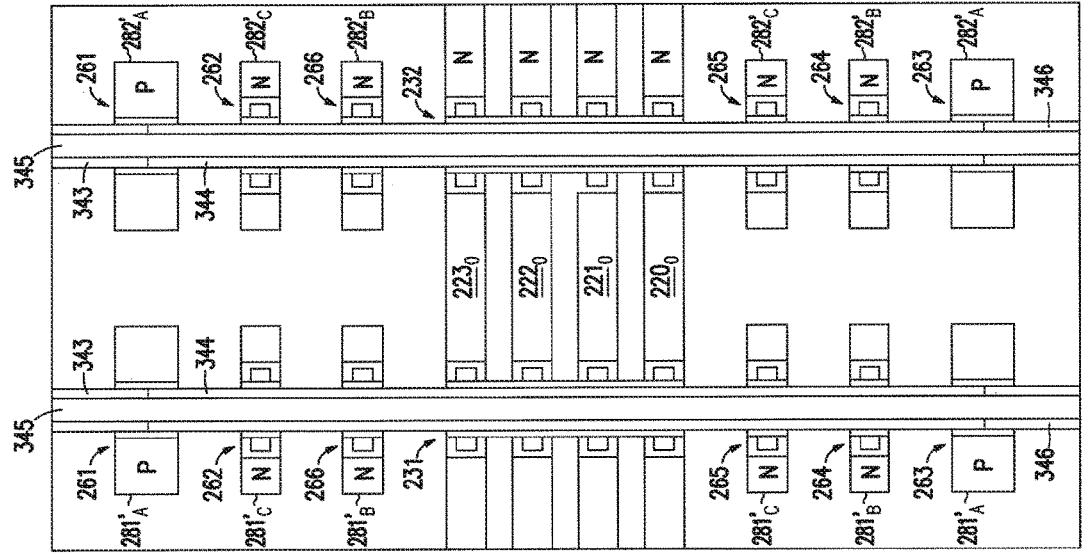

FIG. 16 shows a memory device 1600 including triple drain select transistors and triple source select transistors, according to some embodiments described herein. Memory device 1600 can be formed using any combination of the processes described above with reference to FIG. 5A through FIG. 14B. As shown in FIG. 16, memory device 1600 can include elements similar to or identical to the elements of the memory devices described above (FIG. 2A through FIG. 14B). Thus, for simplicity, the description of the elements of memory device 1600 is not described here. As shown in FIG. 16, each of select gates 262, 264, 265, and 266 can be formed such that it can have a memory cell-type structure, which is similar or identical structure of each of the memory cells of memory cell strings 231 and 232. Each of select gates 261 and 263 can be formed such that it can have a FET-type structure. The memory cell-type structures of select gates 262 and 264 may allow them be electrically programmed in order to adjust the threshold voltage of the combination of select gates 261 and 262 and the threshold voltage of the combination of select gates 263 and 264.

FIG. 17 through FIG. 21 show processes of forming a memory device 1700 including select gates and control lines having different resistances, in which the select gates and control lines include a metal portion, according to some embodiments described herein. Memory device 1700 can include elements (e.g., memory cells, select gates, control lines, and other elements), similar to those of the memory devices described above with reference to FIG. 2A through FIG. 17. For simplicity, details of such elements are omitted from FIG. 17 through 21.

Figure 17:
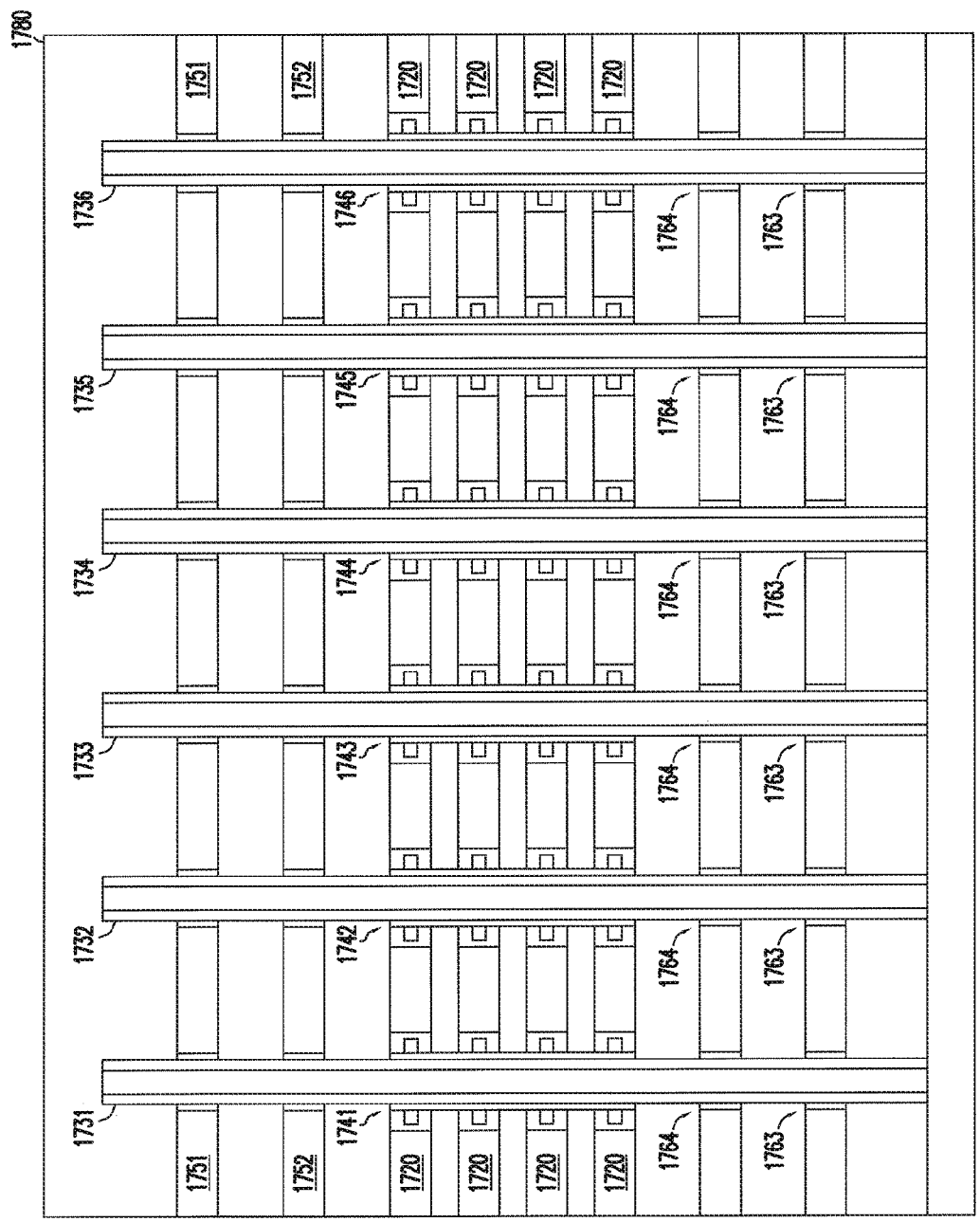
FIG. 17 through FIG. 21 show processes of forming memory device including drain select gates, each having portions of different resistances (e.g., a polycrystalline portion and a metal portion), according to some embodiments described herein.

As shown in FIG. 17, some of the components of memory device 1700 are already formed. For example, pillars 1731 through 1736 are already formed. Select gates (e.g., source select gates) 1763 and 1764 are formed along segments of pillars 1731 through 1736. Materials (layers of conductive materials) 1720 are already formed. In additional processes (described below), materials 1720 can be separated at specific locations to form control lines (e.g., part of access lines) of memory device 1700. Materials 1720 can be similar to or the same as the materials (e.g., n-type polycrystalline silicon) of the control lines (e.g., control lines $220_0$, $221_0$, $222_0$, and $223_0$) described above with reference to FIG. 2A through FIG. 16.

As shown in FIG. 17, memory cell strings 1741 through 1746 are also formed along a segment of a respective pillar among pillars 1731 through 1736. Memory cell strings 1741 and 1742 can be similar to memory cell string 231 and 232 described above with reference to FIG. 2A through FIG. 16.

As shown in FIG. 17, materials (layers of materials) 1751 and 1752 are already formed. Materials 1751 and 1752 can be separated in additional processes (described below) to from select gates (e.g., drain select gates) of memory device 1700. Materials 1751 and 1752 can be similar to or the same as the materials (e.g., n-type or p-type polycrystalline silicon) of the select gates (e.g., select gates 261 and 262) described above with reference to FIG. 2A through FIG. 16. Material (e.g., dielectric material) 1780 can be formed to allow additional processes, as described below.

Figure 18:
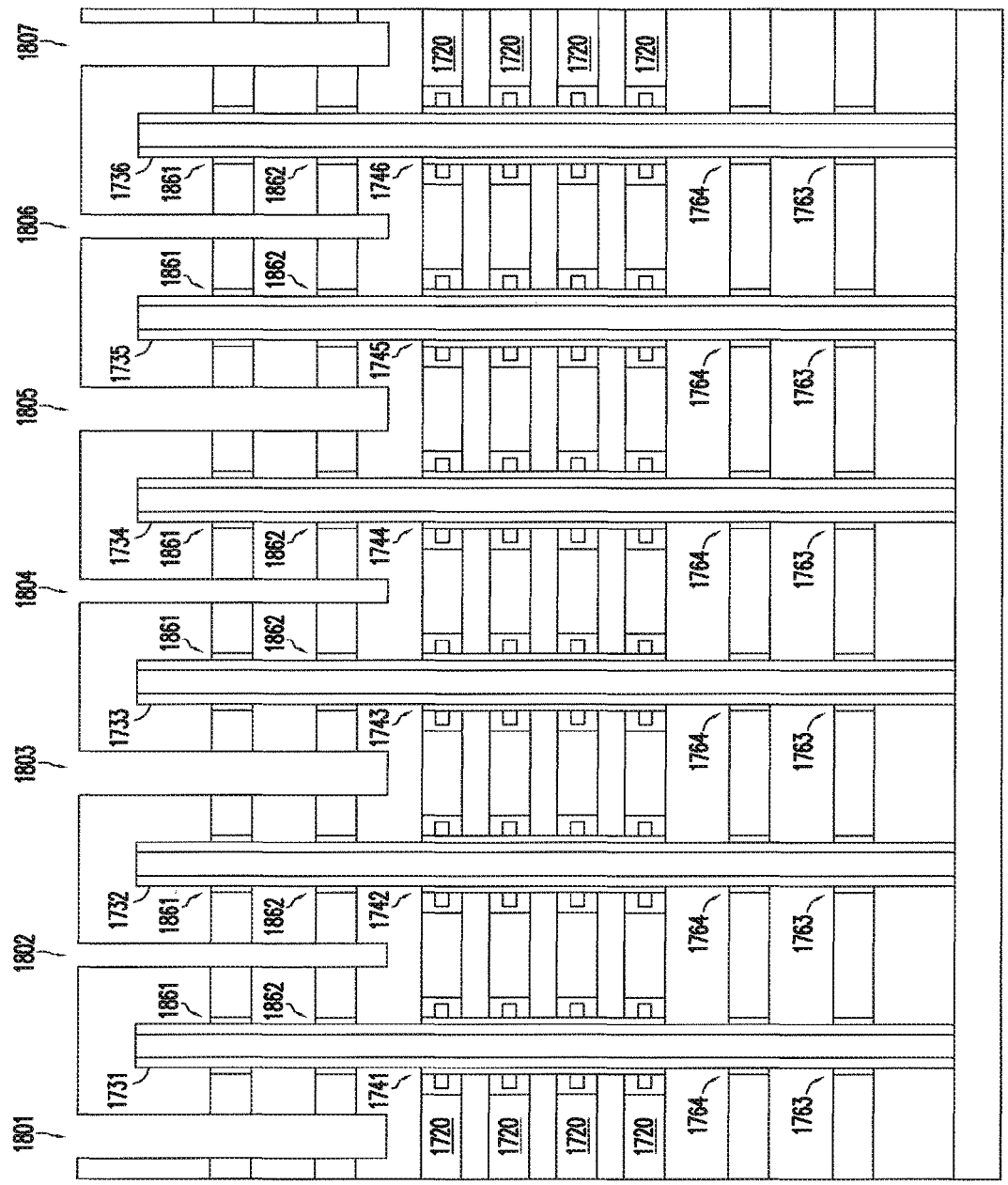

FIG. 18 shows memory device 1700 after select gates 1861 and 1862 are formed. Forming select gates 1861 and 1862 can include removing (e.g., by etching) portions of materials 1751 and 1752 to form openings (e.g., slits) 1801 through 1807 at selective locations of materials 1751 and 1752. As shown in FIG. 18, each of openings 1801, 1803, 1805, and 1807 is not symmetrical (asymmetrical) with each of openings 1802, 1804, and 1806. For example, the width (from left to right of FIG. 18) each of openings 1801, 1803, 1805, and 1807 can be greater than the width (from left to right of FIG. 18) of each of openings 1802, 1804, and 1806. Thus, the removed amount of materials 1751 and 1752 in each of openings 1801, 1803, 1805, and 1807 can be more than the removed amount of materials 1751 and 1752 in each of openings 1802, 1804, and 1806. This means that materials 1751 and 1752 can be asymmetrically removed (e.g., asymmetrically etched) at selective locations, which are the locations that separate one select gate from other (e.g., adjacent) select gates, as shown in FIG. 18. Asymmetrically removing materials 1751 and 1752 may allow additional processes to be performed in order to cause each of select gates 1861 and 1862 to can have conductive materials having different resistances, as described below.

Figure 19:
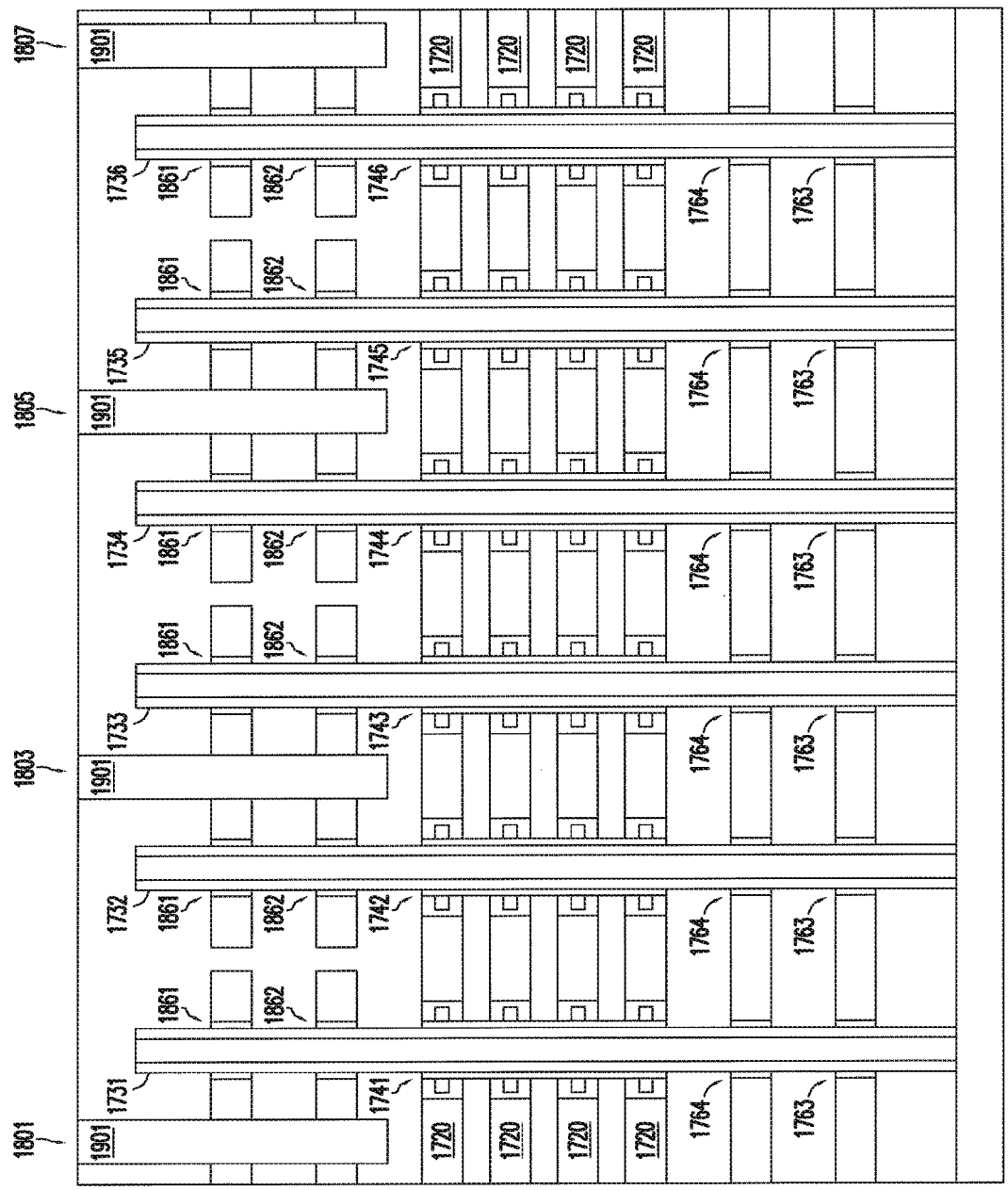

FIG. 19 shows memory device 1700 after material 1901 is formed in openings 1801, 1803, 1805, and 1807. Forming material 1901 can including filling (e.g., depositing) material 1901 in openings 1801, 1803, 1805, and 1807. Material 1901 can include an oxide material or other material that can be relatively easy to be removed (e.g., etched) in additional processes (described below).

Figure 20:
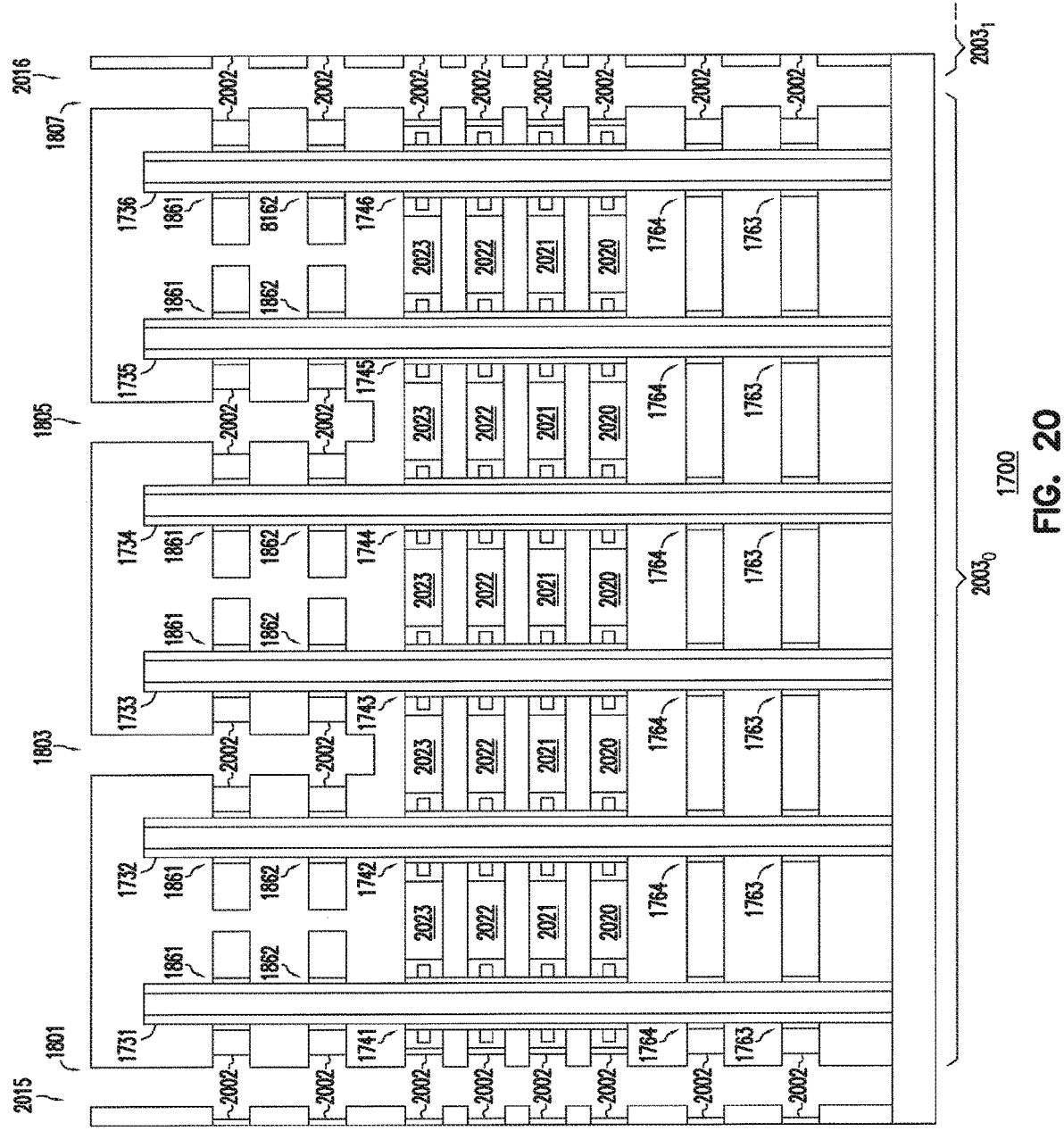

FIG. 20 shows memory device 1700 after a block separation process to separate blocks $2003_0$ and $2003_1$. The block separation process can including removing materials at edges 2015 and 2016 (e.g., block boundaries) to form blocks of memory device 1700, such as blocks $2003_0$ and $2003_1$. FIG. 20 also shows memory device 1700 after control lines 2020, 2021, 2022, and 2023 are formed (e.g., formed after materials 1720 at edges 2015 and 2016 are removed). FIG. 20 also shows memory device 1700 after that material 1901 is removed (e.g. by etching material 1901) from openings 1801, 1803, 1805, and 1807.

FIG. 20 also shows memory device 1700 after recesses 2002 are formed on one side (e.g., formed on only one sidewall) of each of select gates 1861 and 1862. Recesses 2002 can also be formed on both sides (e.g., sides at edges 2015 and 2016) of each of control lines 2020, 2021, 2022, and 2023. Recesses 2002 can also be formed on one side (e.g., formed on only one sidewall) of each of select gates 1763 and 1764 at edges 2015 and 2016. As shown in FIG. 20, recesses 2002 may not be formed on sides of select gates 1763 that are between two gates 1763 at edges 2015 and 2016. Similarly, recesses 2002 may not be formed on sides of select gates 1764 that are between two gates 1764 at edges 2015 and 2016.

Figure 21:
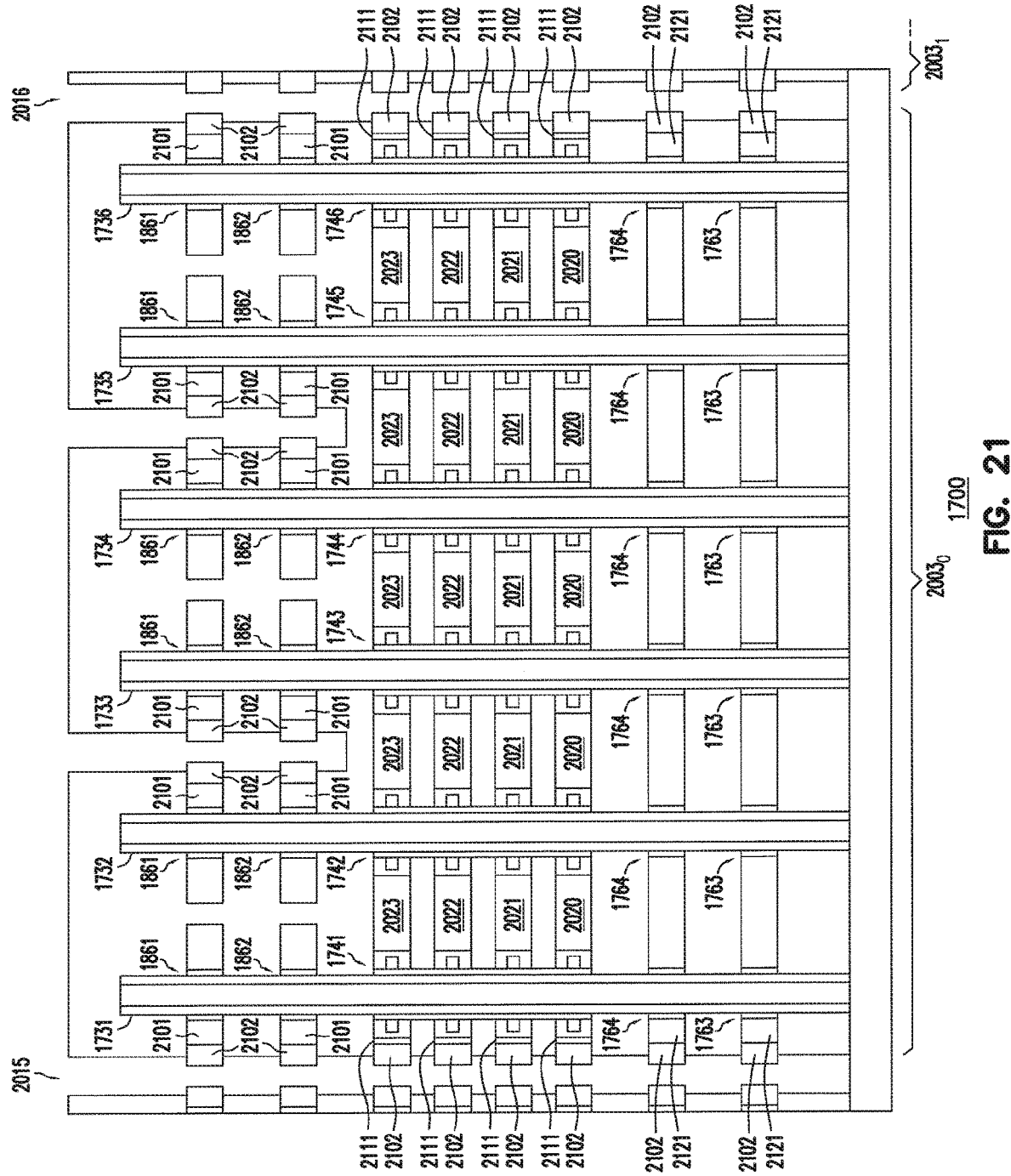

FIG. 21 shows memory device 1700 after portions 2102 are formed. Portions 2102 are formed to improve conductivity (e.g., reduce the resistances) of select gates 1861 and 1862, control lines 2021, 2022, 2023, and 2024, two gates 1763 at edges 2015 and 2016, and two select gates 1764 at edges 2015 and 2016. Each of portions 2102 can include metal. For example, each of portions 2102 can be an entire metal portion. Alternative, a majority of each of portions 2102 can be metal. Forming portions 2102 can include forming (e.g., deposited by sputtering) a barrier (e.g., thin layer of TiN) in openings 1801, 1803, 1805, and 1807. Then, metal material (e.g., W or other conductive materials) can be formed after the barrier is formed. The metal material can be simultaneously formed (e.g., formed by the same process step) in portions 2102. After the metal material (e.g., W) is formed, an additional separation process can be performed to separate the blocks (e.g., to cut the metal material (e.g., W) at edges 2015 and 2016).

As shown in FIG. 21, each of select gates 1861 can include a portion 2101, which is in direct contact with one of portions 2102 (a respective portion among portions 2102). In each of select gates 1861, portion 2101 is the remaining part of material 1751 (e.g. n-type or p-type polycrystalline silicon) in FIG. 17 that was not removed when openings 1801 through 1807 (FIG. 18) were formed. Thus, each of select gates 1861 can include portions (e.g., respective portions 2101 and 2102) having different resistances. For example, each of portions 2102 (e.g., metal) can have a resistance less than the each of portions 2101 (e.g. n-type or p-type polycrystalline silicon).

Similarly, in FIG. 21, each of select gates 1862 can include a portion 2101, which is in direct contact with one of portions 2102 (a respective portion among portions 2102). In each of select gates 1862, portion 2101 is the remaining part of material 1752 (e.g. n-type or p-type polycrystalline silicon) in FIG. 17 that was not removed when openings 1801 through 1807 (FIG. 18) were formed. Thus, each of select gates 1862 can include portions (e.g., respective portions 2101 and 2102) having different resistances. For example, each of portions 2102 (e.g., metal) can have a resistance less than the each of portions 2101 (e.g. n-type or p-type polycrystalline silicon).

As shown in FIG. 21, each of control lines 2021, 2022, 2023, and 2024 can include a portion 2111 at edge 2015 that is in direct contact with one of portions 2102 (a respective portion among portions 2102 at edge 2015) and a portion 2111 at edge 2016 that is in direct contact with one of portions 2102 (a respective portion among portions 2102 at edge 2016). In each of control lines 2021, 2022, 2023, and 2024, portion 2111 at edge 2015 and portion 2111 at edge 2016 are the remaining parts of a respective material 1720 (e.g. n-type polycrystalline silicon) at edges 2015 and 2016 in FIG. 20 that were not removed when the block separation process (FIG. 20) were performed. Thus, each of control lines 2021, 2022, 2023, and 2024 can include portions (e.g., respective portions 2111 and 2102 at edges 2015 and 2016) having different resistances. For example, each of portions 2102 (e.g., metal) can have a resistance less than the each of portions 2111 (e.g. n-type or p-type polycrystalline silicon).

As shown in FIG. 21, each of select gates 1763 can include a portion 2121 at edge 2015 that is in direct contact with one of portions 2102 (a respective portion among portions 2102 at edge 2015) and a portion 2121 at edge 2016 that is in direct contact with one of portions 2102 (a respective portion among portions 2102 at edge 2016). In each of select gates 1763 at edges 2015 and 2016, portion 2121 is the remaining parts of the conductive material (e.g. n-type or p-type polycrystalline silicon) of select gates 1763 at edges 2015 and 2016 that were not removed when the block separation process (FIG. 20) were performed. Thus, each of select gates 1763 at edges 2015 and 2016 can include portions (e.g., respective portions 2121 and 2102 at edges 2015 and 2016) having different resistances. For example, each of portions 2102 (e.g., metal) can have a resistance less than the each of portions 2121 (e.g. n-type or p-type polycrystalline silicon).

Similarly, each of select gates 1764 can include a portion 2121 at edge 2015 that is in direct contact with one of portions 2102 (a respective portion among portions 2102 at edge 2015) and a portion 2121 at edge 2016 that is in direct contact with one of portions 2102 (a respective portion among portions 2102 at edge 2016). In each of select gates 1764 at edges 2015 and 2016, portion 2121 is the remaining parts of the conductive material (e.g. n-type or p-type polycrystalline silicon) of select gates 1764 at edges 2015 and 2016 that were not removed when the block separation process (FIG. 20) were performed. Thus, each of select gates 1764 at edges 2015 and 2016 can include portions (e.g., respective portions 2121 and 2102 at edges 2015 and 2016) having different resistances.

Figure 22:
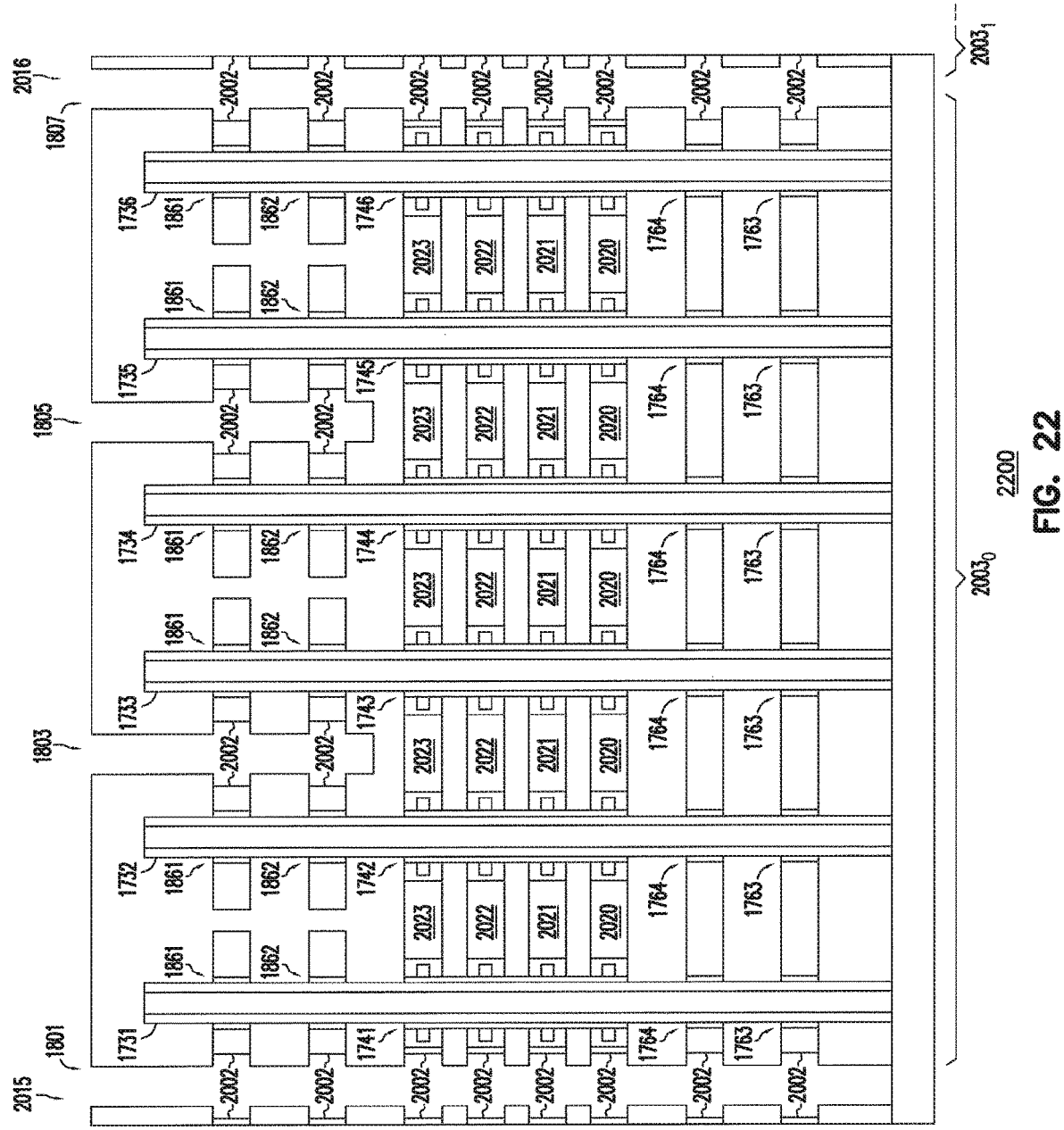
FIG. 22 and FIG. 23 show processes of forming memory device including drain select gates, each having portions of different resistances (e.g., a polycrystalline portion and a silicide portion), according to some embodiments described herein.
Figure 23:
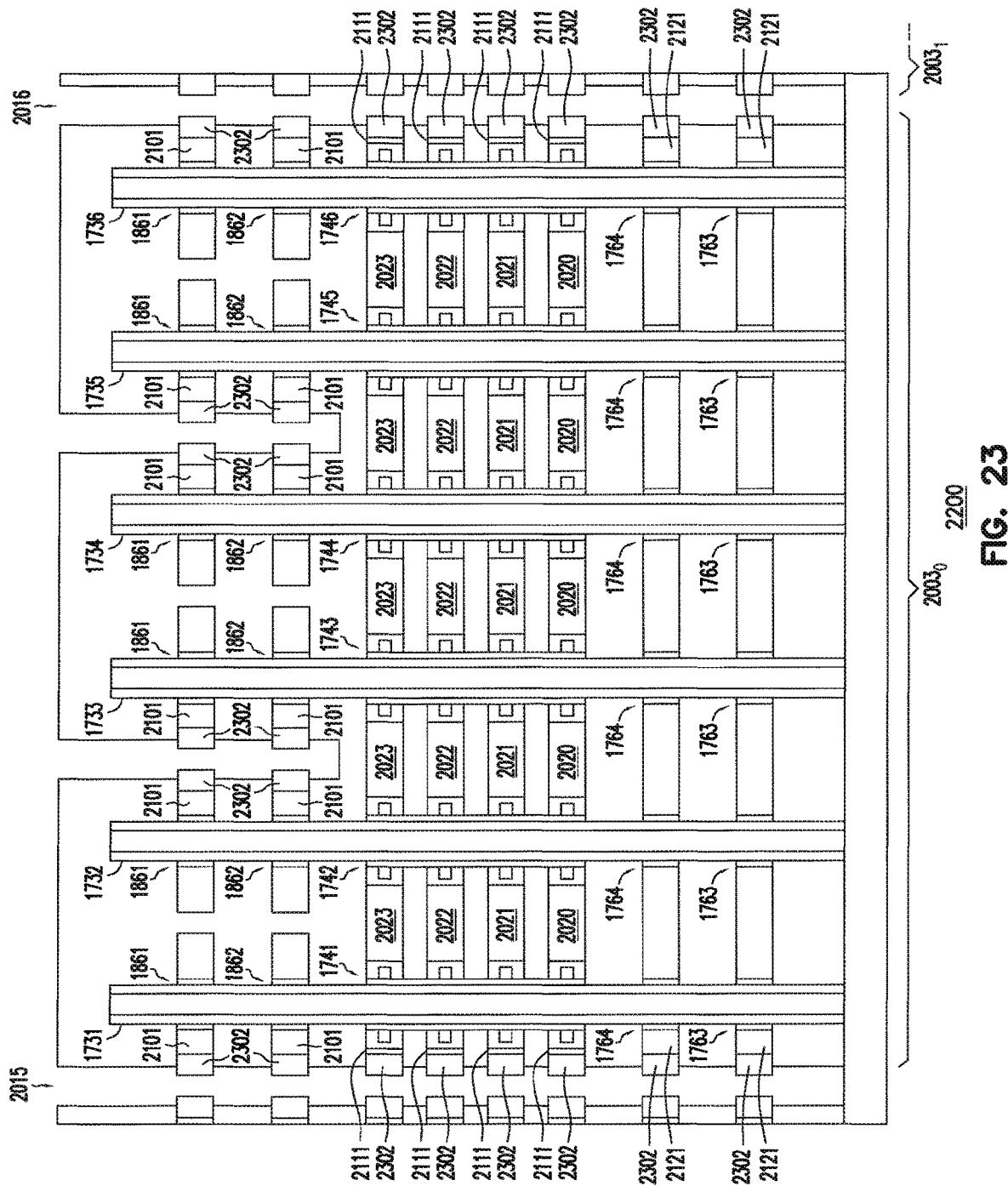

FIG. 22 and FIG. 23 show processes of forming a memory device 2200 including select gates and control lines having different resistances, in which the select gates and control lines include a silicide portion, according to some embodiments described herein. The structure of memory device 2200 in FIG. 22 can be formed using similar or the same processes used to as form memory device 1700 up to the structure of memory device 1700 shown in FIG. 20.

FIG. 23 shows memory device 2200 after portions 2302 are formed. Each of portions 2302 can be in direct contact with a respective portion among portions 2101, 2111, or 2121. Portions 2302 are formed to improve conductivity (e.g., reduce the resistances) of select gates 1861 and 1862, control lines 2020, 2021, 2022, and 2023, two gates 1763 at edges 2015 and 2016, and two select gates 1764 at edges 2015 and 2016.

Unlike each of portions 2102 (e.g., a metal portion) in FIG. 21, each of portions 2302 in FIG. 23 can be a silicide portion. Forming portions 2302 can include performing a silicidation (e.g., partial silicidation) process to form portions 2302 as shown in FIG. 23. Performing the silicidation process can include forming metal (e.g., Co, Ni, or other metal materials) material in recesses 2002. Then, an annealing process can be performed after the metal material is formed in order to form portions 2302.

As shown in FIG. 23, each of select gates 1861 and 1862 can include a portion 2101, which is in direct contact with one of portions 2302 (a respective portion among portions 2302). Thus, each of select gates 1861 and 1862 can include portions (e.g., respective portions 2101 and 2302) having different resistances. For example, each of portions 2302 (e.g., silicide) can have a resistance less than the each of portions 2101 (e.g. n-type or p-type polycrystalline silicon).

Each of control lines 2021, 2022, 2023, and 2024 can include a portion 2111 at edge 2015 that is in direct contact with one of portions 2302 (a respective portion among portions 2302 at edge 2015) and a portion 2111 at edge 2016 that is in direct contact with one of portions 2302 (a respective portion among portions 2302 at edge 2016). Thus, each of control lines 2021, 2022, 2023, and 2024 can include portions (e.g., respective portions 2111 and 2302 at edges 2015 and 2016) having different resistances. For example, each of portions 2302 (e.g., silicide) can have a resistance less than the each of portions 2111 (e.g. n-type or p-type polycrystalline silicon).

Each of select gates 1763 and 1764 can include a portion 2121 at edge 2015 that is in direct contact with one of portions 2302 (a respective portion among portions 2302 at edge 2015) and a portion 2121 at edge 2016 that is in direct contact with one of portions 2302 (a respective portion among portions 2302 at edge 2016). Thus, each of select gates 1763 and 1764 can include portions (e.g., respective portions 2121 and 2302 at edges 2015 and 2016) having different resistances. For example, each of portions 2302 (e.g., silicide) can have a resistance less than the each of portions 2121 (e.g. n-type or p-type polycrystalline silicon).

Figure 24:
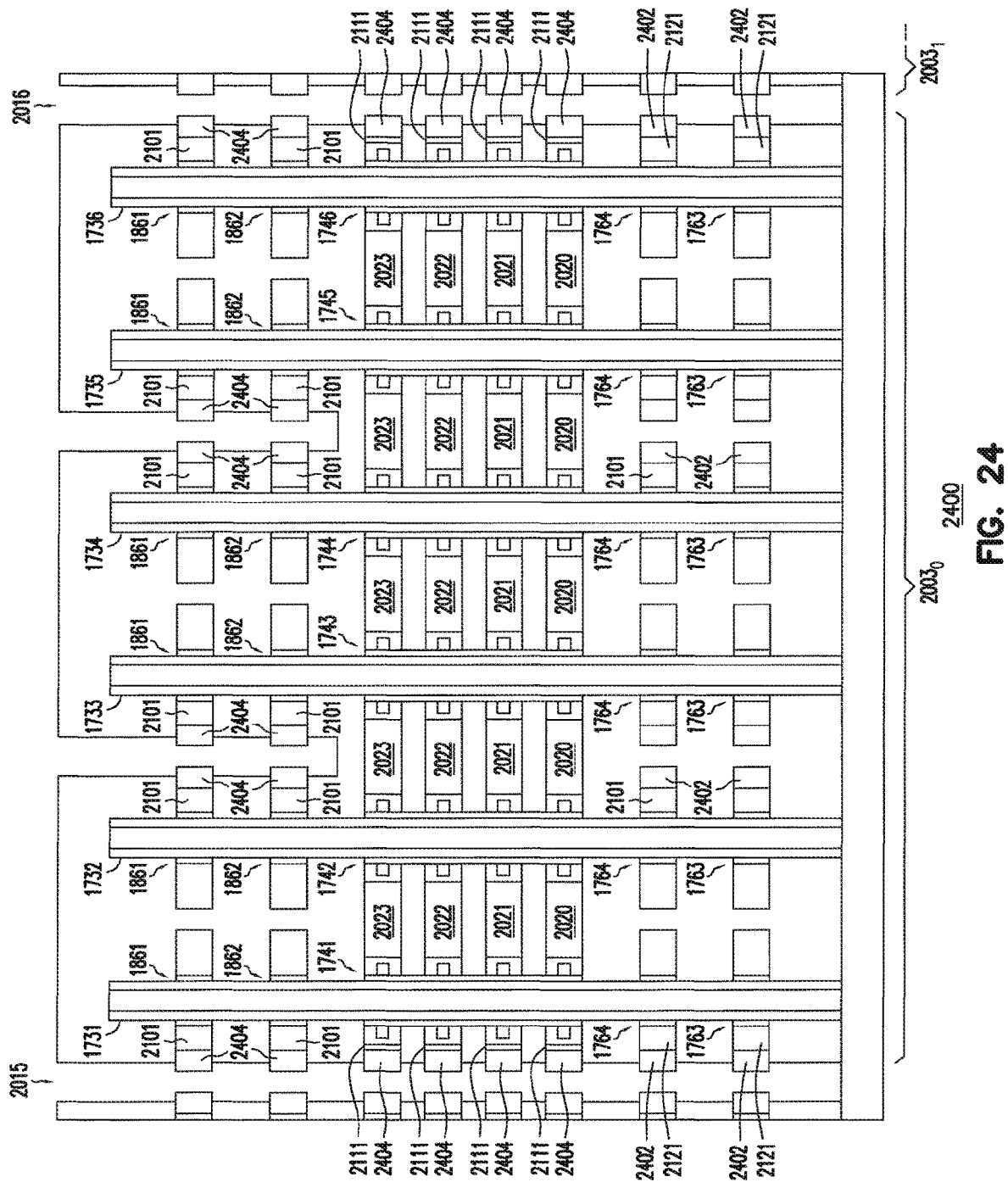
FIG. 24 show a memory device including drain select gates and source select gates, each having portions of different resistances, according to some embodiments described herein.

FIG. 24 shows a memory device 2400, which can be a variation of memory device 1700 of FIG. 21 or memory device 2200 of FIG. 23. As shown in FIG. 24, memory device 2400 can include portions 2402. Each of portions 2402 can be in direct contact with a respective portion among portions 2121 of each of select gates 1763 and 1764. Thus, in memory device 2400, select gates 1763 and 1764 at edges 2015 and 2016, and select gates 1763 and 1764 between edges 2015 and 2016 can have portions 2402 and 2121. This is unlike memory device 1700 of FIG. 21 and memory device 2300 of FIG. 23 where only select gates 1763 and 1764 at edges 2015 and 2016 have portions of different resistances (e.g., portions 2102 and 2121 in FIG. 21, and portions 2302 and 2121 in FIG. 23).

In FIG. 24, forming portions 2402 can include processes similar to those used to form portions 2102 (FIG. 21) of memory device 1700 or processes similar to those used to form portions 2302 (FIG. 23) of memory device $220_0$. For example, in FIG. 24, before forming elements located above select gates 1763 and 1764 (e.g., memory cell strings 1741 through 1746, control lines 2021, 2022, 2023, and 2024, and select gates 1861 and 1862), processes similar to processes of forming portions 2102 (e.g., metal portions) of memory device 1700 (FIG. 21) can be used to form portions 2402 of memory device 2400 of FIG. 24. Alternatively, before forming elements located above select gates 1763 and 1764, processes similar to processes of forming portions 2302 (e.g., silicide portions) of memory device $220_0$ (FIG. 23) can be used to form portions 2402 of memory device 2400 of FIG. 24. Thus, each of portions 2402 in select gates 1763 and 1764 of memory device 2400 can be either a metal portion (e.g., similar to each of portions 2102 of FIG. 21) or a silicide portion (e.g., similar to each of portions 2302 of FIG. 23).

FIG. 24 also shows memory device 2400 include portions 2404. Each of portions 2404 can be either a metal portion or a silicide portion. For example, portions 2404 can be formed using processes similar to those described above with reference to FIG. 17 through FIG. 21, such that each of portions 2404 can be a metal portion (e.g., similar to portion 2102 of FIG. 21). In another example, portions 2404 can be formed using processes similar to those described above with reference to FIG. 22 and FIG. 23, such that each of portions 2404 can be a silicide portion (e.g., similar to portion 2302 of FIG. 23). Thus, in memory device 2400, each of select gates 1861 and 1862 can include a polycrystalline portion (e.g., one of portions 2101) and either a metal or silicide portion (e.g., one of portions 2404). Similarly, each of control lines 2021, 2022, 2023, and 2024 can include a polycrystalline portion (e.g., one of portions 2111) and either a metal or silicide portion (e.g., one of portions 2404).

The biasing techniques similar to or identical those used in the memory devices described above (e.g., memory devices 200 and 300 described above with reference to FIG. 2A through FIG. 3G) may be used in the memory devices of FIG. 5A through FIG. 24. Thus, besides improvements in structures (e.g., reduced resistances at drain and sources select gates and control lines described above with reference to FIG. 5A through FIG. 24), the memory devices of FIG. 5A through FIG. 24 can also include improvements in operations (e.g., biasing techniques) similar to those of memory devices 200 and 300 described above with reference to FIG. 2A through FIG. 3G.

The illustrations of apparatuses (e.g., memory devices 100, 200, 300, 400, 500, 600, 700, 800, 900, 1000, 1100, 1200, 1300, 1400, 1500, 1700, and 2200) and methods (e.g., operating methods associated with memory devices 100, 200, 300, 400, 500, 600, 700, 800, 900, 1000, 1100, 1200, 1300, 1400, 1500, 1700, and 2200, and methods (e.g., processes) of forming these memory devices) are intended to provide a general understanding of the structure of various embodiments and are not intended to provide a complete description of all the elements and features of apparatuses that might make use of the structures described herein. An apparatus herein refers to, for example, either a device (e.g., any of memory devices 100, 200, 300, 400, 500, 600, 700, 800, 900, 1000, 1100, 1200, 1300, 1400, 1500, 1700, and 2200) or a system (e.g., a computer, a cellular phone, or other electronic system) that includes a device such as any of memory devices 100, 200, 300, 400, 500, 600, 700, 800, 900, 1000, 1100, 1200, 1300, 1400, 1500, 1700, and 2200.

Any of the components described above with reference to FIG. 1 through FIG. 24 can be implemented in a number of ways, including simulation via software. Thus, apparatuses (e.g., memory devices 100, 200, 300, 400, 500, 600, 700, 800, 900, 1000, 1100, 1200, 1300, 1400, 1500, 1700, and 2200 or part of each of these memory devices, including a control unit in these memory devices, such as control unit 116 (FIG. 1), and the select circuits 241 through 252) described above may all be characterized as "modules" (or "module") herein. Such modules may include hardware circuitry, single and/or multi-processor circuits, memory circuits, software program modules and objects and/or firmware, and combinations thereof, as desired and/or as appropriate for particular implementations of various embodiments. For example, such modules may be included in a system operation simulation package, such as a software electrical signal simulation package, a power usage and ranges simulation package, a capacitance-inductance simulation package, a power/heat dissipation simulation package, a signal transmission-reception simulation package, and/or a combination of software and hardware used to operate or simulate the operation of various potential embodiments.

Memory devices memory devices 100, 200, 300, 400, 500, 600, 700, 800, 900, 1000, 1100, 1200, 1300, 1400, 1500, 1700, and 2200 may be included in apparatuses (e.g., electronic circuitry) such as high-speed computers, communication and signal processing circuitry, single or multi-processor modules, single or multiple embedded processors, multicore processors, message information switches, and application-specific modules including multilayer, multichip modules. Such apparatuses may further be included as subcomponents within a variety of other apparatuses (e.g., electronic systems), such as televisions, cellular telephones, personal computers (e.g., laptop computers, desktop computers, handheld computers, tablet computers, etc.), workstations, radios, video players, audio players (e.g., MP3 (Motion Picture Experts Group, Audio Layer 3) players), vehicles, medical devices (e.g., heart monitor, blood pressure monitor, etc.), set top boxes, and others.

The embodiments described above with reference to FIG. 1 through FIG. 24 include apparatuses and using first and second select gates coupled in series between a conductive line and a first memory cell string of a memory device, and third and fourth select gates coupled in series between the conductive line and a second memory cell string of the memory device. The memory device can include first, second, third, and fourth select lines to provide first, second, third, and fourth voltages, respectively, to the first, second, third, and fourth select gates, respectively, during an operation of the memory device. The first and second voltages can have a same value. The third and fourth voltages can have different values. Other embodiments including additional apparatuses and methods are described.

In the detailed description and the claims, a list of items joined by the term "at least one of" can mean any combination of the listed items. For example, if items A, B, and C are listed, then the phrase "at least one of A, B and C" can mean A only; B only; C only; A and B; A and C; B and C; or A, B, and C.

The above description and the drawings illustrate some embodiments of the invention to enable those skilled in the art to practice the embodiments of the invention. Other embodiments may incorporate structural, logical, electrical, process, and other changes. Examples merely typify possible variations. Portions and features of some embodiments may be included in, or substituted for, those of others. Many other embodiments will be apparent to those of skill in the art upon reading and understanding the above description.

What is claimed is:

1. An apparatus comprising:
  a pillar extending between a first conductive region and a second conductive region, the pillar including a first segment, a second segment, and a third segment, the second segment being between the first and third segments;
  a first conductive material located on a first level of the apparatus and opposite from the first segment of the pillar and separated from the first segment of the pillar by a first distance;
  a second conductive material located on a second level of the apparatus and opposite from the second segment of the pillar and separated from the second segment of the pillar by a second distance; and
  a memory cell string and a plurality of conductive materials located along the third segment of the pillar, each conductive material of the plurality of conductive materials separated from the third segment of the pillar by a third distance, wherein the third distance is different from each of the first and second distances.

2. The apparatus of claim 1, wherein the third distance is greater than each of the first and second distances.

3. The apparatus of claim 1, wherein the first conductive region is part of a data line of the apparatus.

4. The apparatus of claim 1 further comprising a substrate, wherein the first conductive material is between the second conductive material and the substrate.

5. The apparatus of claim 1, wherein at least one of the first and second conductive materials includes a metal portion.

6. The apparatus of claim 1, wherein at least one of the first and second conductive materials includes a silicide portion.

7. The apparatus of claim 1, wherein the apparatus comprises a memory device, wherein in the memory device is configured to provide a first voltage to the first conductive material during an operation of the memory device and a second voltage different from the first voltage to the second conductive material during the operation.

8. The apparatus of claim 7, wherein the first voltage is greater than the second voltage.

9. The apparatus of claim 7, wherein the second voltage is at ground potential.

10. The apparatus of claim 7, wherein each of the first and second voltages is greater than zero.

11. The apparatus of claim 7, wherein the operation includes a read operation.

12. The apparatus of claim 7, wherein the operation includes a write operation.

13. The apparatus of claim 7, wherein the operation includes an erase operation.

14. An apparatus comprising:
a pillar extending between a first conductive region and a second conductive region;
a first conductive material located on a first level of the apparatus and opposite from a first segment of the pillar, the first conductive material including a first conductive portion and a second conductive portion contacting the first conductive portion, the first and second conductive portions of the first conductive material having different resistances;
a second conductive material located on a second level of the apparatus and opposite from a second segment of the pillar, the second conductive material including a first conductive portion and a second conductive portion contacting the first conductive portion of the second conductive material, the first and second conductive portions of the second conductive material having different resistances; and
a memory cell string and control lines located along a third segment of the pillar.

15. The apparatus of claim 14, wherein in at least one of the first and second conductive materials, the first conductive portion is a polycrystalline silicon portion and the second conductive portion is either a metal portion or a silicide portion.

16. The apparatus of claim 14, wherein the apparatus comprises a memory device, wherein in the memory device is configured to provide a first voltage to the first conductive material during an operation of the memory device and a second voltage different from the first voltage to the second conductive material during the operation.

17. An apparatus comprising:
a pillar extending between a first conductive region and a second conductive region, the pillar including a first segment, a second segment, and a third segment;
a first conductive material located on a first level of the apparatus and opposite from the first segment of the pillar, the first conductive material having a first thickness;
a second conductive material located on a second level of the apparatus and opposite from the second segment of the pillar, the second conductive material having a second thickness, the first thickness being different from the second thickness; and
a memory cell string and control lines located along the third segment of the pillar.

18. The apparatus of claim 17, wherein the first thickness is greater than the second thickness.

19. The apparatus of claim 17, wherein the pillar includes a first material of a first conductivity type and a second material of a second conductive type, the first material contacting the second material at a location in the first segment of the pillar.

20. The apparatus of claim 17, wherein the apparatus comprises a memory device, wherein in the memory device is configured to provide a first voltage to the first conductive material during an operation of the memory device and a second voltage different from the first voltage to the second conductive material during the operation.

* * * * *